(12) United States Patent
Noma et al.

(10) Patent No.: US 7,881,860 B2
(45) Date of Patent: Feb. 1, 2011

(54) VEHICLE PLANNING SUPPORT SYSTEM

(75) Inventors: Kouji Noma, Hiroshima (JP); Teruhisa Yamamoto, Hiroshima (JP); Akira Fushimi, Hiroshima (JP); Jun Takemura, Hiroshiima (JP); Isao Hirashima, Hiroshima (JP); Tadashi Ioka, Hiroshima (JP); Kouji Kishino, Hiroshima (JP); Masanori Kodaira, Hiroshima (JP); Yoshinori Takashi, Hiroshima (JP); Masayuki Nakaso, Hiroshima (JP); Takahiro Miura, Hiroshima (JP); Ken Tamitani, Hiroshima (JP); Takashi Yoshiyuki, Hiroshima (JP); Hirokuni Nagamitsu, Hiroshima (JP)

(73) Assignee: Mazda Motor Corporation (JP)

( * ) Notice: Subject to any disclaimer, the term of this patent is extended or adjusted under 35 U.S.C. 154(b) by 1283 days.

(21) Appl. No.: 11/337,578

(22) Filed: Jan. 24, 2006

(65) Prior Publication Data
US 2006/0167630 A1     Jul. 27, 2006

(30) Foreign Application Priority Data

| Jan. 25, 2005 | (JP) | ............................. 2005-017296 |
| Jan. 25, 2005 | (JP) | ............................. 2005-017297 |
| Jan. 25, 2005 | (JP) | ............................. 2005-017298 |
| Jan. 25, 2005 | (JP) | ............................. 2005-017299 |

(51) Int. Cl.
*G06F 17/50* (2006.01)
(52) U.S. Cl. ...................... 701/117; 345/156
(58) Field of Classification Search ................. 701/117; 703/2, 7–8; 345/156, 420, 646, 419, 629, 345/418, 422, 423, 428, 955, 473; 706/11.45
See application file for complete search history.

(56) References Cited

U.S. PATENT DOCUMENTS

| 6,096,086 | A | * | 8/2000 | Weber et al. | .................... 703/8 |
| 7,133,812 | B1 | * | 11/2006 | Weber et al. | .................... 703/8 |
| 2003/0055674 | A1 | * | 3/2003 | Nishiyama | ..................... 705/1 |

FOREIGN PATENT DOCUMENTS

EP     1 225 524 A2     7/2002

(Continued)

OTHER PUBLICATIONS

FreeSculptor: A Computer-aided Freeform Design Environment, Kuo-Cheng Wu, et al., Proceedings of the 2003 International Conference on Geometric Modeling and Graphics (GMAG'03) 0-7695-1985-7/03 $17.00 © 2003 IEEE.
A Novel Interface Paradigm for Supporting Product Design, Kuo-Cheng Wu et al., Proceedings of the Shape Modeling International 2004 (SMI'04) 0-7695-2075-8/04 $20.00 © 2004 IEEE.
European Search Report Dated Jun. 21, 2006.

(Continued)

*Primary Examiner*—Dalena Tran
(74) *Attorney, Agent, or Firm*—Studebaker & Brackett PC; Donald R. Studebaker

(57) ABSTRACT

The present invention is a vehicle planning support system (1) for displaying vehicle models (84, 92, etc.) on a screen to support vehicle planning, and comprises specification value input screen display means (36) for displaying specification value input screens for inputting specification values including dimensions and angles in the vehicle model; 3D morphing screen display means (58) for displaying vehicle models as deformable three-dimensionally shaped 3D vehicle models based on specification values input on the specification value screen using the 3D morphing screen; 2D morphing screen display means (56) for displaying vehicle models as deformable two-dimensionally shaped 2D vehicle models based on specification values input on the specification value screen using the 2D morphing screen.

21 Claims, 32 Drawing Sheets

FOREIGN PATENT DOCUMENTS

| | | |
|---|---|---|
| EP | 1-298 596 A1 | 4/2003 |
| EP | 1 321 869 A2 | 6/2003 |
| JP | 6-52265 A | 2/1994 |
| JP | 7-271289 A | 10/1995 |
| JP | 2003-99585 A | 4/2003 |
| JP | 2003-99586 A | 4/2003 |
| JP | 2004-42747 A | 2/2004 |
| JP | 2004-42752 A | 2/2004 |
| JP | 2006-168545 A | 6/2006 |
| WO | WO 2004/111885 A2 | 12/2004 |

OTHER PUBLICATIONS

Kang-Soo Lee et al. "Framework of an Evolutionary Design System Incorporating Design Information and History", Computers in Industry, Apr. 2001, pp. 205-227 vol. 44, Elsevier Science Publishers in Amsterdam, NL.

European Search Report dated Sep. 4, 2006 Application No. EP 06 00 1427.

Japanese Office Action "Notice of Reasons for Rejection" with mailing date of Apr. 28, 2010; Japanese Patent Application No. 2005-017297; with partial English translation.

Japanese Office Action "Notice of Reasons for Rejection" with mailing date of Apr. 28, 2010; Japanese Patent Application No. 2005-017298; with partial English Translation.

Toshio Seki et al., Automotive Engineering Complete Books vol. 2, "Fundamental Plan and Design of Automobile", First Edition pp. 74-77, pp. 98-115, and pp. 295-300; published on Nov. 18, 1980 by Sankaido Publishing Co., Ltd.

Toshio Seki et al., Automotive Engineering Complete Books vol. 2, "Fundamental Plan and Design of Automobile", First Edition pp. 67-77, and pp. 91-97; published on Nov. 18, 1980 by Sankaido Publishing Co., Ltd.

Japanese Office Action "Notice of Reasons for Rejection" dated Oct. 28, 2010; Japanese Patent Application No. 2005-017299 with partial English translation.

* cited by examiner

FIG.11

SPECIFICATION VALUE INPUT SCREEN (INITIAL SCREEN)

● CONFIGURATION SELECTION

VEHICLE MODEL  PILLAR CONFIGURATION

HATCHBACK

STATION WAGON

SEDAN

SPORTS CAR

CONVERTIBLE

TRUCK

SEAT CONFIGURATION  3ROWS (2+3+2) ▶

● READ IN SPEC. VALUES

SELECT BASE VEHICLE (FOR MORPHING)

VEHICLE A ▶

● DEVELOPMENT STAGE stage 3 ▶

FIG.22

MORPHING DISPLAY SETTING MENU

●MORPHING SCREEN SELECTION

☐3D

■2D { ■SIDE VIEW  ■PLAN VIEW  ■FRONT VIEW
☐PARTIAL SECTIONAL VIEW
| PILLAR A PORTION ▼ |

●BENCHMARK VEHICLE SELECTION
(FOR COMPARISON DISPLAY)

DISPLAY

■ON  ☐OFF

| VEHICLE B ▼ |

OVERLAY REFERENCE POINT

| FRONT BUMPER FRONT EDGE ▼ |

●SPATIAL AREA DISPLAY

DISPLAY

■ON { ■ HEAD AREA DISPLAY       ☐ STEERING OPERATION AREA DISPLAY
■ ENTER/EXIT AREA DISPLAY  ☐ PEDAL OPERATION AREA DISPLAY
☐ REACH AREA DISPLAY

☐OFF

LAYERED DISPLAY

■ON  ☐OFF

RELATIVE DISTANCE TO PASSENGER MODEL

| 50 | mm

INTER-LAYER SPACING

| 30 | mm

FIG.25
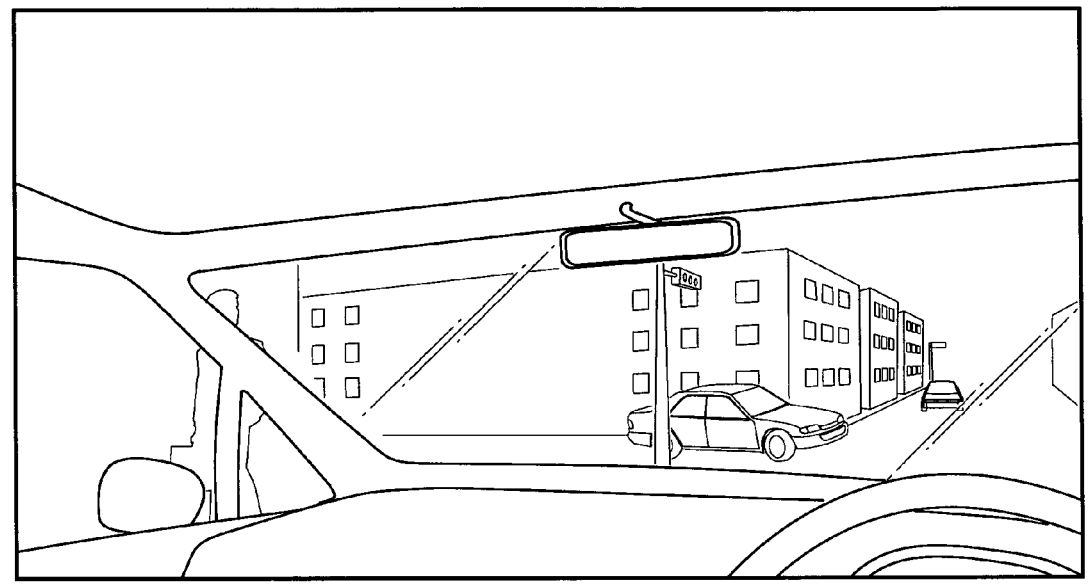
BEFORE CHANGE
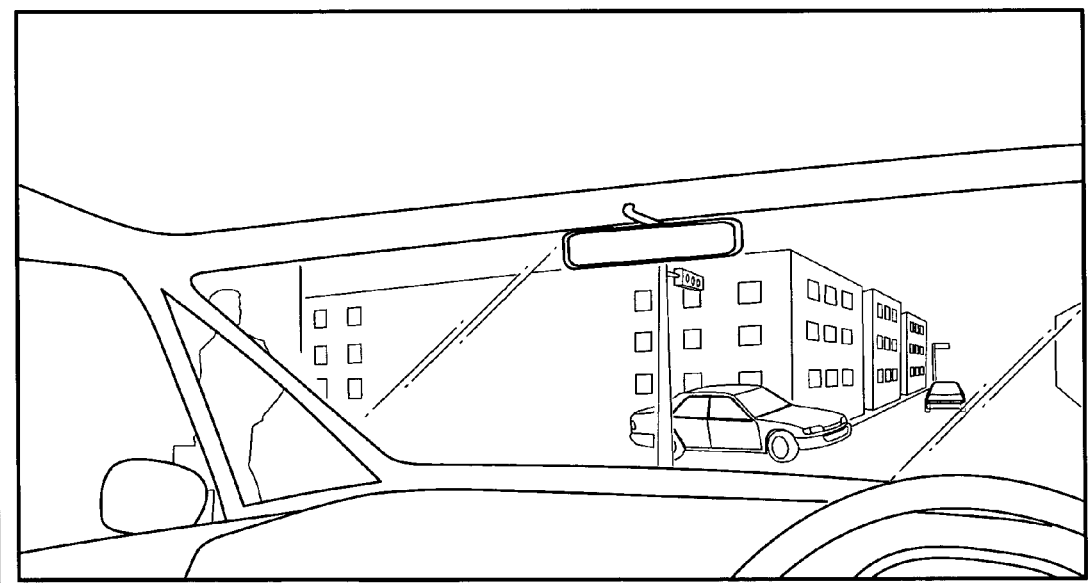
AFTER CHANGE

FIG. 36

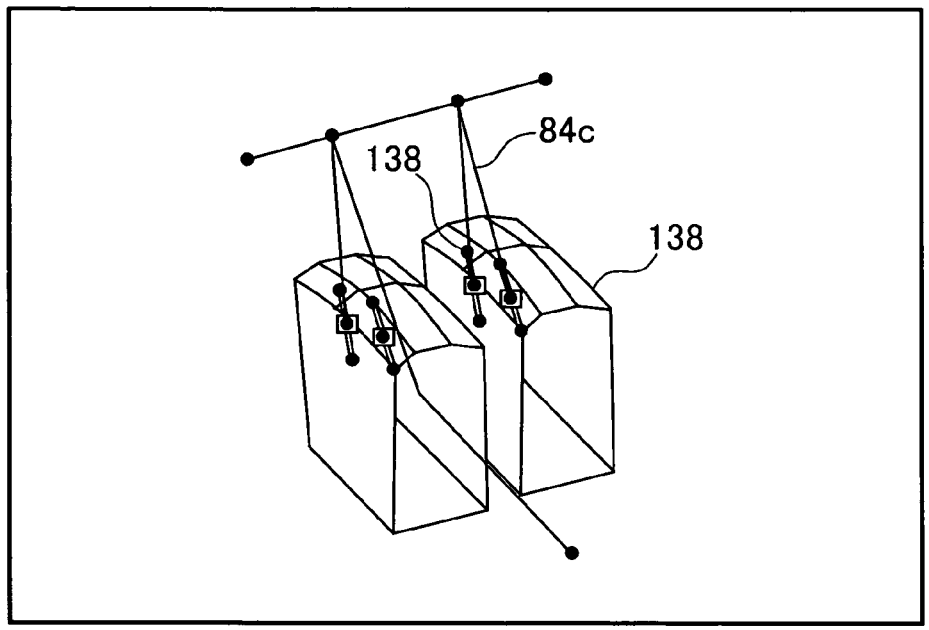

FIG. 37

SPECIFICATION VALUE INPUT TABLE FOR REGISTRATION

| SPECIFICATION ITEM (PARAMETER NAME) | PLANNED VEHICLE NAME SE3P | BENCHMARK VEHICLE "A" | BENCHMARK VEHICLE "B" |
|---|---|---|---|
| HIP POINT (PASSENGER MODEL) | 500 | 450 | 600 |
| PILLAR A SLOPE ANGLE (EXTERIOR MODEL) | 45 | 40 | 42 |
| PILLAR A SLOPE ANGLE (UPPER INTERIOR MODEL) | . . . | . . . | . . . |
| PILLAR A ∗ ∗ PORTION WIDTH (UPPER INTERIOR MODEL) | . . . | . . . | . . . |
| FRONT SIDE BELT LINE HEIGHT (EXTERIOR MODEL) | . . . | . . . | . . . |
| DOOR TRIM HEIGHT (LOWER INTERIOR MODEL) | . . . | . . . | . . . |

FIG.38

HISTORY REGISTRATION MENU

SPECIFICATION ITEM AND SPECIFICATION VALUE SETTING OBJECTIVE

TO ASSURE VISIBILITY,···
·····················

SPECIFICATION ITEM AND SPECIFICATION VALUE SETTING REASON

BELT LINE POSITION IS,···
·····················

DATA NAME

VISIBILITY

REGISTER

VEHICLE TYPE

MINIVAN ▼

CLASS

B SEGMENT ▼

DEVELOPMENT STAGE

STAGE1 ▼

PROJECT NAME

C5/SUV

USER NAME

\* \* \* \* \*

CONTACT

\*\*\*@\*\*\*.co.jp

03-\*\*\*\*-\*\*\*\*

DATE OF WORK

HISTORY SEARCH MENU

●SEARCH
 ■ALL DATA
 ☐SEARCH BY REGISTRATION NAME
 ☐SEARCH BY SETTING OBJECTIVE
 ☐SEARCH BY REGISTRATION VEHICLE
 ☐SEARCH BY PROJECT
 ☐OTHER

SEARCH

●KEYWORD

VISIBILITY

FIG.40

HISTORY SUMMARY SCREEN

DATA NAME: VISIBILITY
SETTING OBJECTIVE: ASSURE VISIBILITY······
SETTING REASON:······················
[DETAILED DISPLAY] [RELATED SPEC. CHANGE DATA]

DATA NAME: ✳ ✳ ✳
SETTING OBJECTIVE: ✳ ✳ ✳
SETTING REASON: ✳ ✳ ✳
[DETAILED DISPLAY] [RELATED SPEC. CHANGE DATA]

DATA NAME: ✳ ✳ ✳
SETTING OBJECTIVE: ✳ ✳ ✳
SETTING REASON: ✳ ✳ ✳
[DETAILED DISPLAY] [RELATED SPEC. CHANGE DATA]

HISTORY NOTIFICATION SETTING MENU

KNOW-HOW ASSIST FUNCTION
■ON  □OFF

●NARROW ASSIST WARNING ITEM TARGET
　■YES  □NO(TARGET ALL KNOW-HOW DATA)
　□NARROW BY VEHICLE TYPE/CLASS
　□NARROW BY TIME OF KNOW-HOW REGISTRATION
　□NARROW SPECIFICATION ITEMS RECEIVING WARNINGS
　□NARROW [BY] REGISTRANT

VEHICLE PLANNING SUPPORT SYSTEM

BACKGROUND OF THE INVENTION

1. Field of the Invention

The present invention relates to a vehicle planning support system and, more particularly, to a vehicle planning support system for supporting vehicle planning using vehicle models displayed on a screen.

2. Conventional Art

In vehicle development, there is normally a vehicle planning process to consider vehicle packaging and the like, followed by a move to specific design of detailed parts, production drawings, and the like. In the past, vehicle planning entailed the generating of multiple drawings showing overviews of the vehicle, and vehicle planning was conducted based on such drawings. Planned vehicles were also evaluated by generating clay models or mockups, or by fabricating prototype vehicles. On the other hand, the present applicant has proposed a simulation device for providing the evaluator with a simulated experience to riding the vehicle in order to evaluate vehicle characteristics (JP H07-271289). Also, the present applicant has proposed planning support programs and the like which support vehicle planning by variably displaying on a screen a plurality of models relating to vehicle exterior shape, interior space, and the like (e.g., JP 2004-042747).

However, the aforementioned drawing-based vehicle planning method required drafting a large number of drawings in order to evaluate various shapes and packages, etc., and also required redrafting drawings from scratch when points of the design were changed. It was also difficult for vehicle planners unaccustomed to such drawings to judge the pros and cons of specific packages, and in some cases it was not possible to judge what changes should be made. Finally, major cost and time were required to fabricate clay models, prototype vehicles, etc., leading to conservative tendencies in vehicle planning.

The device set forth in JP 07-271289 does enable vehicle planning from the standpoint of intuitive evaluation by an evaluator on board a vehicle, but has the problem that it does not allow vehicle planning through a comprehensive evaluation of vehicle packaging, external appearance, and the like.

On the other hand, the technology set forth in JP 2004-042747 permits vehicle planning to be advanced through a comprehensive evaluation of the vehicle package, external appearance, and the like. However, the vehicle modeling described above is built from 3D model data, and because of the extremely large amount of such data, long processing times are sometimes needed for displaying each model. Also, while the vehicle designer can more easily perceptually sense the vehicle through the 3D display of each model, there were also aspects in which seasoned vehicle designers accustomed to conventional drawings displayed two-dimensionally had difficulty grasping the vehicle image concretely. Moreover, the three dimensional nature of the display could make it difficult to discern which point on the displayed model should be changed when seeking to change the shape of a model by dragging a mouse, etc. on a screen, as when changing a roof height, for example. It was sometimes also difficult to achieve shape changes exactly like those in the image.

Also, in the technology set forth in JP 2004-042747, vehicle planning is normally carried out by displaying a vehicle model on a flat screen (for example, see FIG. 2). However, individual models are displayed as images, so even if individual models are displayed three-dimensionally, it is difficult to grasp the relative distances of instrument panels, the roof, pillars, and the like with respect to passengers, and difficult to obtain a sense of the size of the space around passengers. The problem, in other words, was that one could not evaluate headroom by placing one's hand over one's head, or verify distances by extending one's hand around one as in an actual vehicle, or objectively evaluate such things as interior space, or movement space when getting in and out of the vehicle, or the passenger's sense of spatial constriction.

Also, in the technology set forth in JP 2004-042747, only one form of the vehicle model is displayed on the screen. This raised the problem that it was difficult for a vehicle planner to evaluate whether opposing factors such as interior comfort and external appearance were balanced. A process was adopted, therefore, whereby to determine roof height, for example, values within an acceptable numerical value range were repeatedly input and re-displayed. Comfort would improve but exterior appearance would degrade, and by repeating this evaluation the roof height would be raised in a way which balanced comfort with exterior appearance.

Here, the vehicle planning stage is the stage in which vehicle shape is gradually developed based on a new idea, as various opposing factors such as comfort and exterior appearance are balanced for a variety of parts of the vehicle. In the past, the continual repetition of such operations to change numerical values until a certain vehicle shape was achieved could be quite inefficient. It was particularly time-consuming to do this when many dimensions, and the like had to be simultaneously changed.

Also, in order to display a given single shape, numerical values must be set to a particular single value. At the vehicle planning stage, however, there are naturally parts with large dimensional tolerances, and when generating a new vehicle it is inconvenient to determine a single value. It is frequently meaningless, in other words, to assign specific values in mm values, for example, during the vehicle planning stage.

Moreover, in order to achieve a balance of various factors, for example when raising the roof to gain interior comfort, other operations such as matching the pillar angles may be required in order to ameliorate the degradation in external appearance which accompanies a change in roof height. In the vehicle planning stage, that type of operation is carried out for a variety of parts of the vehicle to gradually create an overall form of the vehicle.

During this process, seasoned vehicle designers will have know-how in proportion to their experience which teaches them, for example, that pillar angles must be changed when raising a roof height, as described above. In other words, the solution to one problem in the vehicle planning stage often raises other problems, but experienced designers have a range of know-how which allows them to simultaneously solve newly presented corollary problems as they solve the original problem. Such experienced designers can therefore proceed efficiently with vehicle planning as they simultaneously adjust multiple locations on the vehicle.

On the other hand, when planning a vehicle based on a new idea there are cases in which an inexperienced designer can plan a more original vehicle, being unfettered by conventional vehicle planning concepts. However, when an inexperienced designer raises the roof height for interior comfort, for example, he or she will notice the resulting degraded external appearance. This can often be followed by several iterations of trial and error, readjusting the roof height, adjusting various parts such as the belt line or pillar angle, etc. The problem, in other words, was that a large amount of time was spent solving the other problems created by the solution to the first problem.

The aforementioned experienced designer's know-how frequently stems from unavoidable design requirements or from human engineering ideals. The results of the inexperienced designer's trial and error are therefore frequently similar to the adjustments made by the experienced designer based on know-how. It would seem that vehicle planning could be more efficiently advanced if inexperienced designers could take advantage of experienced designers' know-how. The ability to take advantage of experience designers' know-how in vehicle planning has therefore been sought.

In this regard, there has been much reliance on experienced designers' know-how in the conventional vehicle planning method based on drawings. The technology disclosed in JP 2004-042747 does not include a method for taking advantage of such expert know-how.

SUMMARY OF THE INVENTION

The present invention was therefore undertaken in order to resolve the aforementioned problems with the conventional art, and has the object of providing a vehicle planning support system capable of more efficient and effective vehicle planning.

The present invention, in order to achieve said object, is a vehicle planning support system for supporting vehicle planning by displaying vehicle models on a screen, comprising specification value input screen display means for displaying a specification value input screen for inputting specification values including dimensions and angles in said vehicle model; 3D morphing screen display means for displaying said vehicle model as a deformable three-dimensionally shaped 3D vehicle model based on the specification values input on said specification value input screen using a 3D morphing screen; and 2D morphing screen display means for displaying said vehicle model as a deformable two-dimensionally shaped 2D vehicle model based on the specification values input on said specification value input screen using a 2D morphing screen.

In the present invention so constituted, a specification value input screen is displayed for inputting specification values such as vehicle model dimensions and angles; a 3D morphing screen is displayed to show a three-dimensionally shaped 3D vehicle model with which the vehicle model can be deformed based on input specification values; and a 2D morphing screen is displayed to show a two-dimensionally shaped vehicle model with which the vehicle model can be deformed based on the input specification values. The vehicle planner can therefore efficiently and effectively evaluate various shapes and packages, etc. by inputting specification values and deforming the vehicle model, and can plan new vehicles using methods with a high degree of freedom, not bound to conventional fixed ideas, in an approach completely different from conventional drawing-based vehicle planning.

Using a 3D morphing screen to display vehicle models as deformable three-dimensionally shaped 3D vehicle models also enables the vehicle planner to gain a sensory grasp of the vehicle shape in order to advance vehicle planning. At the same time, by using a 2D morphing screen to show vehicle models as deformable two-dimensionally shaped 2D vehicle models, experienced vehicle planners, in particular, can gain a concrete grasp of vehicle shape so as to effectively proceed with vehicle planning. Here, 2D vehicle models are displayed in a 2D form, and therefore have less data than 3D vehicle models. The computation time for displaying vehicle models is therefore shorter for 2D morphing screens, allowing the vehicle planner to proceed efficiently with vehicle planning, updating shapes in real time. Because 2D vehicle models are displayed in a 2D form, it is easy for the vehicle planner to grasp what positions should be changed when changing the roof height, for example. It is also easy to deform a vehicle model exactly as imagined. As a result, vehicle planning can be more efficiently and effectively advanced.

In the present invention, preferably, the 2D morphing screen display means displays specification values on a 2D morphing screen, and when a displayed specification value is changed, said 2D vehicle model is deformed and displayed based on the changed specification value.

In the present invention so constituted, the specification value is displayed on the 2D morphing screen, allowing the vehicle planner to easily change specification values. Moreover, the 2D vehicle model is deformed and displayed based on the changed specification value, allowing the vehicle planner to efficiently advance vehicle planning.

In the present invention, preferably, when a predetermined point on the 2D vehicle model is dragged, the 2D morphing screen display means causes the 2D vehicle model to deform and display in accordance with that dragging, and automatically calculates the changed specification values corresponding to the that deformed portion.

In the present invention so constituted, the 2D vehicle model is deformed and displayed in response to dragging of a predetermined point on the model, thus enabling the vehicle planner to deform the vehicle while viewing the deformed shape. Moreover, changed specification values are automatically calculated, so that subsequent vehicle planning can be efficiently advanced.

In the present invention, preferably, the 2D morphing screen display means temporarily stores the changed specification values, and the 3D morphing screen display means, by a predetermined command, deforms and displays the 3D vehicle model all together based on all of the temporarily stored changed specification values.

In the present invention so constituted, the changed specification value is temporarily stored and the 3D vehicle model is deformed and displayed all together based on all of the temporarily stored changed specification values, thus allowing the vehicle planner to efficiently perform vehicle planning. In other words, with this arrangement it is not necessary to sequentially display the 3D vehicle models whose data are more voluminous than the 2D vehicle models; calculation time needed for such model display is saved, and waiting time for the vehicle planner is reduced. Displaying the 3D vehicle model each time the 2D vehicle model is deformed may cause partial non-conformance of the shape, for example, or calculation errors. In response, in the present invention the issuing of a predetermined command by the vehicle planner pushing a button, etc. on the screen after completion of changes in the 2D vehicle model causes the changed 3D vehicle model to be displayed all together, so that such errors can be suppressed.

In the present invention, preferably, the specification value input screen display means comprises specification value data generating means for generating specification value data including specification values input on the specification value input screen, and the 2D morphing screen display means displays the vehicle model as a deformable 2D vehicle model based on the specification value data and, furthermore, causes the changed specification value to be reflected in the specification value data when the specification value is changed on said 2D morphing screen.

In the present invention so constituted, a deformable 2D vehicle model is displayed by the 2D morphing screen based on the generated specification value data and, furthermore, when the vehicle planner changes a specification value on the 2D morphing screen, that changed specification value is reflected in the specification value data, so that subsequent vehicle planning can be efficiently advanced.

In the present invention, preferably, the 3D morphing screen display means deforms and displays the 3D vehicle model all together by a predetermined command, based on specification value data reflecting the post-change specification value.

In the present invention so constituted, the 3D vehicle model is deformed and displayed all together by a predetermined command based on specification value data reflecting the post-change specification value, thereby enabling the suppression of calculation errors caused, for example, by partial shape mismatches.

In the present invention, preferably, the 2D morphing screen display means displays the 2D vehicle model as a side view display, a plan view display, and/or a front view display.

In the present invention so constituted, the 2D vehicle model is displayed as a side view display, a plan view display, and/or a front view display, so that seasoned vehicle planners accustomed to conventional three view design drawings can advance vehicle planning with extreme efficiency. For such seasoned practitioners, that is, the vehicle external image can be more easily grasped by a display using side view display, plan view display, and/or front view display than by three-dimensional display, and vehicle planning can be more easily advanced based on the shapes and numerical values envisioned within the head of the designer based on his or her experience.

In the present invention, preferably, the 2D morphing screen display means displays a benchmark vehicle image superimposed on the 2D vehicle model at a predetermined reference position.

In the present invention so constituted, the benchmark vehicle image is displayed superimposed on the 2D vehicle model at a predetermined reference position, so that the vehicle planner can more meaningfully advance vehicle planning while comparing to the benchmark vehicle.

In the present invention, preferably, there is, further, simulation screen display means for displaying a simulation vehicle of the vehicle model on a simulation screen which is a virtual space, wherein the 2D morphing screen display means displays the 2D morphing screen together with the simulation screen, and when the 2D vehicle model is deformed on the 2D morphing screen, the simulation screen display means displays in simulation a simulation vehicle reflecting that deformation.

In the present invention so constituted, the 2D morphing screen display means displays the 2D morphing screen together with the simulation screen, and when the vehicle planner deforms the 2D vehicle model on the 2D morphing screen, the simulation screen display means displays in simulation a simulation vehicle reflecting that deformation, so that vehicle planning can be efficiently advanced. In other words, the 2D vehicle model requires shorter calculation time for a display than does the 3D vehicle model, so that even if the 2D morphing screen is displayed together with the simulation screen, the vehicle planner can advance in parallel the work of evaluation using the simulation and deformation of the vehicle model with the 2D morphing screen, without a drop in work efficiency. Therefore work flow is improved compared to returning again to the morphing screen after the simulation display is completed to do the work of deforming the vehicle model, etc. Moreover, convenience is increased by displaying the 2D model in a 2D form, since the vehicle planner can easily grasp the shape concretely, and can easily change only the part he or she wishes to change.

In the present invention, preferably, the simulation screen display means superimposes and displays in simulation the simulation vehicle reflecting deformation, and the simulation vehicle prior to reflecting deformation.

In the present invention so constituted, the simulation vehicle reflecting deformation and the simulation vehicle prior to reflecting deformation are superimposed and displayed in simulation, so that the planned vehicle can be easily evaluated.

In the present invention, preferably, the simulation screen display means arrays and displays in simulation the simulation vehicle reflecting the deformation next to the simulation vehicle prior to reflecting the deformation.

In the present invention so constituted, the simulation vehicle reflecting the deformation and the simulation vehicle prior to reflecting the deformation are arrayed and displayed in simulation, making it easy to evaluate the planned vehicle.

In order to achieve said objectives, the present invention is a vehicle planning support system for displaying vehicle models on a screen to support vehicle planning, comprising a specification value input screen display means for displaying a specification value input screen for inputting specification values including dimensions and angles in the vehicle model, and a morphing screen display means for displaying the vehicle model as a deformable vehicle model based on specification values input on the specification value input screen using a morphing screen; wherein the vehicle model includes a passenger model for prescribing passenger positioning and posture, and the morphing screen display means comprises spatial area display means which, when the passenger model is displayed, displays a spatial area display corresponding to that passenger model for evaluating the size of the space around the passenger model.

In the present invention so constituted, a specification value input screen is displayed for inputting specification values including dimensions and angles in the vehicle model, and a morphing screen is displayed for displaying the vehicle as a deformable vehicle model based on input specification values. Therefore the vehicle planner can efficiently and effectively evaluate various shapes and packages by inputting specification values and deforming vehicle models, and can plan new vehicles using methods with a high degree of freedom, not bound to conventional fixed ideas, in an approach completely different from conventional drawing-based vehicle planning.

A spatial area display for evaluating the size of the space around the passenger model is displayed which corresponds to a passenger model prescribing passenger positioning and posture, thus allowing the vehicle planner to objectively evaluate the size of the space around the passenger model. In particular when, for example, a vehicle model is displayed on a flat screen such as that shown in FIG. 2 for consideration and evaluation by multiple persons, the display of that spatial area display allows for an evaluation of the size of space around a passenger model by multiple persons without variability in the evaluation and with objectivity. The size of space around the passenger can also be grasped without fabricating prototype vehicles, evaluating headroom by actual placement of a hand over the head, or verification of distances by extending the hand in various surrounding directions. The result of the above is that vehicle planning can be more efficiently and effectively advanced.

In the present invention, preferably, the spatial area display includes an entering/exiting area display depicting the space through which the passenger model's head passes when entering or exiting, and the spatial area display means displays this entering/exiting area display in the region of the vehicle model door opening.

In the present invention so constituted, the space through which the passenger model's head passes when entering or exiting is displayed by the entering/exiting area display displayed in the vehicle model door opening region, thus enabling, for example, evaluation of headroom or the presence/absence of interference with respect to the roof or pillar when the passenger is entering or exiting.

In the present invention, preferably, the spatial area display includes a reach area display depicting the space reached by the passenger model's hand, and the spatial area display means displays the reach area display on the front side of the passenger model.

In the present invention so constituted, the space reached by the passenger model's hand is depicted by the reach area display displayed on the front side of the passenger model, so that passenger maneuverability can be evaluated with respect, for example, to the steering, shift lever, and instrument panel.

In the present invention, preferably, the spatial area display includes a head spatial area display depicting the space in which the passenger model's head moves when seated, and the spatial area display means displays the head spatial area display on the top side of the passenger model.

In the present invention so constituted, the space in which the passenger model's head moves when seated is depicted by the head spatial area display displayed on the top side of the passenger model so that, for example, headroom with respect to the roof or the presence/absence of interference by the head with respect to the pillar, etc. can be evaluated.

In the present invention, preferably, the spatial area display can be displayed in layers.

In the present invention so constituted, the size of the space around the passenger can be more objectively evaluated.

In the present invention, preferably, the morphing screen display means displays or sets to non-display the spatial area display, based on a command to display or not display input to the spatial area display.

In the present invention so constituted, convenience to the vehicle planner can be increased.

In order to achieve said objectives, the present invention is a vehicle planning support system for displaying vehicle models on a screen to support vehicle planning, comprising a specification value input screen display means for displaying a specification value input screen for inputting specification values including dimensions and angles in the vehicle model, and a morphing screen display means for displaying the vehicle model as a deformable vehicle model based on specification values input on the specification value input screen using a morphing screen; wherein the specification value input screen display means includes a range input means for inputting a range value which is a predetermined numerical value range with respect to the specification value, and the morphing screen display means includes a range display means for displaying a range display depicting a vehicle shape corresponding to the input the range value.

In the present invention so constituted, a specification value input screen is displayed for inputting specification values including dimensions and angles in the vehicle model, and a morphing screen is displayed for displaying the vehicle as a deformable vehicle model based on input specification values. Therefore the vehicle planner can efficiently and effectively evaluate various shapes and packages by inputting specification values and deforming vehicle models, and can plan new vehicles using methods with a high degree of freedom, not bound to conventional fixed ideas, in an approach completely different from conventional drawing-based vehicle planning.

A range value, which is a predetermined numerical value range with respect to a specification value, can be input using the range input means, so that the vehicle planner does not need to display the vehicle shape in the vehicle planning stage of considering many different vehicle shapes. Therefore convenience to the vehicle planner can be increased. Moreover, the range display, which depicts a vehicle shape corresponding to a range value, is displayed by the range display means, so that the vehicle planner does not need to redisplay the vehicle model over and over by repeatedly inputting numerical values one at a time, and can therefore more efficiently advance vehicle planning. In other words, by using the range display, the vehicle planner can look at a vehicle shape corresponding to an allowable numerical value range with respect to a specification value and compare and evaluate at one time the respective opposing factors (for example, comfort and external image). Furthermore, the vehicle shape within the range display becomes easier to imagine when the range display is used as a guide. Consideration can consequently be given to what position the roof height should be, for example, in order to balance comfort and exterior appearance. In particular, when a vehicle model is displayed on a flat screen such as that shown in FIG. 2 for consideration and evaluation by multiple persons, that consideration and evaluation can be easily advanced among those multiple persons, and the direction of vehicle planning can be determined. As a result of the above, vehicle planning can be more efficiently and effectively advanced.

In the present invention, preferably, the range input means does not allow input of a range value with respect to predetermined specification value.

In the present invention so constituted, when there is a carryover of, for example, a door or hood in a prior vehicle type, a restriction is applied by the range input means so that a range value cannot be input with respect to specification values (predetermined specification values) related to such component parts; therefore development is prevented of vehicles for which vehicle planning was tried but which are impossible to implement.

In the present invention, preferably, the range input means does not allow input of a range value within a predetermined limit range only.

In the present invention so constituted, when there are restrictions due for example to regulations, the range value is restricted by the range input means so that input is only possible within those limitations (a predetermined limit range), so that development is prevented of vehicles for which vehicle planning was tried but which are impossible to implement.

In the present invention, preferably, the range input means allows input of a range value only within a predetermined prescribed range determined in accordance with the vehicle development stage, and the predetermined prescribed range narrows as the development stage progresses.

In the present invention so constituted, a restriction is applied by the range input means so that the range value can only be input within a predetermined prescribed range defined in accordance with the development stage, and the predetermined prescribed range becomes smaller as the development stage progresses, so that an appropriate range value corresponding to the development stage can be input. As a result, vehicle planning can be effectively advanced. Also, development is prevented of vehicles for which vehicle planning was tried but which are impossible to implement.

In the present invention, preferably, the morphing display means displays, as the range display, the vehicle shapes shown for the respective maximum value and minimum value of the range value.

In the present invention so constituted, a vehicle shape shown by the respective range value maximum and minimum values is displayed, so the vehicle planner can simultaneously compare differing shapes. Also, other shapes within the two shapes at the displayed maximum and minimum values can be more freely imagined. Furthermore, the range of range values can be known. The result of the above is that vehicle planning can be more effectively advanced.

In the present invention, preferably, the morphing screen display means displays, as the range display, a plurality of vehicle shapes at predetermined intervals, from a maximum value to a minimum value in the predetermined numerical value range input from the range input means.

In the present invention so constituted, a plurality of vehicle shapes at predetermined intervals from a maximum value to a minimum value over a predetermined numerical value range input by the range input means are displayed as the range display, so that the vehicle planner can view many different shapes within the range values.

In the present invention, preferably, when the specification value is not input and the range value is input, the morphing screen display means displays the vehicle model using the midpoint value of the range value maximum value and minimum value as the specification value.

In the present invention so constituted, when the specification value is not input and the range value is input, the vehicle model is displayed using the midpoint value of the range value maximum value and minimum value as the specification value on the morphing screen display means, thus increasing vehicle planner convenience.

In order to achieve said objective, the present invention is a vehicle planning support system for displaying vehicle models on a screen to support vehicle planning, comprising a specification value input screen display means for displaying a specification value input screen for inputting specification values including dimensions and angles in a plurality of specification items of the vehicle model, and a morphing screen display means for displaying the vehicle model as a vehicle model with a changeable shape and specification values, based on specification values input on the specification value input screen using a morphing screen, and a history registration means for registering specification values input to the specification value input screen or specification values changed on the morphing screen, as well as the corresponding specification item, input, or objective and reason for change.

In the present invention so constituted, a specification value input screen is displayed for inputting specification values including dimensions and angles in the vehicle model, and a morphing screen is displayed for displaying the vehicle as a deformable vehicle model based on input specification values. Therefore the vehicle planner can efficiently and effectively evaluate various shapes and packages by inputting specification values and deforming vehicle models, and can plan new vehicles using methods with a high degree of freedom, not bound to conventional fixed ideas, in an approach completely different from conventional drawing-based vehicle planning.

In the present invention, by using the history registration means the vehicle planner can register specification values input on the specification value input screen or specification values changed on the morphing screen, as well as the specification items thereof and the objective and reason for inputs or changes so that, for example, know-how possessed by a seasoned professional can be registered and can serve subsequent vehicle planning. Therefore by taking advantage of such know-how, persons with less design experience can reduce the repetition of tasks such as adjustments made through trial and error in various parts of the design. In other words, problems arising in vehicle planning can be solved based on registered know-how, so that vehicle planning can be more efficiently advanced. As result, persons with less design experience can effectively plan original vehicles based on new ideas. As a result of the above, vehicle planning can be more efficiently and effectively advanced.

The present invention, preferably, further comprises history search means for searching registered objectives and reasons.

In the present invention so constituted, the vehicle planner, using the history search means for searching registered objectives and reasons, can search for visibility improvement related data when seeking to improve visibility, for example. By referring to data such as registered specification items, etc. resulting from that search, vehicle planning can be effectively advanced.

The present invention, preferably, further comprises history notification means for giving notification of the registered objective and reason relating to matching specification items when a specification value among the specification items matching the registered specification items is changed subsequent to registration by the history registration means.

In the present invention so constituted, when the vehicle planner has changed a specification value in the specification items matching specification items included in related specification change data, that related specification data included in the matching specification items is notified by a history notification means, so that the vehicle planner can know, for example, that when a specification value in a specification item relating to a steering wheel position is changed to improve visibility, the seat position should also preferably be changed, and subsequent vehicle planning can be effectively advanced.

In the present invention, preferably, said history registration means causes those specification items and related objectives and purposes to be registered as related specification change data along with the changed plurality of specifications when a plurality of specification values are relatedly changed on the morphing screen.

In the present invention so constituted, when the vehicle planner has made a plurality of changes related to specification values on the morphing screen, the history registration means enables the registration of those plurality of changed specification values, along with their specification items and related objectives and reasons as related specification change data. Therefore when the steering wheel position is raised to increase visibility, for example, know-how such as that it is preferable to also lower the seat position can be registered, which will be useful for later vehicle planning.

As a result, persons with less design experience can reduce the repetition of tasks such as adjustments made through trial and error in various parts by taking advantage of such know-how, etc. In other words, problems arising in vehicle planning can be solved based on registered know-how, so that vehicle planning can be more efficiently advanced. As result, persons with less design experience can effectively plan original vehicles based on new ideas. As a result of the above, vehicle planning can be more efficiently and effectively advanced.

The present invention, preferably, further comprises history search means for searching related objectives and reasons.

In the present invention so constituted, using the history search means for searching related objectives and reasons, the vehicle planner can search for registered related specification change data relating to visibility, for example, when seeking to improve visibility. Based on that searched data, the planner can then learn the content of countermeasures, such as that is preferable to change the seat position together with the steering wheel position, for example, when seeking to improve visibility.

In the present invention, preferably, the history registration means is capable of causing related objective to be registered as the related specification change data name, and the history search means is capable of causing searches to be performed under this name.

In the present invention so constituted, the vehicle planner can, using the history registration means, register a related objective as the name of the related specification change data, and can search under that name; therefore related specification change data can be efficiently used.

The present invention, preferably, further comprising history notification means which, if after registration of specification change data by the history notification means there is a change in a specification value of a specification item matching a specification item included in the related specification change data, gives notification of related specification change data which includes that matching specification item.

In the present invention so constituted, when, after registering related specification change data, the vehicle planner has changed a specification value in a specification item matching an specification item included in the related specification change data, the related specification change data which includes that matching specification item is notified by the history notification means, so that the vehicle planner can know that if he or she has changed a specification value in a specification item relating to the steering wheel position to improve visibility, for example, it is also preferable to change the seat position, and vehicle planning can thereafter be effectively advanced.

In order to achieve said objective, the present invention is a vehicle planning support system for displaying vehicle models on a screen to support vehicle planning, comprising a specification value input screen display means for displaying a specification value input screen for inputting specification values including dimensions and angles in a plurality of specification items of said vehicle model, and a morphing screen display means for displaying the vehicle model as a vehicle model with a changeable shape and specification values, based on specification values input on the specification value input screen using a morphing screen, and a database for storing data prescribing positional relationships between passenger models and interior models included in the vehicle model, wherein when the position of a hip point on the passenger model is changed on the morphing screen, the morphing screen display means comprises display position adjustment means which, based on data prescribing the positional relationship, displays the position of the interior model in the changed position such that the interior model assumes the prescribed positional relationship with respect to the passenger model.

In the present invention so constituted, when the vehicle planner changes the position of the passenger hip point on the morphing screen, the changed position of the interior model is displayed by the display position adjustment means so that the interior model assumes the prescribed positional relationship to the passenger model. Therefore the position of the interior model to be changed moves together in a prescribed positional relationship (for example, the position needing to be changed either as a design item or based on know-how) thereto, and is automatically changed in correspondence with the passenger model hip point; therefore the manual work needed to make the change can be eliminated. As a result, convenience to the vehicle planner can be increased. As a result of the above, vehicle planning can be more efficiently and effectively advanced.

In the present invention, preferably, a seat, instrument panel, and/or door rim models are included in the interior model.

In the present invention so constituted, the seat position which unavoidably must be changed together with the change in passenger model hip point position moves in tandem therewith and is automatically changed. Also, the instrument panel or the door trim positions, which should also preferably be concomitantly changed from the standpoint of interior appearance, are automatically changed together with the passenger model hip point position change. Therefore convenience for the vehicle planner can be increased.

BRIEF DESCRIPTION OF THE DRAWINGS

FIG. 11 is a diagram depicting the initial screen of a specification value input screen according to an embodiment of the present invention.

FIG. 22 is a diagram showing a morphing display setting menu screen according to an embodiment of the present invention.

FIG. 25 is a diagram depicting an example of a side-by-side image of the vehicle model pillar portion displayed in a simulation according to an embodiment of the present invention, before and after being changed.

FIG. 36 is a diagram depicting an example of pedal control area display, being a spatial area display, according to an embodiment of the present invention.

FIG. 37 is a diagram depicting a registration specification value input table based on the history registration display function of a history registration display program according to an embodiment of the present invention.

FIG. 38 is a diagram depicting a history registration menu based on the history registration display function of a history registration display program according to an embodiment of the present invention.

FIG. 39 is a diagram depicting a history search menu based on a history search function in a history registration display program according to an embodiment of the present invention.

FIG. 40 is a diagram depicting an example of a history list screen displayed by a history search function and history notification function in the history registration display program according to an embodiment of the present invention.

FIG. 41 is a diagram depicting a history notification setting menu based on the history notification function in the history registration display program according to an embodiment of the present invention.

DESCRIPTION OF THE PREFERRED EMBODIMENTS

Embodiments of the present invention are explained below with reference to the attached diagrams.

Figure 1:
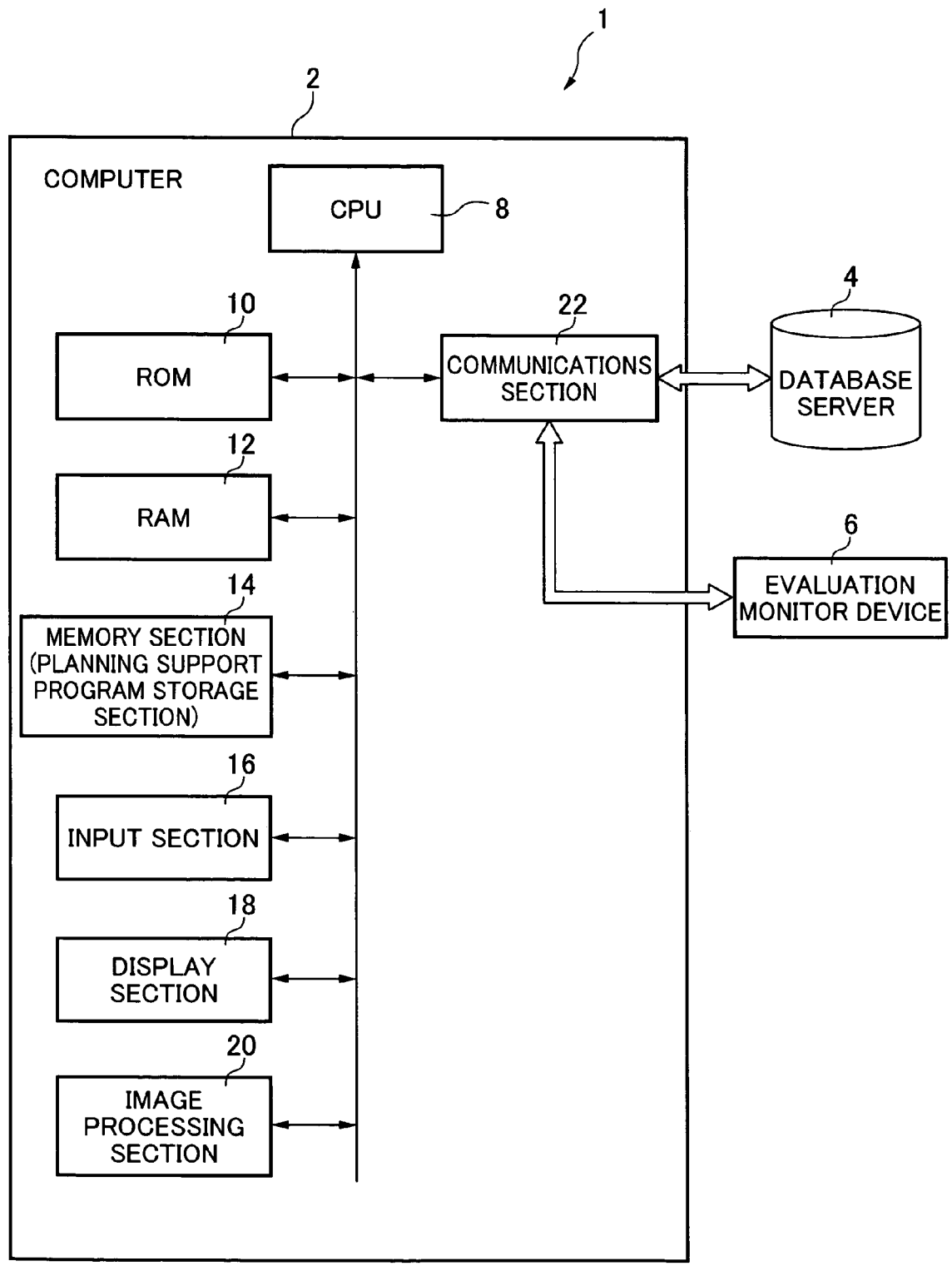
FIG. 1 is a block diagram depicting the basic constitution of a vehicle planning support system according to an embodiment of the present invention.
Figure 2:
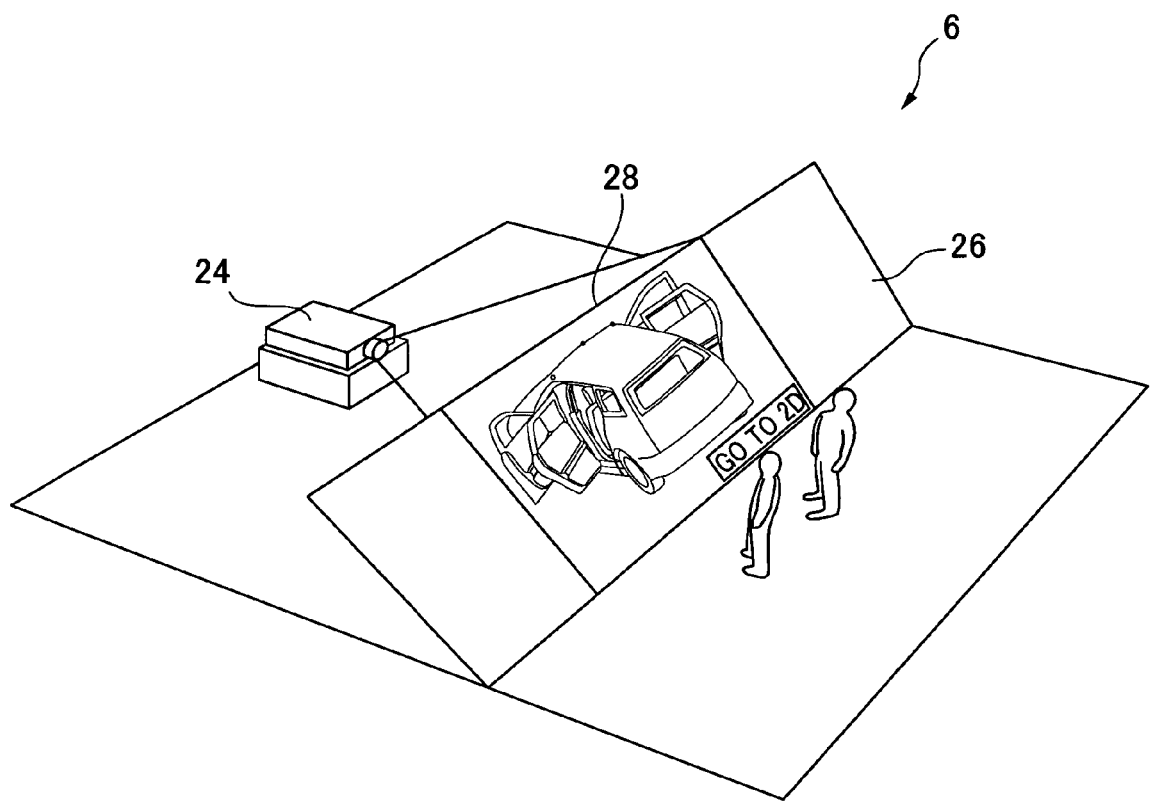
FIG. 2 is a perspective diagram depicting the basic constitution of an evaluation monitor device included in a vehicle planning support system according to an embodiment of the present invention.
Figure 3:
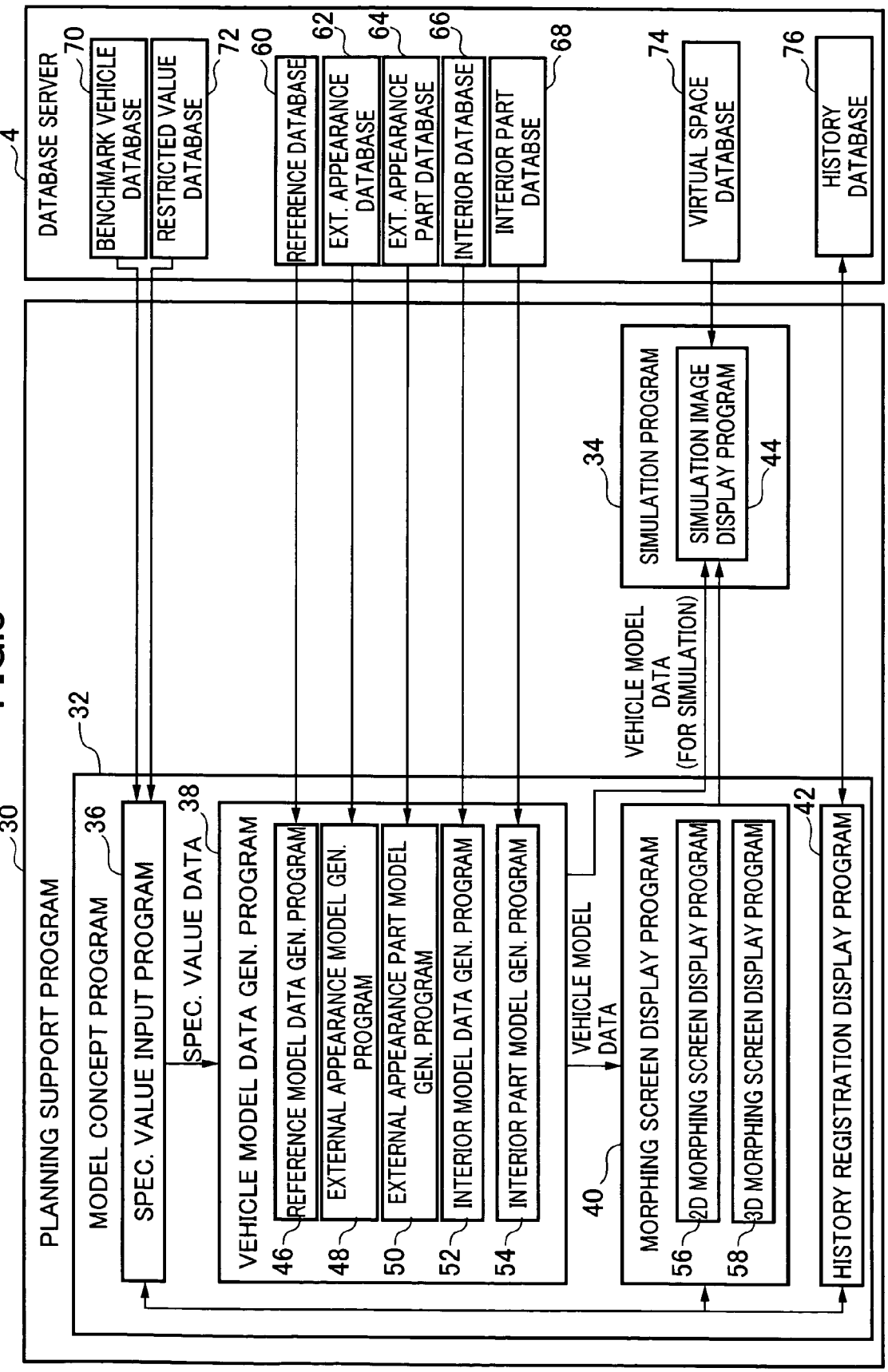
FIG. 3 is a diagram depicting the constitution of a planning support program and database and a conceptual data flow in a vehicle planning support system according to an embodiment of the present invention.

First, an overview of the vehicle planning support system according to an embodiment of the present invention is explained using FIGS. 1-3. FIG. 1 is a block diagram depicting the basic constitution of the vehicle planning support system according to an embodiment of the present invention. FIG. 2 is a perspective view depicting the basic constitution of a vehicle planning support system evaluation monitor device according to an embodiment of the present invention. FIG. 3 is a diagram depicting the constitution of a planning support program and database and a conceptual data flow in a vehicle planning support system according to an embodiment of the present invention.

We will first explain the basic constitution of a vehicle planning support system according to an embodiment of the present invention referring to FIG. 1. As depicted in FIG. 1, the vehicle planning support system 1 comprises a computer 2, a database server 4, and an evaluation monitor device 6.

First, the computer 2 has a CPU 8, a ROM 10, a RAM 12, a memory section 14, an input section 16, a display section 18, an image processing section 20, and a communication section 22. The CPU 8 is a central processing unit device which, in addition to common computer calculations, also executes processing according to the planning support program 30 shown in FIG. 3. A boot program, etc. for starting the computer 2 is stored in the ROM 10. The RAM 12 has a program area for temporary storage of the planning support program 30 executed in the vehicle planning support system, and for various data, as well as a data area for reading and writing data.

The memory section 14 is a memory device such as a hard disk drive. The memory section 14 has a planning support program storage section; the planning support program 30 is stored here, as shown in FIG. 3. The input section 16 is a mouse or keyboard or the like for external inputting of commands, data, and the like. A display section 18 is a liquid crystal display or the like. The image processing section 20 does computational processing of data to be displayed based on commands from the CPU 8, causing the data to be displayed on the display section 18 or the evaluation monitor device 6. The communication section 22 sends and receives information between the database server 4, the evaluation monitor device 6, and other computers (not shown) via wireless or wired communications circuits.

Next, referring to FIG. 2, we will explain the evaluation monitor device. As shown in FIG. 2, the evaluation monitor device 6 is furnished with a projector 24 and a flat screen 26. Based on information computationally processed by the image processing section 20, the projector 24 projects a vehicle model or simulation model (described below) onto the flat screen 26 from the rear. Multiple vehicle planners (persons evaluating or performing various operations on the planned vehicle) positioned in front of the flat screen 26 can view the screen 28 displaying that vehicle model or simulation model. Thus, by using the evaluation monitor device 6, multiple vehicle planners can simultaneously consider and evaluate a planned vehicle without fabricating a prototype vehicle.

We will next explain a summary of the planning support program 30 and the vehicle planning flow referring to FIG. 3. As depicted in FIG. 3, a model concept program 32 and a simulation program 34 are included in the planning support program 30. In an embodiment of the present invention, consideration of the packaging, etc. determined by the layout of each portion of the planned vehicle is advanced using the model concept program 32, while evaluation of that planned vehicle is performed by the simulation program 34.

The model concept program 32 includes a specification value input program (specification value input screen display program) 36, a vehicle model data generating program 38, a morphing screen display program 40, and a history registration display program 42. A simulation image display program 44 is included in the simulation program 34.

First, in vehicle planning, "specification value data" comprising planned vehicle type, specification values, etc. is generated based on inputs by the vehicle planner, etc., using the specification value input program 36. Next, using the vehicle model data generating program 38, "vehicle model data" is generated based on this specification value data and on "vehicle data" (data forming the vehicle model template) stored in each of the databases 60, 62, 64, 66, and 68 on the database server 4. This vehicle model data is used to display the planned vehicle on a morphing screen as the "vehicle model." The vehicle model data generating program 38 includes a reference model data generating program 46, an external appearance model data generating program 48, an exterior appearance part model data generating program 50, an interior model data generating program 52, and an interior part model data generating program 54.

Next, the "vehicle model" is displayed based on the vehicle model data using the morphing screen display program 40 (see FIGS. 5-9). The morphing screen display program 40 includes a 2D morphing screen display program 56 and a 3D morphing screen display program 58, by which the vehicle model is respectively displayed in 2D and 3D. This vehicle model is capable of morphing; i.e. the shape of each part thereof can be deformed, and the position of each part thereof can be changed. "Deforming" the vehicle model includes changing the shape and the position of each part of the displayed vehicle model.

Next, the vehicle planner can change the shape and layout on the screen of each portion of the vehicle model displayed using the morphing screen display program 40 to advance consideration of the of the planned vehicle external shape, passenger layout, etc. After such consideration is completed, the vehicle model is displayed in simulation inside a virtual space, using the simulation image display program 44, so that the vehicle planner can verify the appearance of the planned vehicle driving in a virtual space, which mocks up an actual urban area or the like, or the view from the cabin, etc.

Using the history registration display program 42, specification value input and change history, including the objective thereof, can be registered in the history database 76. Registered data can be searched; notification is also given in predetermined conditions.

We will next explain the database included on the database server 4. As depicted in FIG. 3, the database server 4 includes a basic database 60, an external appearance database 62, an external appearance parts database 64, an interior parts database 66, and an interior parts database 68. As detailed below, vehicle data constituting a vehicle model data template are stored in these databases.

A benchmark vehicle database 70, a restricted value database 72, a virtual space database 74, and a history database 76 are also included in the database server 4. A plurality of specification values expressing dimensions, angles, etc. of existing vehicle models as concrete numerical values are also stored in the benchmark vehicle database 70. Such specification values can be used as data for the reference vehicle which forms a base for changing the shape and layout of each portion of the planned vehicle, or for the benchmark vehicle against which the planned vehicle is to be compared.

Data relating to regulations or to vehicle design limit values is stored in the restricted value database 72. These data comprise, for example, specific values such as bumper heights determined by domestic and foreign crash safety standards. Data relating to prescribed values prescribed with respect to an acceptable range of specifications (specification items such as roof height) in accordance with the vehicle planning stage is also stored.

Virtual space data relating to virtual space during simulation display of the vehicle model is stored on the virtual space database 74. Virtual space data is for forming 3D virtual space, which includes buildings, roads, intersections, traffic signals, pedestrians, and other vehicles as objects.

Vehicle planner know-how such as procedures and objectives for setting and changing specification values is stored as history data in the history database 76. History data can also be saved anew to the history database 76.

Figure 4:
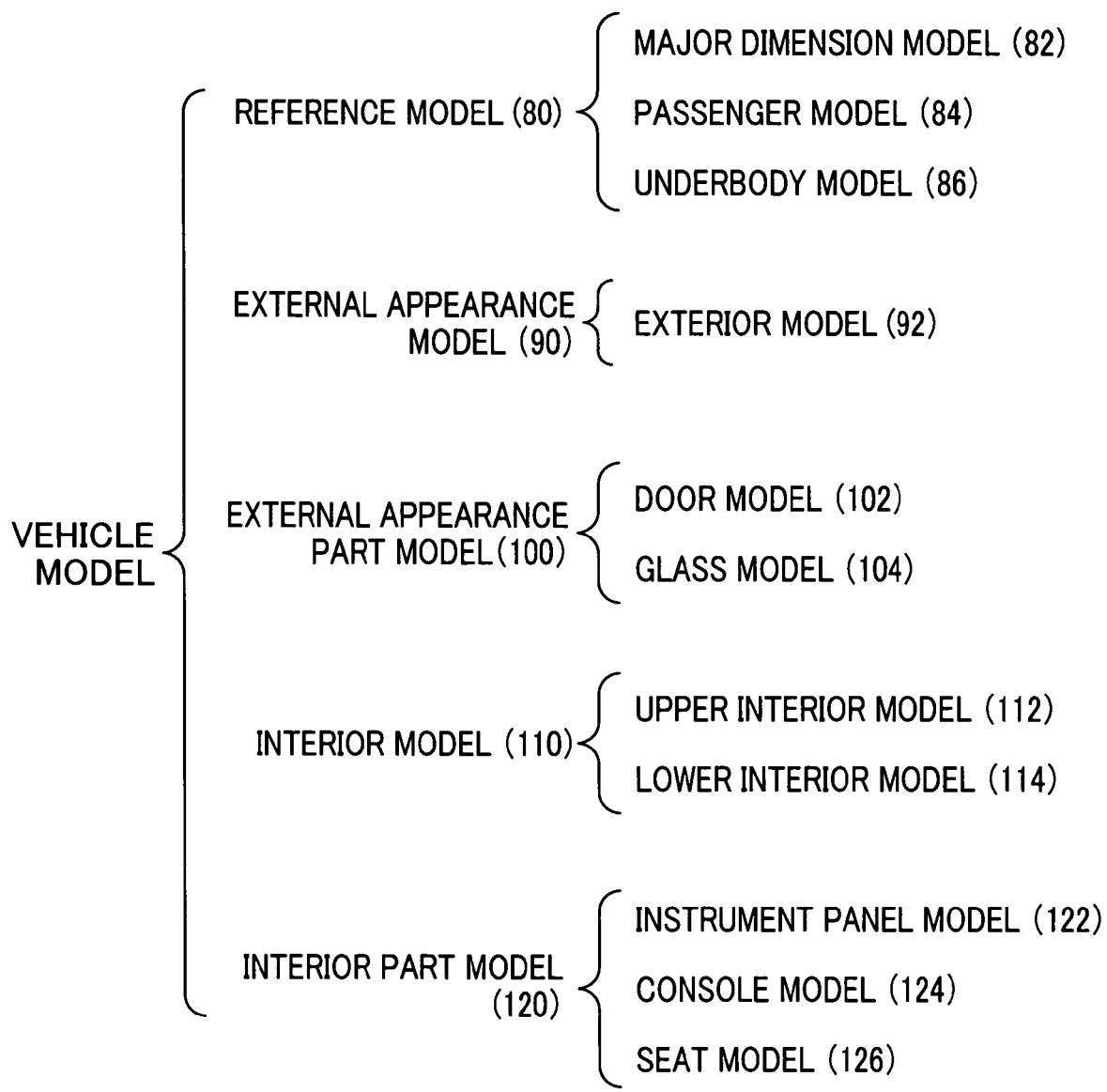
FIG. 4 is a diagram explaining each model included in the vehicle models according to an embodiment of the present invention.
Figure 5A:
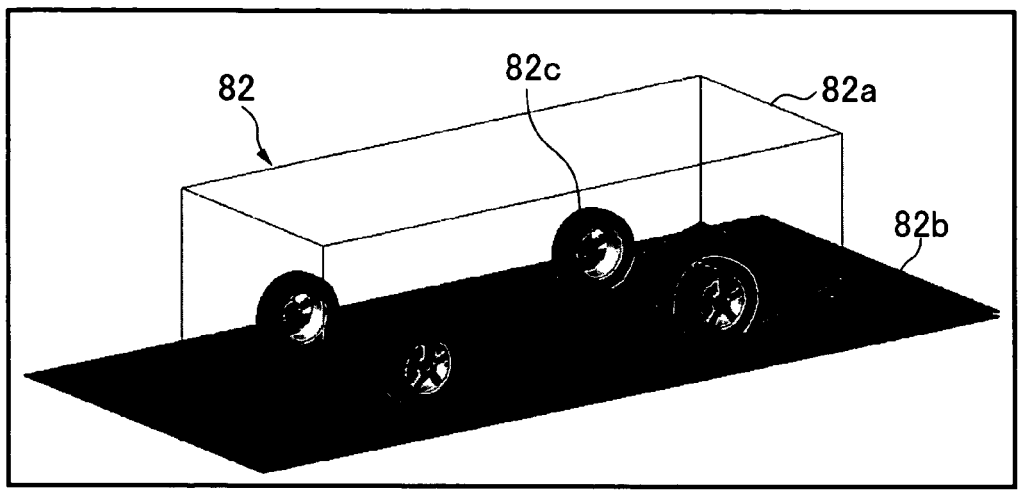
FIG. 5A is a diagram depicting an example of a major dimension model in a reference model according to an embodiment of the present invention.
Figure 5B:
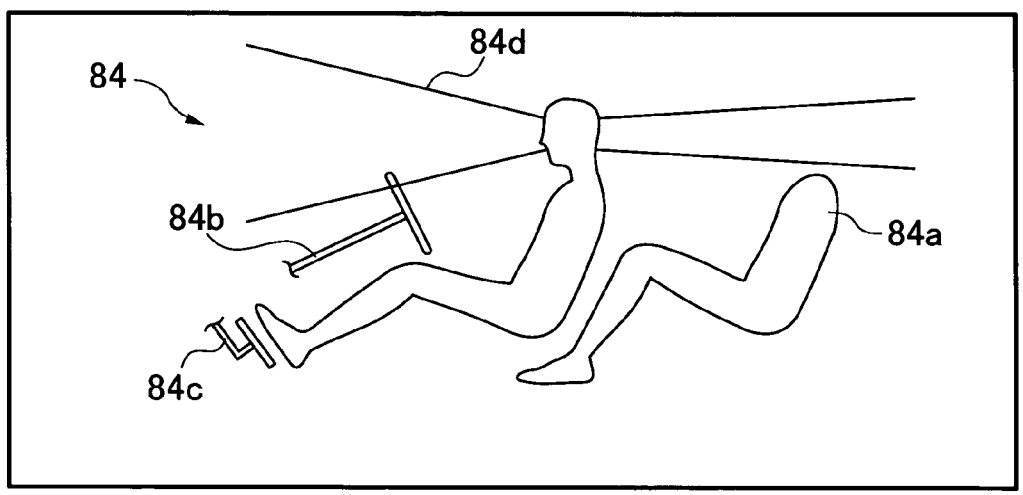
FIG. 5B is a diagram depicting an example of a passenger model in a reference model according to an embodiment of the present invention.
Figure 5C:
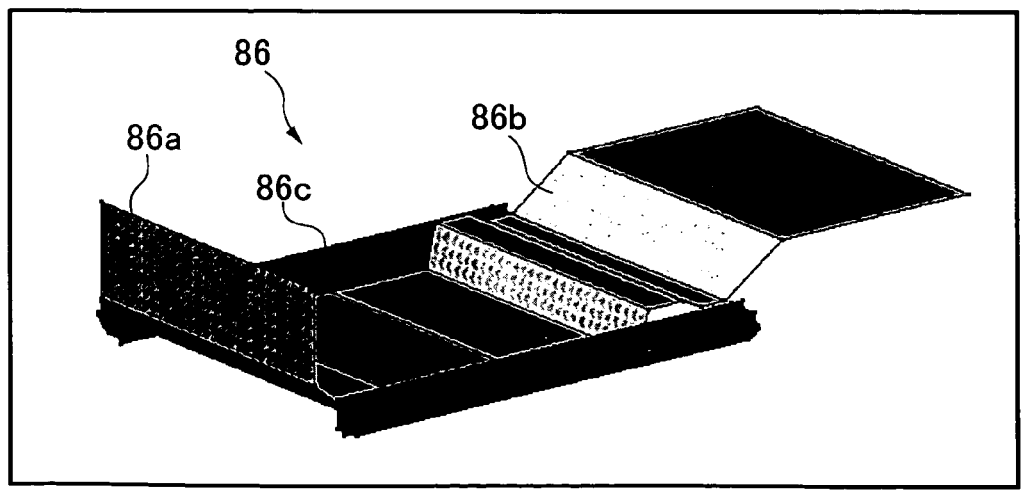
FIG. 5C is a diagram depicting an example of an underbody model in a reference model according to an embodiment of the present invention.
Figure 6:
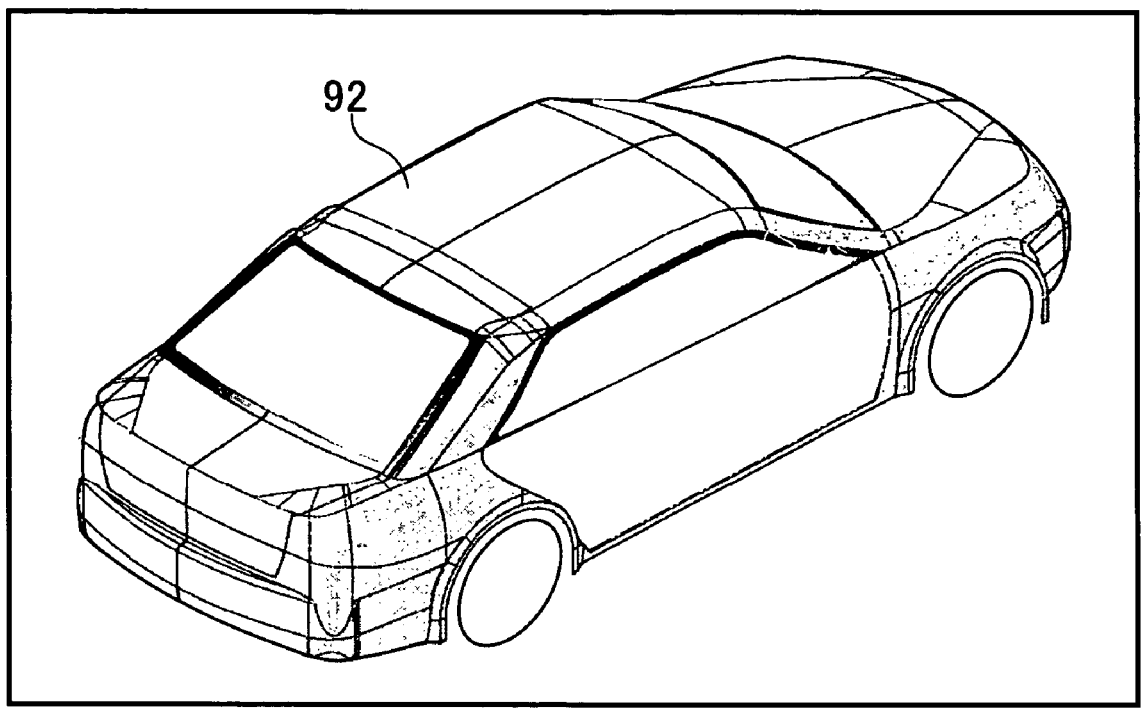
FIG. 6 is a diagram depicting an example of an exterior model in an external appearance model according to an embodiment of the present invention.
Figure 7A:
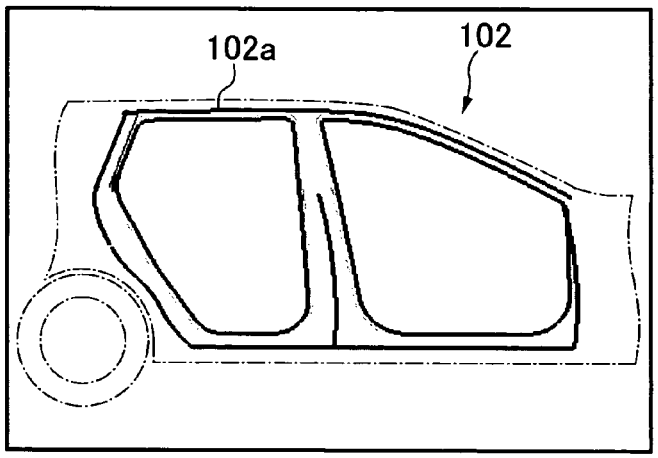
FIG. 7A is a diagram depicting an example of an exterior model in an exterior appearance part model according to an embodiment of the present invention.
Figure 7B:
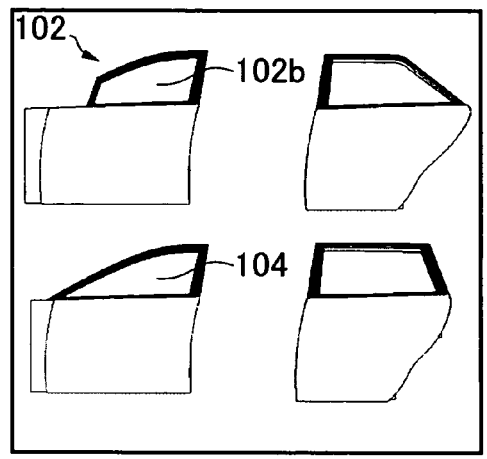
FIG. 7B is a diagram depicting an example of an exterior model in an exterior appearance part model according to an embodiment of the present invention.
Figure 7C:
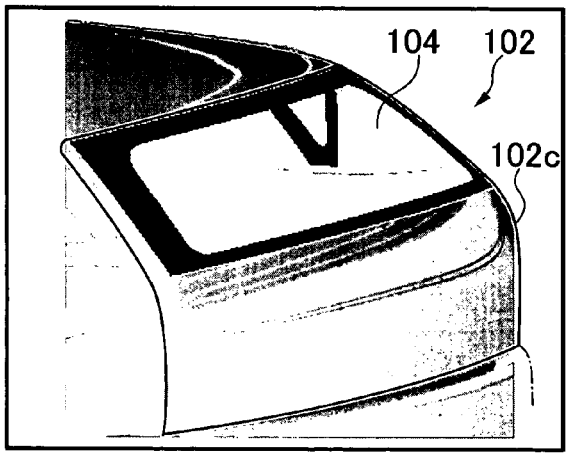
FIG. 7C is a diagram depicting an example of an exterior model in an exterior appearance part model according to an embodiment of the present invention.
Figure 7D:
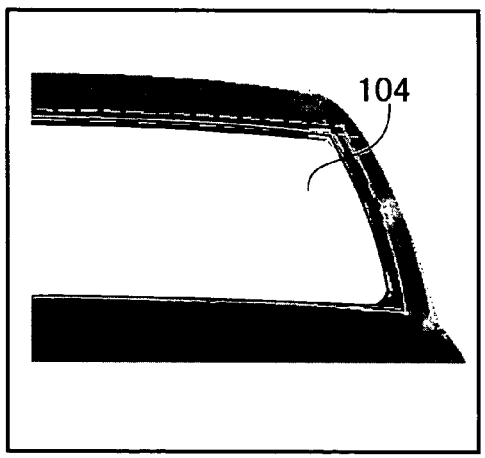
FIG. 7D is a diagram depicting an example of a glass model in an exterior appearance part model according to an embodiment of the present invention.
Figure 8A:
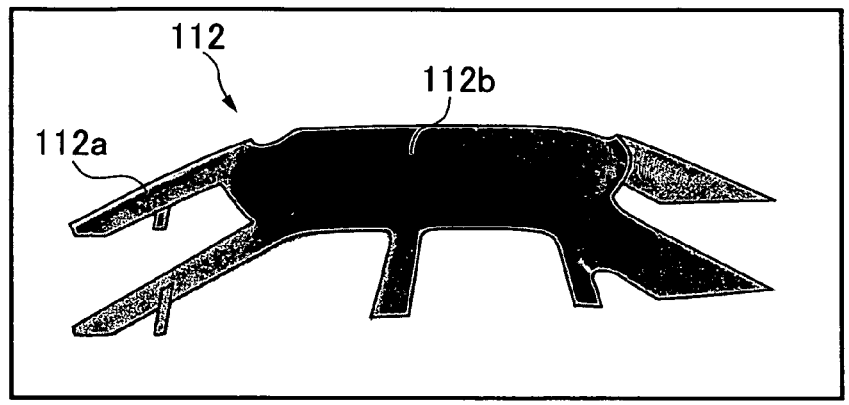
FIG. 8A is a diagram depicting an example of an upper interior model in an interior model according to an embodiment of the present invention.
Figure 8B:
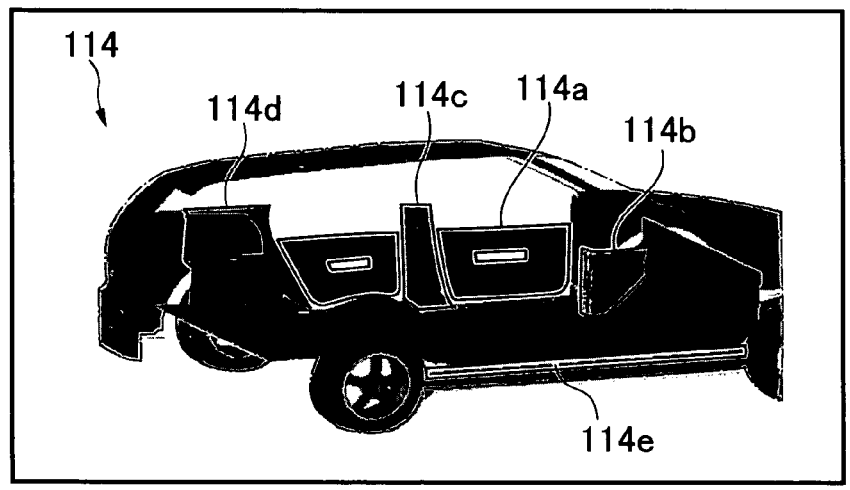
FIG. 8B is a diagram depicting an example of a lower interior model in an interior model according to an embodiment of the present invention.
Figure 9:
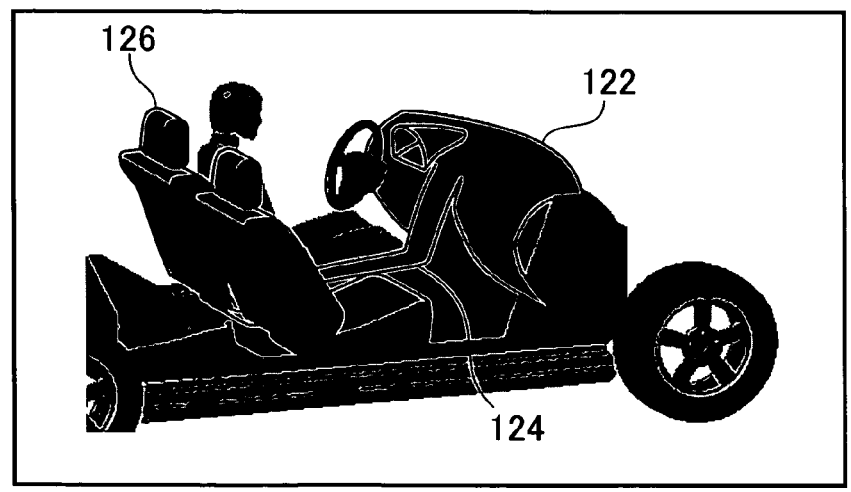
FIG. 9 is a diagram depicting an example of an instrument panel model, a console model, and a seat model in an interior part model according to an embodiment of the present invention.
Figure 10:
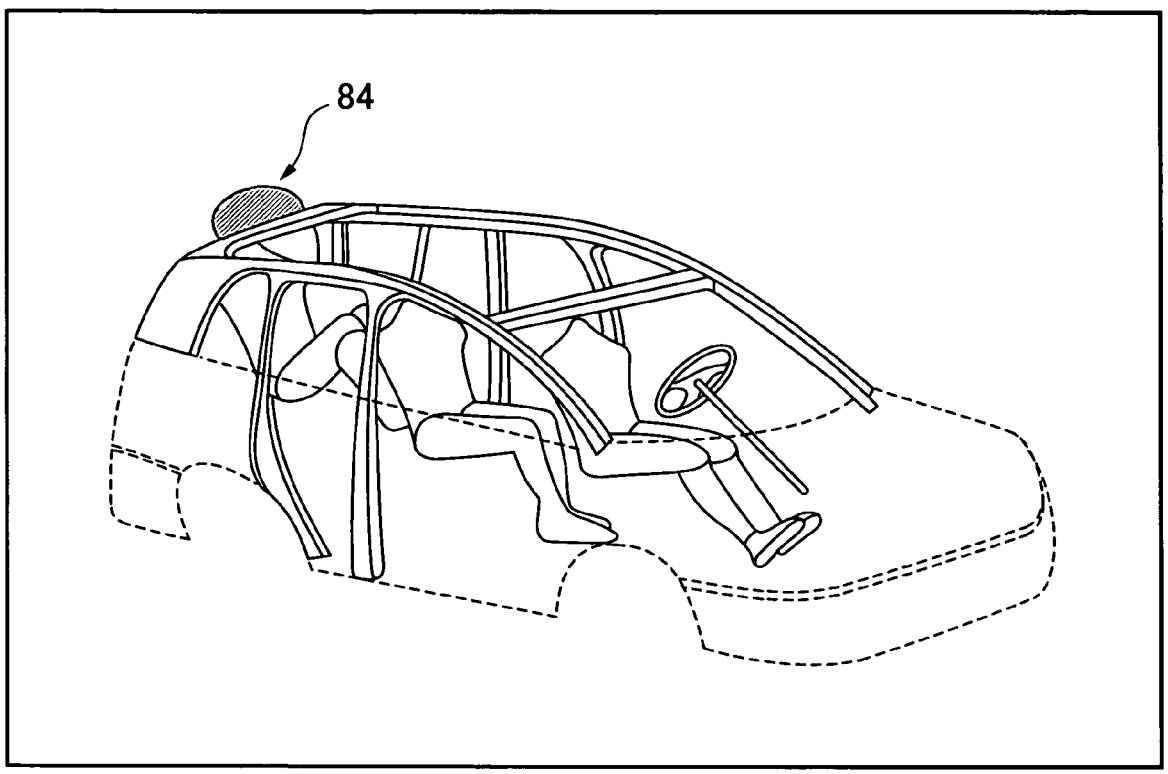
FIG. 10 is a diagram depicting an example of a vehicle model combining a passenger model, an external appearance model and an interior model according to an embodiment of the present invention.

Next, referring to FIGS. 4-10, we will explain the vehicle models. FIG. 4 is a diagram for explaining each of the models included in the vehicle models according to an embodiment of the present invention. FIG. 5 is a diagram depicting an example of a major dimension model (FIG. 5A), a passenger model (5B), and an underbody model (FIG. 5C) in a reference model according to an embodiment of the present invention. FIG. 6 is a diagram depicting an example of an exterior model in an external appearance model according to an embodiment of the present invention. FIG. 7 is a diagram depicting an example of door models (FIGS. 7A-7C) and a glass model (FIG. 7D) in an exterior appearance part model according to an embodiment of the present invention. FIG. 8 is a diagram depicting an example of an upper interior model (FIG. 8A) and a lower interior model (FIG. 8B) in an interior model according to an embodiment of the present invention. FIG. 9 is a diagram depicting an example of an instrument panel model, a console model, and a seat model in an interior part model according to an embodiment of the present invention. FIG. 10 is a diagram depicting an example of a vehicle model combining a passenger model, an external appearance model and an interior model according to an embodiment of the present invention.

First, referring to FIGS. 4 and 5, we will explain the reference model. As depicted in FIG. 4, the vehicle model includes a reference model 80; this reference model 80 includes a major dimension model 82, a passenger model 84, and an underbody model 86.

As depicted in FIG. 5A, the major dimension model 82 relates to an exterior frame 82a, ground (ground surface) 82b, wheels 82c, etc., and is prescribed by specifications such as vehicle outer frame dimensions, wheelbase length, wheel dimensions, etc.

As depicted in FIG. 5B, the passenger model 84 relates to a manikin 84a, a steering column 84b, a pedal 84c, and field of view conditions 84d, etc. As discussed below, a spatial area display (see FIGS. 30-36) depicting the range of passenger head movement and hand reach, etc. is also included in this model.

A passenger manikin 84a is used to consider passenger layout and posture; its shape and dimensions are fixed based on domestic and foreign standards. The passenger manikin 84a is prescribed by various dimensional and angular specifications to specify passenger layout and posture. The specifications include, for example, hip point position, head crown and heel position with respect to the hip point, distance between passengers in the front row and second row, etc. "Relative distance" between individual parts is also included in the word "dimension."

The steering column 84b and pedal 84c are used to consider the layout of these items relative to passengers; their shapes and dimensions are fixed. The steering column 84b and pedal 84c are prescribed by specifications for the relative distances and angles thereof with respect, for example, to the hip point and the heel. The field of view condition 84d is prescribed by specifications such as the vertical spreading angle from the eye point toward the front of the vehicle.

As depicted in FIG. 5C, the underbody model 86 relates to the understructure of the vehicle body; e.g. a dash panel 86a, a floor panel 86b, and a side sill 86c. The underbody model 86 is prescribed by specifications such as the respective dimensions and angles of the several panels which constitute the dash panel 86a and the floor panel 86b, the dimensions of the side sill 86c, etc.

Packaging of passenger layout, etc. or other basic vehicle specifications can be considered using the reference model 80, in which each of the models 82, 84, and 86 are combined, and each of the models constituting the reference model 80.

Next, referring to FIGS. 4 and 6, we will explain the external appearance model. As shown in FIG. 4, the vehicle model includes an external appearance model 90, and the external appearance model 90 includes an exterior model 92. As depicted in FIG. 6, the exterior model 92 relates to the exterior frame of the vehicle, including bumpers, hood, etc. The exterior model 92 is prescribed by various dimensional and angular specifications relating to the vehicle external shape. Specifications include, for example, the wheelbase, front overhang, rear overhang, cowl point position, rooftop height, pillar section angle of inclination, etc.

An external appearance model 90 of this type enables a consideration of the vehicle external appearance image and the like. Moreover, combining the external appearance model 90 with the reference model 80 enables a more detailed consideration of packaging aspects such as vehicle comfort, etc.

Next, referring to FIGS. 4 and 7, we will next explain the external appearance part model. As depicted in FIG. 4, the vehicle model includes an external appearance part model 100; this external appearance part model 100 includes a door model 102 and a glass model 104.

As depicted in FIG. 7A-7C, the door model 102 relates to front and rear door opening flanges 102a, front and rear side door exterior panels and sash 102b, and lift gate exterior panel and sash 102c. As depicted in FIGS. 7B-7D, the glass model 104 relates to the front windows, the front quarter windows, the side windows, the rear quarter windows, and the rear window. These models are prescribed by various dimensional and angular specifications relating to their respective shapes and layouts.

The shapes and layouts of the doors and window glass, etc. which constitute a portion of the external appearance can be individually considered using these models 102 and 104. Moreover, combining these models 102 and 104 with the external appearance model 90 enables a more detailed review of the vehicle external appearance image, etc.

Next, referring to FIGS. 4 and 8, we will explain the interior model. As depicted in FIG. 4, the vehicle model includes an interior model 110; this interior model 110 includes an upper interior model 112 and a lower interior model 114. As depicted in FIG. 8A, the upper interior model 112 relates to pillar trim 112a and top ceiling (roof header, roof rail, and roof trim) 112b. As depicted in FIG. 8B, the lower interior model 114 relates to front and rear door and lift gate trim 114a, cowl side trim 114b, B pillar lower trim 114c, rear side trim 114d, and scuff plate 114e. These models are prescribed by various dimensional and angular specifications for the shape and layout of each trim portion and the top ceiling, etc.

Combining the interior model 110 with the passenger model 84 and the external appearance model 90, etc., enables review of the relative distance between the passenger and the interior, the passenger's sense of constriction within the cabin, and the passenger's visibility of outside the cabin.

Next, referring to FIGS. 4 and 9, we explain the interior part model. As depicted in FIG. 4, the vehicle model includes an interior part model 120; the interior part model 120 includes an instrument panel model 122, a console model 124, and a seat model 126.

As depicted in FIG. 9, the instrument panel model 122, the console model 124, and the seat model 126 relate to an instrument panel including a dashboard, a console contiguous with this instrument panel, and a plurality of seats. These models are used to review the layout of those components within the cabin; their shape is fixed.

Instrument panel model 122 and console model 124 are prescribed by dimensional and angular specifications relating to their layout. The seat model 126 is prescribed by dimensional (distance) and angular specifications such as seat layout, seat width, headrest vertical position, seatback angle, etc.

The instrument panel 122 and console model 124 may be made to automatically deform in response to the layout so as to align with the interior model 110.

Using a model combining this interior part model 120 with the interior model 110 and a model combining the external appearance model 90 with the reference model 80 model enables consideration of the instrument panel, console, and seat layout, as well as the in-cabin sense of constriction and attractiveness.

The layout of each model depicted in FIG. 4 and explained above is prescribed by relative distance from a fixed reference position. Each model has such relative distances as specifications. Such fixed reference positions include, for example, a front-to-back reference point (for example, a cowl point), a ground, and a vehicle mid-plane (a plane passing midway through the vehicle width in the vehicle front-to-rear direction).

These vehicle models allow for individual consideration of overall vehicle size using the major dimension model 82, of internal space using the passenger model 84, of the external appearance image using the exterior model 92, etc. Therefore when the various models are combined, the passenger model 84 head may protrude from the roof, etc., as shown in FIG. 10; with an embodiment of the present invention, such interference states can be visually verified. The vehicle planner can view such interfering states and make adjustments such as lowering the hip point and reconsidering the vehicle external image, etc.

In the past, such vehicle planning could require time-consuming redrafting, or pre-determination of higher roof heights to avoid protrusion of the passenger head portion from the roof, leading to more conservative tendencies in vehicle planning. Using the present invention embodiment, on the other hand, allows for vehicle planning with which shape changes can be easily implemented on a screen, thus allowing for easy re-evaluation of each model even if, as shown in FIG. 10, the head portion protrudes. Also, by using a flat screen 26 such as that shown in FIG. 2, vehicle planning can be advanced as multiple vehicle planners carry on discussions between themselves.

Thus, using the vehicle planning support system 1 according to an embodiment of the present invention, vehicle planning can be effected using methods with a high degree of freedom, not bound by previous fixed ideas, and completely different from conventional vehicle planning approaches. Vehicles can therefore be planned with new external appearance images based on free thinking, or with interior space which passengers will perceive as the most comfortable.

Next, referring to FIG. 3, we will explain the vehicle data stored in the basic database 60, the external appearance database 62, the external appearance parts data base 64, the interior parts database 66, and the interior parts data base 68.

The vehicle data stored in these databases is data forming a template when the vehicle model data (data used to display the model on a morphing screen) is generated. In other words, vehicle data is data which describes vehicle shape, passenger posture, etc. using vehicle-related dimensional or angular specifications as parameters (variables). The rule data described below are included in this vehicle data.

Vehicle model generated based on such vehicle data becomes a so-called dimension driven model; when dimensions or angles change, each portion of the vehicle deforms accordingly, or the arrangement of passengers, etc. is changed accordingly.

The major dimension data, passenger data, and underbody data which form the reference data are stored in the basic database 60 as vehicle data. Exterior data, which forms the external appearance data, is stored in the external appearance database 62. The door data and glass data which form the external appearance parts data are stored in the external appearance parts data base 64. The upper interior data and lower interior data which form the interior data are stored in the interior parts database 66. The instrument panel data, console data, and seat data which form the interior parts data are stored in the interior parts database 68. A plurality of vehicle data corresponding to the vehicle basic constitution (vehicle type, pillar configuration, seat layout) are stored in each of the databases 60, 62, 64, 66, and 68.

Next we will explain the rule data included in the vehicle data. Rule data includes data which correlates between specifications and maintains compatibility between the shapes and arrangements of various parts of the vehicle. Using such data, changing the roof length, for example, of the exterior model 92 which displays exterior appearance causes the angle of the pillar portion to be changed in tandem so as to maintain a connection with the roof. Moreover, the length of the top ceiling (the ceiling lining) in the upper interior model 112, which displays the vehicle interior, is also changed. Such a roof is set up to be different for each vehicle type, such as minivan, sedan, etc. For example, if the front roof edge is pushed back toward the rear, the hood(bonnet) is extended rearward in a minivan while the roof pillar angle is maintained as is, whereas in a sports-type of vehicle the front pillar angle of inclination is decreased.

In an embodiment of the present invention, the "vehicle model" refers to all of the vehicle models 80-126 shown in FIG. 4. Also, "vehicle data" and "vehicle model data" refer to all of the respective data corresponding to each of the vehicle models 80-126. Displaying of a vehicle model includes either the displaying of each of the models 80-126 shown in FIG. 4, or displaying a combination of several of those models, or displaying a combination of all of those models.

Figure 12:
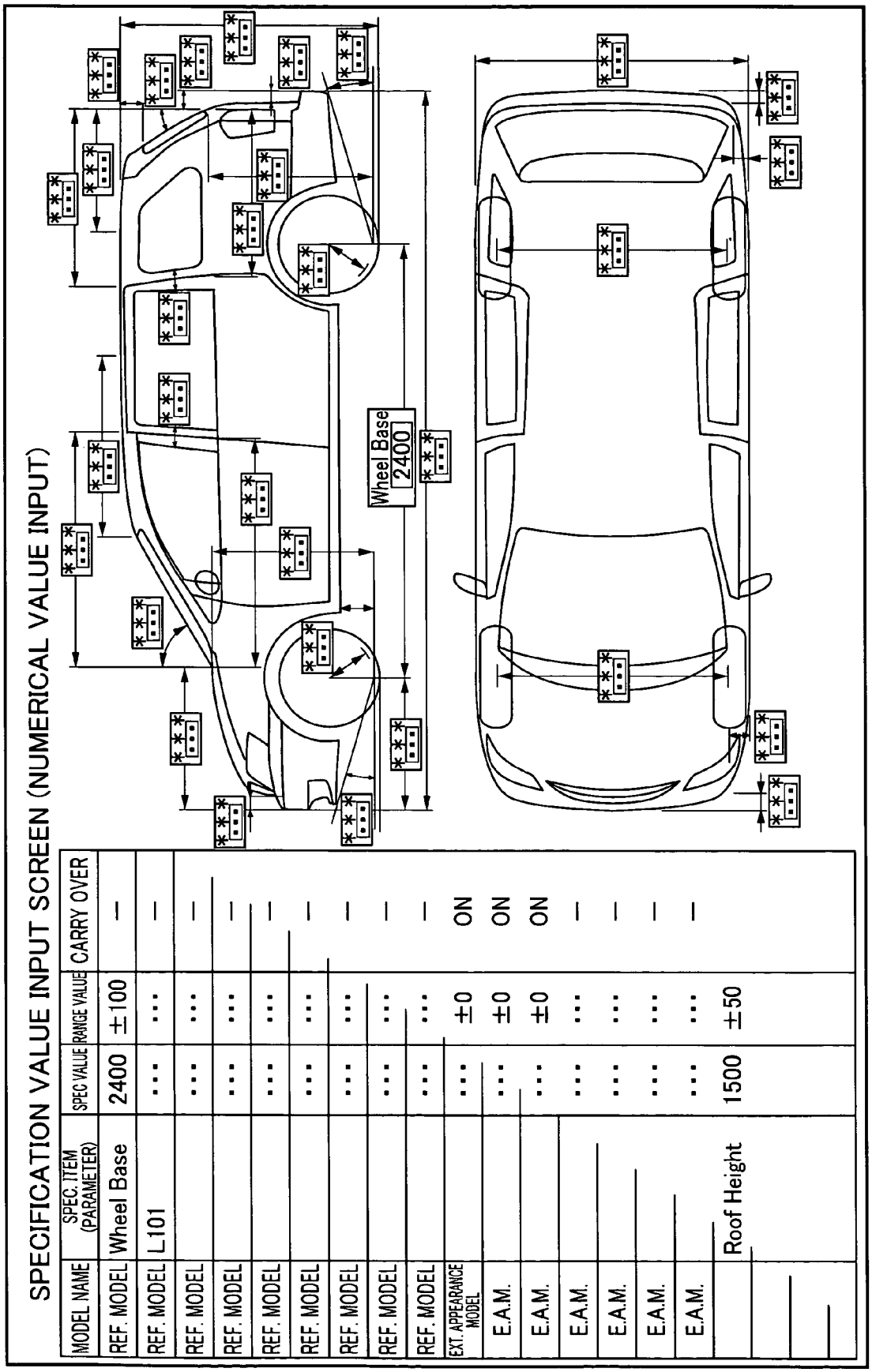
FIG. 12 is a diagram depicting a numerical value input screen of a specification value input screen according to an embodiment of the present invention.

Next, referring to FIGS. 11 and 12, we will explain the function of the specification value input program 36 and the specification value input screen. FIG. 11 is a diagram depicting the initial screen of a specification value input screen according to an embodiment of the present invention. FIG. 12 is a diagram depicting a numerical value input screen of a specification value input screen according to an embodiment of the present invention.

The specification value input program 36 (see FIG. 3) causes a specification value input screen such as that shown in FIGS. 11 and 12 to be displayed, and has the function of generating specification value data from the input specification values.

First, as shown in FIG. 11, items relating to basic vehicle configuration are displayed on the specification value input screen initial screen. These items are determined by a selection on the part of the vehicle planner of a vehicle type (hatchback, sedan, minivan, sport, convertible, truck, etc.), a pillar configuration from among several prepared in accordance with each vehicle type (number of pillars and position thereof, etc.), and a seat layout (1 row, 2 rows, 3 rows, etc.) from among several respective types of each.

The initial screen depicted in FIG. 11 displays items relating to reading in of specifications, thus enabling the vehicle planner to select the vehicle used as a base (the base vehicle) to be deformed in the course of vehicle planning. When a specific vehicle is selected ("Vehicle A" here), specification values for that vehicle are read out all together from the benchmark vehicle database 70 (see FIG. 3), and are read in all together to the specification input table shown in FIG. 12.

Next, as shown in FIG. 12, the specification input table and the vehicle side views and plan views depicting parts corresponding to each of the specification items are displayed on the specification value input screen numerical value input screen. The input table comprises a column showing the vehicle model name ("Basic Model," etc.), a specification item column showing parameter names corresponding to each specification item (names such as "Wheel Base" or ID codes such as "L101"), a specification input column for inputting specific values ("2400," etc.) as specifications corresponding to each of those specification items, a range input column for inputting a predetermined specification range (a range of numerical values such as "±100," and a carryover indication column (displaying "ON" etc.).

Using a numerical value input screen of this type, specification values are set when the vehicle planner inputs or changes specification values corresponding to each of model specification item. In cases where shared specification values are used for each of the vehicle models, the numerical values input with respect to any one of the vehicles are also reflected in the numerical values for the other models. The vehicle planner can change specification values on this numerical value input screen, or he can change specification values by deforming on a morphing screen using read-in specification values as is.

When vehicle type, specification values, etc. are set using this type of specification value input screen, specification value data are generated which include data for the set vehicle type, etc., and listed data in which the specification values are correlated to the respective specification items (parameters).

Next we will explain the generation of vehicle model data by the vehicle model data generating program 38. Each of the model data generating programs 46, 48, 50, 52, and 54 (see FIG. 3) included in the vehicle model data generating program 38 has the function of generating vehicle model data (data used to display the vehicle on a morphing screen) based on specification value data generated by the specification value input program 36, and on the vehicle data (vehicle model templates) stored in each of the databases 60, 62, 64, 66, and 68.

Specifically, specification value data is first read in by each of the programs 46, 48, 50, 52, and 54. Next, based on information about basic structure, such as the vehicle type, etc. included in the specification value data, vehicle data corresponding to the relevant vehicle type is read out of the each of the databases 60, 62, 64, 66, and 68. Next, specification value data specification values are substituted for this read-in vehicle data to generate vehicle model data.

Vehicle model data includes basic model data (major dimension model data, passenger model data, and underbody model data), external appearance model data (exterior model data), external appearance part model data (door model data and glass model data), interior model data (upper interior model data and lower interior model data), and interior part model data (instrument panel model data, console model data, and seat model data).

Here, as will be discussed below, the 3D morphing screen displays a vehicle model (3D vehicle model) incorporating all of the specification values included in the specification value data and all of the rule data included in the vehicle data. The 2D morphing screen, on the other hand, displays a vehicle model (2D vehicle model) incorporating only predetermined sections viewed from the vehicle side, plan, and front, and specification values related to the main. There is also less incorporated rule data.

In order to effectively use each respective morphing screen, the number of specifications which can be changed by dragging or by numerical value input is set to be low on the 3D morphing screen, and to be high on the 2D morphing screen.

Therefore in the vehicle model data generating program 38, the 3D vehicle model data for morphing and the 2D vehicle model data for morphing are respectively generated according to the morphing screen used for display.

Figure 13:
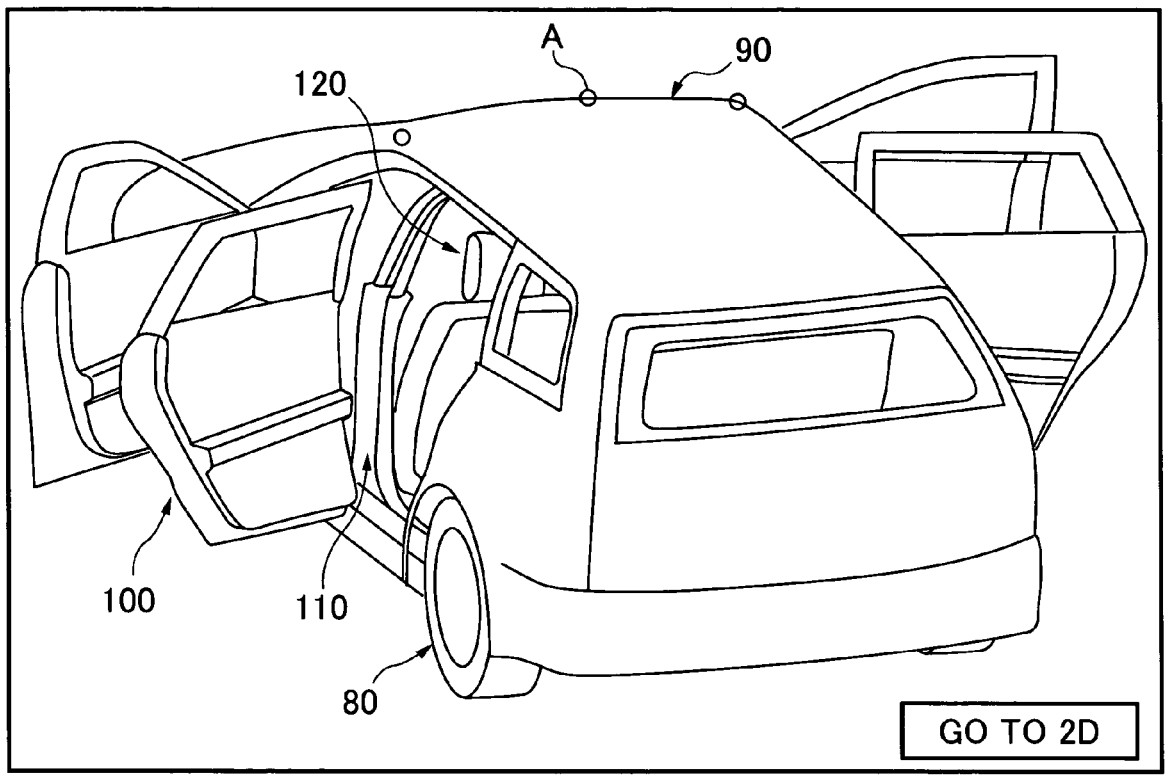
FIG. 13 is an example of a 3D morphing screen showing a vehicle model according to an embodiment of the present invention.
Figure 14:
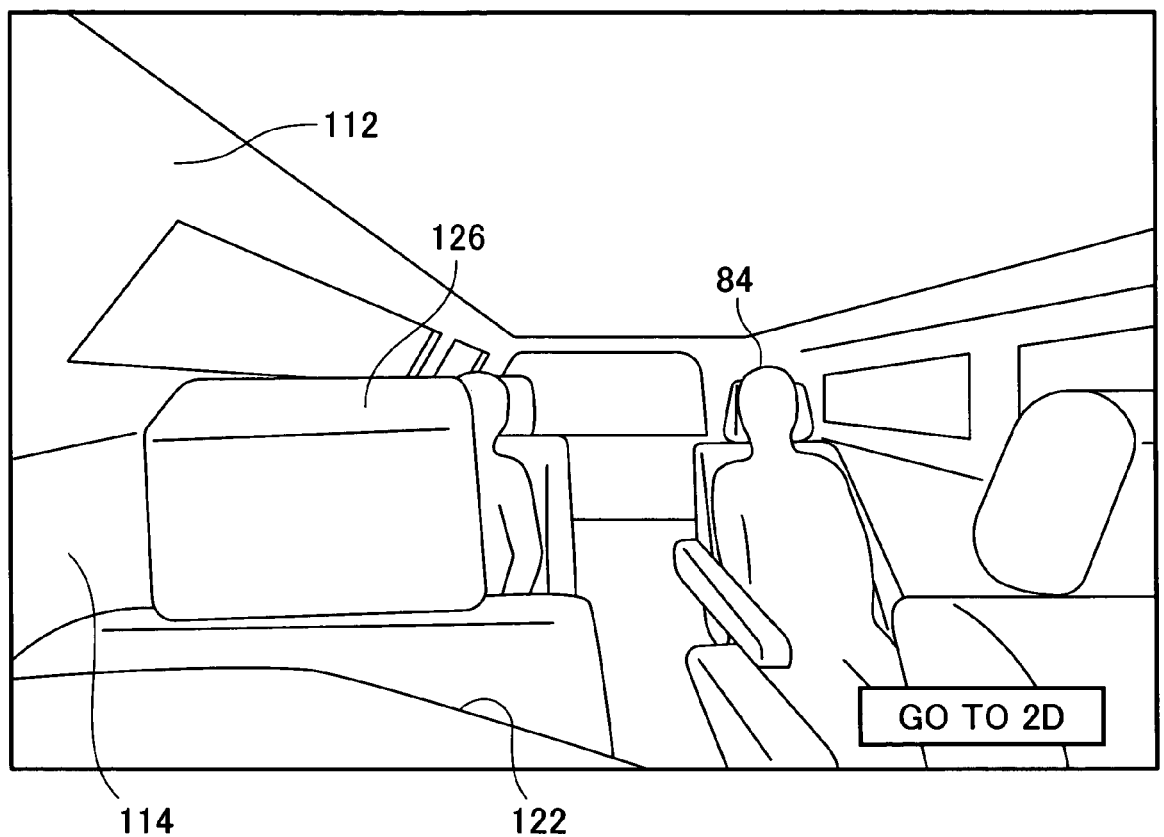
FIG. 14 is an example of a 3D morphing screen showing a cabin interior in a vehicle model according to an embodiment of the present invention.

Next, referring to FIG. 13 and FIG. 14, we will explain the function of the 3D morphing screen display program 58 and of the 3D morphing screen. FIG. 13 is an example of a 3D morphing screen for displaying a vehicle model according to an embodiment of the present invention. FIG. 14 is an example of a 3D morphing screen for displaying a vehicle interior in a vehicle model according to an embodiment of the present invention.

As shown in FIG. 13, the 3D morphing screen display program 58 has the function, based on the vehicle model data for 3D morphing generated by the vehicle model data generating program 38, of displaying a 3D form in which a vehicle model is seen from any desired viewpoint to create a perception of distance which accords with that viewpoint.

Each vehicle model (external appearance model 90, passenger model 84, etc.) can be optionally combined or individually displayed on this 3D morphing screen (see FIGS. 5-9).

Also, as shown in FIG. 14, by taking a section in the vehicle width direction of a model combining each of the models, it is also possible to display the cabin interior appearance for the passenger model 84, the interior models 112 and 114, and the interior part models 122 and 126. Each model is displayed in superimposition or overlay, using the aforementioned predetermined reference position as a reference point.

Next, as depicted in FIG. 13, the shape and layout of each portion of the vehicle model can be changed by dragging the specification points which form the starting points for each dimension and angle indicated by the circle "A" in the diagram (only a portion is shown). Specification values after this dragging are automatically calculated and reflected in the specification point data.

Vehicle models displayed on this 3D morphing screen are displayed with all specification values reflected in order to display a 3D form, and with all rule data correlating specifications to one another incorporated for display in order to preserve shape and layout consistency when the model is deformed. Therefore when a given specification point is dragged using the mouse, the dimension, angle, etc. which use that specification as a starting point are changed, while all other related dimensions and angles with rules are changed together therewith.

Using a 3D morphing screen, the vehicle shape can be can thus be intuitively deformed using the 3D form just as it one sees it, making it easier to grasp the overall image of a vehicle shape during vehicle planning. Therefore by using the 3D morphing screen the vehicle planner can variously deform the vehicle shape using his senses, while looking at a 3D image of the vehicle, and can thus plan previously non-existent, distinctive vehicles using his or her free imagination.

At the same time, shapes are displayed three-dimensionally the 3D morphing screen, which is therefore not suited to displaying dimension lines and directly numerically inputting specification values such as dimensions or angles. There are also cases in which it may be difficult to determine which specification point should be dragged if one wishes to change the shape of an individual portion (for example, the roof). Also, even if the roof shape is changed, this approach may be inconvenient for making a detailed evaluation of the curve described by the roof.

In such cases, as will be described below, an embodiment of the present invention enables the vehicle planner to make use of a 2D morphing screen in order to effectively advance vehicle planning.

Next we will explain the 2D morphing screen display program 56 function and the 2D morphing screen.

Figure 15A:
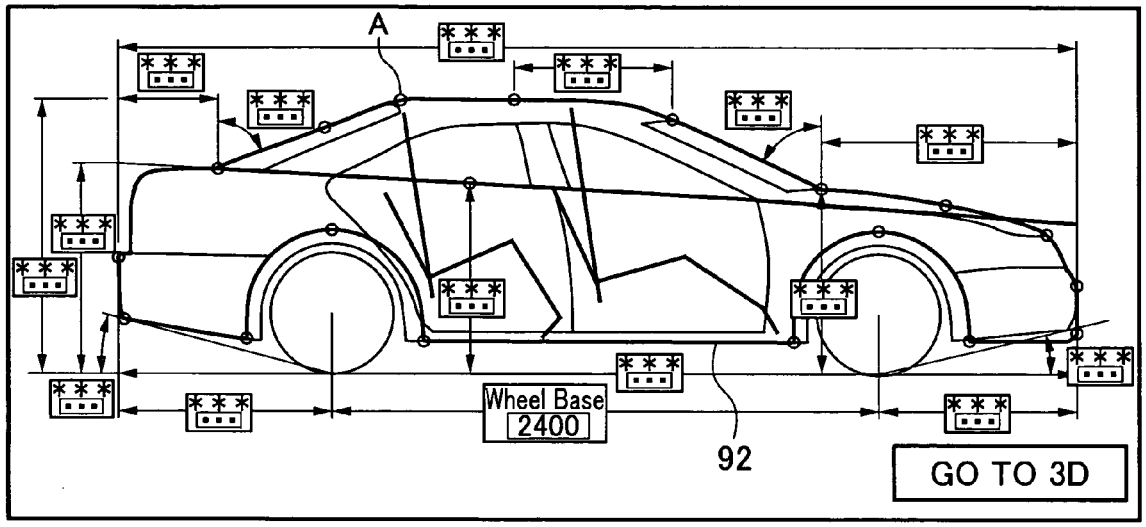
FIG. 15A is an example of a 2D morphing screen showing a vehicle model according to an embodiment of the present invention.
Figure 15B:
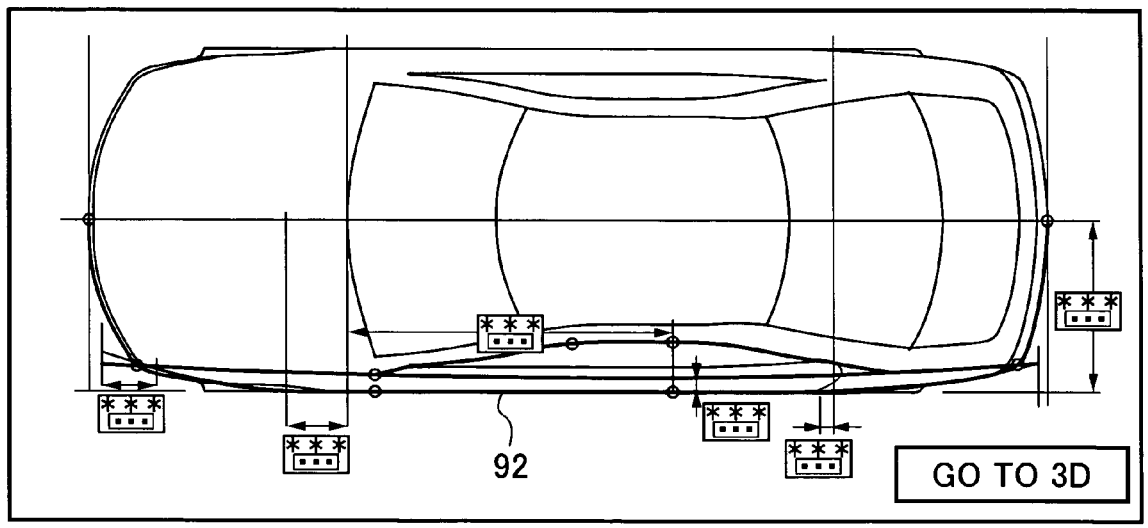
FIG. 15B is an example of a 2D morphing screen plan view display showing a vehicle model according to an embodiment of the present invention.
Figure 15C:
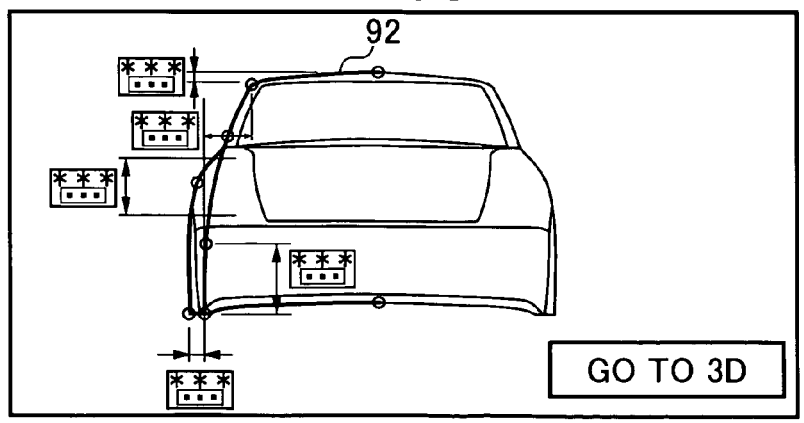
FIG. 15C is an example of a 2D morphing screen front view display showing a vehicle model according to an embodiment of the present invention.
Figure 16:
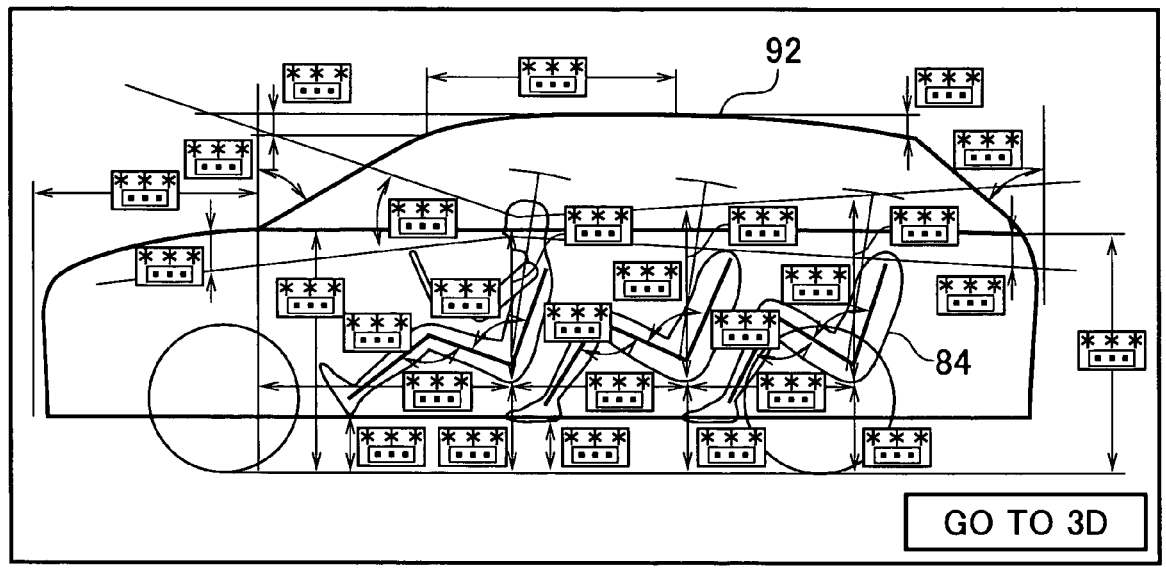
FIG. 16 is another example of a 2D morphing screen side view display according to an embodiment of the present invention.
Figure 17:
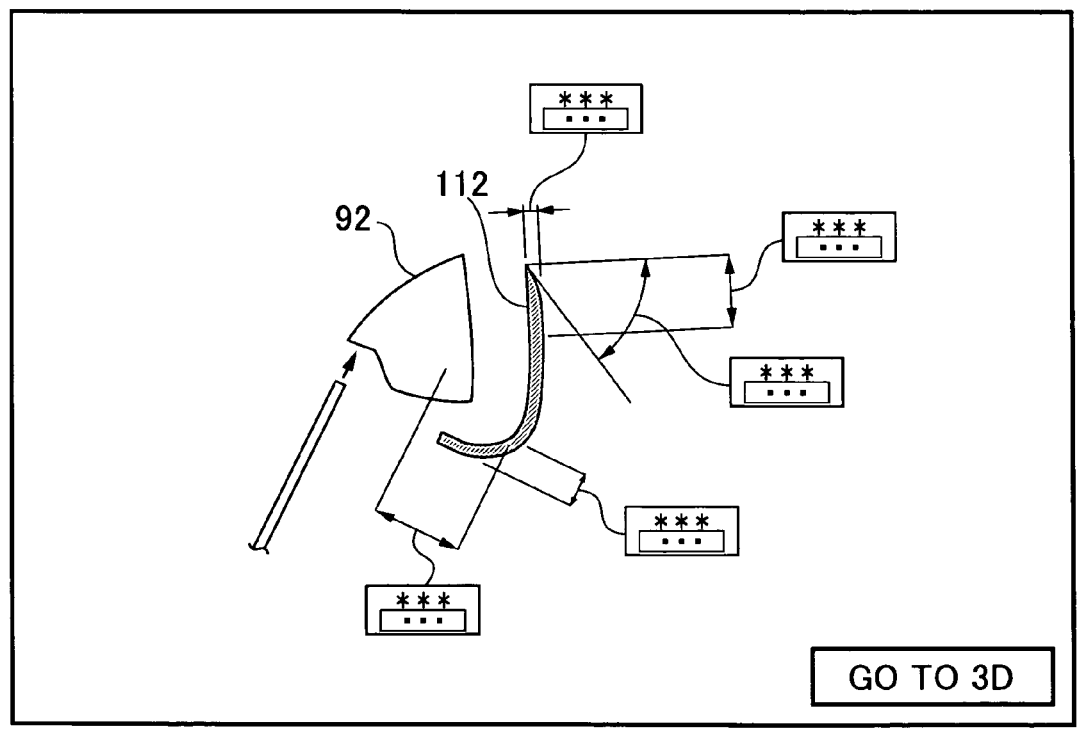
FIG. 17 is an example of a 2D morphing screen sectional view display for showing a section of a pillar portion in a vehicle model according to an embodiment of the present invention.

First, referring to FIGS. 15-17, we will explain the types of 2D morphing screen and the content of vehicle models displayed thereon. FIG. 15 is an example of a side view display (FIG. 15A), a plan view display (FIG. 15B), and a front view display (FIG. 15C) of a 2D morphing screen displaying a vehicle model according to an embodiment of the present invention. FIG. 16 is another example of a side view display of a 2D morphing screen displaying a vehicle model according to an embodiment of the present invention. FIG. 17 is an example of a 2D morphing screen depicting a section of a pillar portion of a vehicle model according to an embodiment of the present invention.

The 2D morphing screen display program 56 (see FIG. 3) has the function of displaying a vehicle model based on vehicle model data for 2D morphing generated in the vehicle model data generating program 38.

The vehicle model is displayed, as shown in FIGS. 15 and 16, in a 3-view display consisting of a side view, plan view, and front view (or rear view) (side view displays: FIG. 15A, FIG. 16; plan view display: FIG. 15B; front view display: FIG. 15C), and, as shown in FIG. 17, in a sectional display depicting sections of constituent portions such as the pillar and door. Each of these side view, plan view, front view, and section view displays can be lined up adjacently or individually selected for display.

In these 2D morphing screens, predetermined sections and major shapes of the vehicle are displayed with straight and curved lines (morphing shape display). Moreover, specification items, specification values, and the dimension lines which prescribe these are displayed for shapes displayed in the morphing shape display (specification value display).

For example, as shown by the heavy lines in FIG. 15A, the shape of the vehicle mid-plane section (the shape of the roof, the cowl, etc.) and major shapes characterizing the side view shape (for example, the beltline shape) are displayed in the morphing shape display within the side view display. Specification items (displayed in the figure as "Wheel Base," and "***"), specification values (displayed as "2400," and "•••" in the figure), and dimension lines are displayed within the specification value display.

In FIG. 15A, the morphing display is displayed for the exterior model 92; other models are omitted. Such items as a surface image of the exterior model 92 exterior panels, and images and lines depicting the layout and posture of passenger models 84, are displayed along with the above type of morphing shape display, etc.

As shown by the heavy lines in FIGS. 15B and 15C, the morphing display and specification value display of the sectional and major shapes which enable characterization of the external shape when the vehicle is viewed in plan view or front view are displayed in a manner similar to the plan view display and the front view display. Furthermore, an image of the surface shape of the exterior panels is also displayed.

In the 2D morphing screen side view display shown in FIG. 16, a morphing shape display and specification value display are displayed for the exterior model 92 and the passenger model 84. Display of images of the surface shape of the exterior model 92 exterior panels is omitted. Vehicle exterior shape and passenger layout can be considered in the side view display shown in FIG. 16.

As shown in FIGS. 15 and 16, the vehicle planner can, in accordance with his or her objective, freely select models for morphing shape display as well as models for reference, and can display images thereof. Such 2D morphing screens permit consideration of vehicle shape and major dimensions, etc. while referring, for example, to images of the passenger layout and exterior panels.

Next, as shown in FIG. 17, the aforementioned morphing shape and specification value displays can also be displayed for sectional views. In the sectional view display, what is displayed as the sectional shape of the pillar portion is a combination of primarily the exterior model 92 and the upper interior model 112. The sectional view display can display sections of other major portions of the vehicle.

Next, referring to FIGS. 15-17, we will explain the methods and rules applied when deforming and changing the layout of individual portions of the vehicle model on the 2D morphing screen.

As shown in FIGS. 15-17, numerical value input of displayed specification values ("•••") is possible by selection on the screen. The shape and layout of individual portions of the vehicle model can implemented by changing these specification value inputs. Therefore vehicle planners can advance their work by observing the shape of the vehicle model after it is deformed with each new specification input.

With the 2D morphing screen, as with the 3D morphing screen shown in FIG. 13, circled specification points such as those shown in FIG. 15A can also be displayed and morphed by dragging. These specification points displayed on the 2D morphing screen can be displayed for all of the applied specification values (only a portion is shown in the figure).

The aforementioned specification values, changed by numerical value input or dragging, are reflected in the specification value data.

The aforementioned rule data are minimally built into the 2D morphing vehicle models. These minimally applied rules include rules established to prevent major collapse of the vehicle shape, such as those used to maintain a connection between the pillar and the roof, and rules which correlate such items as hip points and seat positions which necessarily must be changed.

Therefore the vehicle planner can basically change individual dimensions and angles relating to portions he or she wishes to change without being bound by rules. By so doing, the vehicle planner can steadily advance the vehicle shape while verifying each change to the shape as it is made.

Seasoned professionals are often accustomed to design drawings expressed in three views, and there are cases in which it is easier to grasp vehicle external appearance, etc. using a 2D, three view display than with a 3D display. With the 2D morphing screen, the vehicle model can be viewed using three view displays similar to conventional design drawings, making it easy to grasp the vehicle model shape in a concrete rather than a sensory manner. Therefore a seasoned professional accustomed to conventional design drawings, for example, can easily form the shape of a vehicle model he wishes to plan with drawings based on shapes and numerical values he or she may imagine by drawing on experience. By using the 2D morphing screen, the vehicle planner can thus take advantage of experience gained as a seasoned professional, effectively advancing the vehicle planning process.

Vehicle models displayed using the 2D morphing screen include only specification values relating to predetermined sections and major shapes; there is less data prescribing the vehicle than with vehicle models displayed on a 3D morphing screen. Also, as noted above, rule data is minimally included. Therefore calculation time is short with the 2D morphing screen, and vehicle planning can be efficiently advanced while updating shapes in real time.

Figure 18:
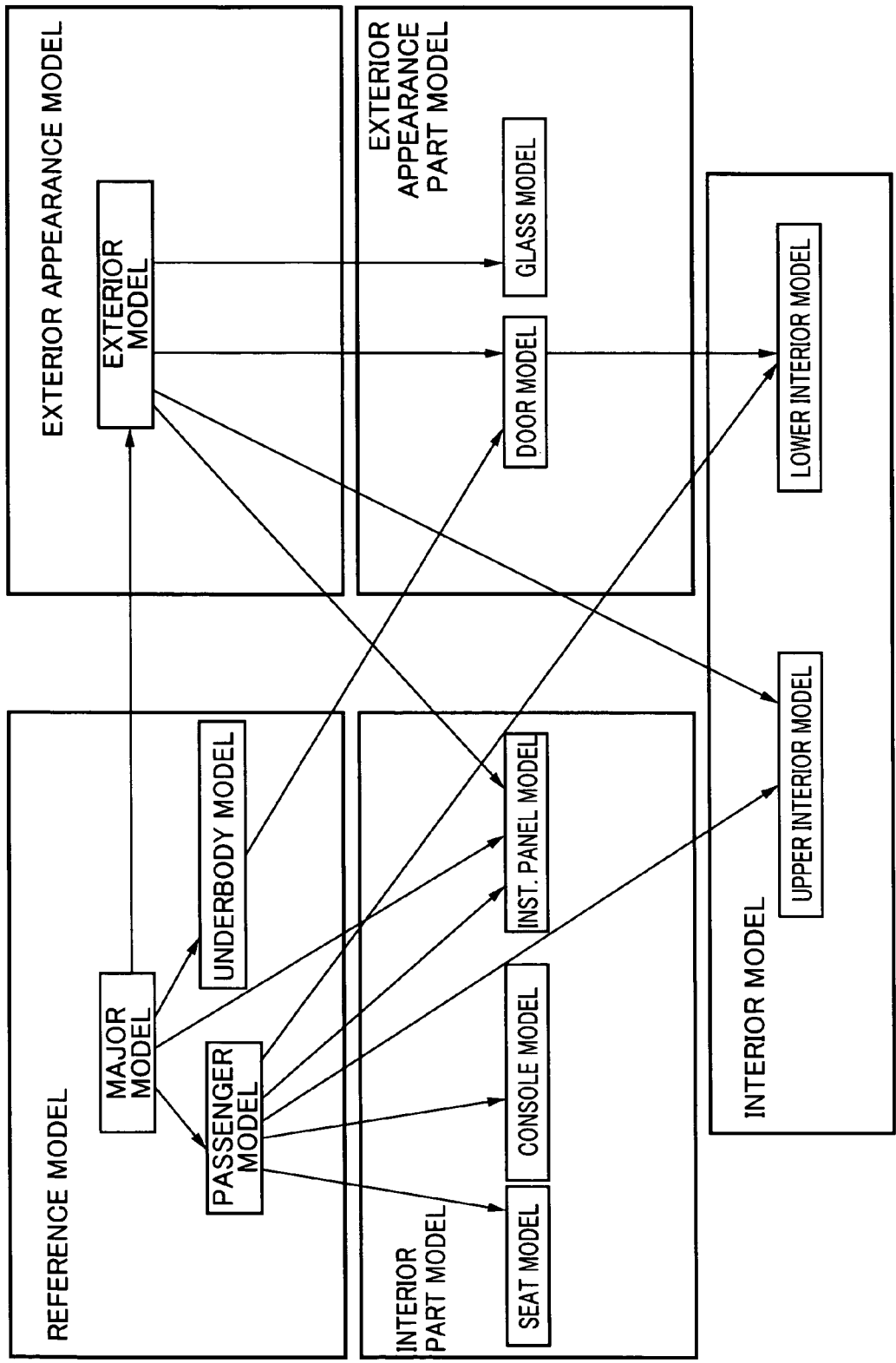
FIG. 18 is a diagram to explain the master-slave relationship of rules applied to a vehicle model according to an embodiment of the present invention.

Next, referring to FIG. 18, we will explain the application of rules between individual models on the 3D morphing screen and the 2D morphing screen. FIG. 18 is a diagram explaining the master-slave relationship of rules applied between individual models according to an embodiment of the present invention.

First, referring to FIG. 18, we will explain the master-slave relationship of rules applied between individual vehicle models. In order to effectively and efficiently advance vehicle planning, the aforementioned rule data includes data which determines master-slave relationships between individual models. The arrows indicate master-slave relationships; the models at the starting end of the arrow are higher order models and those at the endpoints are lower order models. In morphing screens described below, when the upper level model specification values are changed, the lower level model specification values associated with those changed specification values are also changed in tandem therewith, and the changed shape is displayed. For example, when the wheelbase in the major dimension model 82 is changed, each of the specification values affected by the change in wheel base in the lower order models, such as the passenger model 84 and the exterior model 92, are changed, such as the distance from the dash panel to the passengers or the distance between the front and back wheel arches.

On the other hand, when there are changes in the specification values of the lower order models, the specification values for the higher level models do not change in tandem therewith. The specification values also do not change between models for which no master-slave relationship is established. For example, even if the passenger layout in the passenger model 84 is changed, individual specification values such as the wheelbase in the major dimension model 82 will not change, nor will individual specification values for the exterior model 92.

When undertaking to plan a vehicle with emphasis on the vehicle's exterior appearance, for example, such master-slave relationships make it possible to consider the vehicle exterior appearance image using the exterior model 92, without being bound by limitations such as the vehicle's overall size (major dimension model 82) and interior space (passenger model 84). Conversely, interior space can be considered with a free imagination, unrestricted by external appearance. Establishing this type of master-slave relationship allows for efficient advancement of vehicle planning work.

Next we will explain the rule data which determine the positional relationships for each vehicle model with respect to the passenger model 84. The aforementioned rule data includes data which records the positional relationship between each model with respect to the passenger model 84.

First, a rule is established whereby when the passenger model 84 hip point specification value is changed between the passenger model 84 and the seat model 126, the specification value relating to the seat model 126 position changes in tandem therewith, and the seat model 126 is positioned so as to match the changed hip point. Vehicle planner convenience is thus improved, as there is no need to separately change the specification values which necessarily must be changed from a design standpoint.

A rule is established between the passenger model 84, the instrument panel 122, and the lower interior model 114 whereby when the specification value of the passenger model 84 hip point (the height from the ground) is changed, the specification values relating to the height from the ground of the instrument panel (instrument panel 122) and the door rim (lower interior model 114) also change in tandem therewith, and the instrument panel and door trim assumes a predetermined reference position. In an embodiment of the present invention, the predetermined reference position is set so as not to detract from the visual appearance of the instrument panel or the door trim (including the sense of constriction or freedom, etc.).

When the relative positional relationship between the hip point and interior parts is essentially uniquely determined for reasons of appearance, etc., the vehicle planner's convenience is improved by not having to change individual specification values. Interior parts may also be moved in tandem with the eye point rather than the hip point.

Here, the allowable range over which the seat model 126, the instrument panel 122, and the lower interior model 114 can be moved in tandem is determined. This allowable range is determined for the seat model 126 by a minimum position at which the parts attached to the floor or seat cushions can be placed, and by a fixed maximum position relative to the floor. In the instrument panel 122 and the lower interior model 114, the allowable range is determined by a fixed minimum position relative to the floor, and by a maximum position not to surpass the cowl line, the belt line, etc.

In the embodiment of the present invention, when such allowable ranges are surpassed, the instrument panel 122 and the lower interior model 114 are changed to the center position of that allowable range. It is therefore possible to visually verify the center position which will serve as the layout reference point, thus enabling the prevention of large mistakes at the vehicle planning stage.

On the other hand, the passenger model 84 hip point is not changed even if the seat model 126 layout is changed. In other words, the passenger model 84 is included in the reference model 80 and reflects basic vehicle packaging such as visual range conditions, position of passengers in the interior space, etc., so that the vehicle planner adjusts these separately. There are also cases in which it is better for safety or other reasons for the item such as the brake pedal or the steering wheel not to be automatically moved in tandem, so that these are not changed in tandem even if the hip point is changed, but are separately adjusted by the vehicle planner.

When the layout of the instrument panel or door trim is changed, the shapes thereof are deformed in tandem so as to match the interior around other pillars or the cowl side trim (lower interior model 114) and console model 124.

Figure 19:
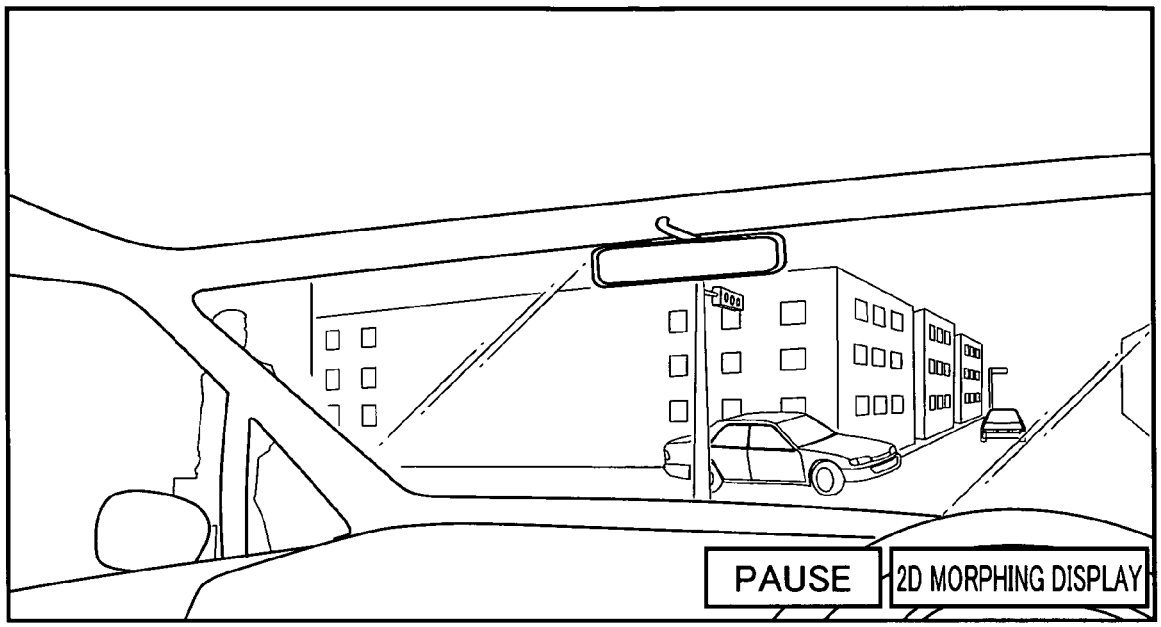
FIG. 19 is an example of an image displayed by a simulation image display program according to an embodiment of the present invention; it depicts an image seen from the viewpoint of a driver of a vehicle model running on a virtual road.

Next, referring to FIG. 19, we will explain the function of the simulation image display program 44. FIG. 19 is an example of an image displayed using a simulation image display program according to an embodiment of the present invention; it is a diagram depicting an image of the appearance of driving on a virtual road as seen from the viewpoint of a driver.

The simulation image display program 44 (see FIG. 3) replaces the vehicle model with simple numerical value data (3D coordinate data) and, as shown in FIG. 19, has the function of displaying an image of this simulated vehicle driving on a virtual road in virtual space.

The simulation image display program 44 also has the function of displaying images seen from the vantage point of the driver (eye point EP) set up in the passenger model 84, and images of the simulated vehicle when driving, as seen from a predetermined vantage point outside the vehicle. Using such images, the vehicle planner is able to perform an evaluation relating to visibility, sense of constriction, etc., and of the exterior appearance of the vehicle as it travels. The vehicle planner can select a virtual space through which to drive the vehicle model from a virtual space database 74 included on the database server 4. The simulation image display program 44 also has the function of displaying the planned vehicle and a benchmark vehicle so that they drive adjacently in a virtual space, to display superimpositions in which both vehicles are in the same position but one is semi-transparent, and has the function of placing two screens displaying the same virtual space adjacent to one another and running the vehicle on each at the same time.

Next we will add an explanation of the of the functionality of the planning support program 30 along with an explanation of an example of processing using the vehicle planning support system according to an embodiment of the present invention. In the following explanation "S" indicates "step."

Figure 20:
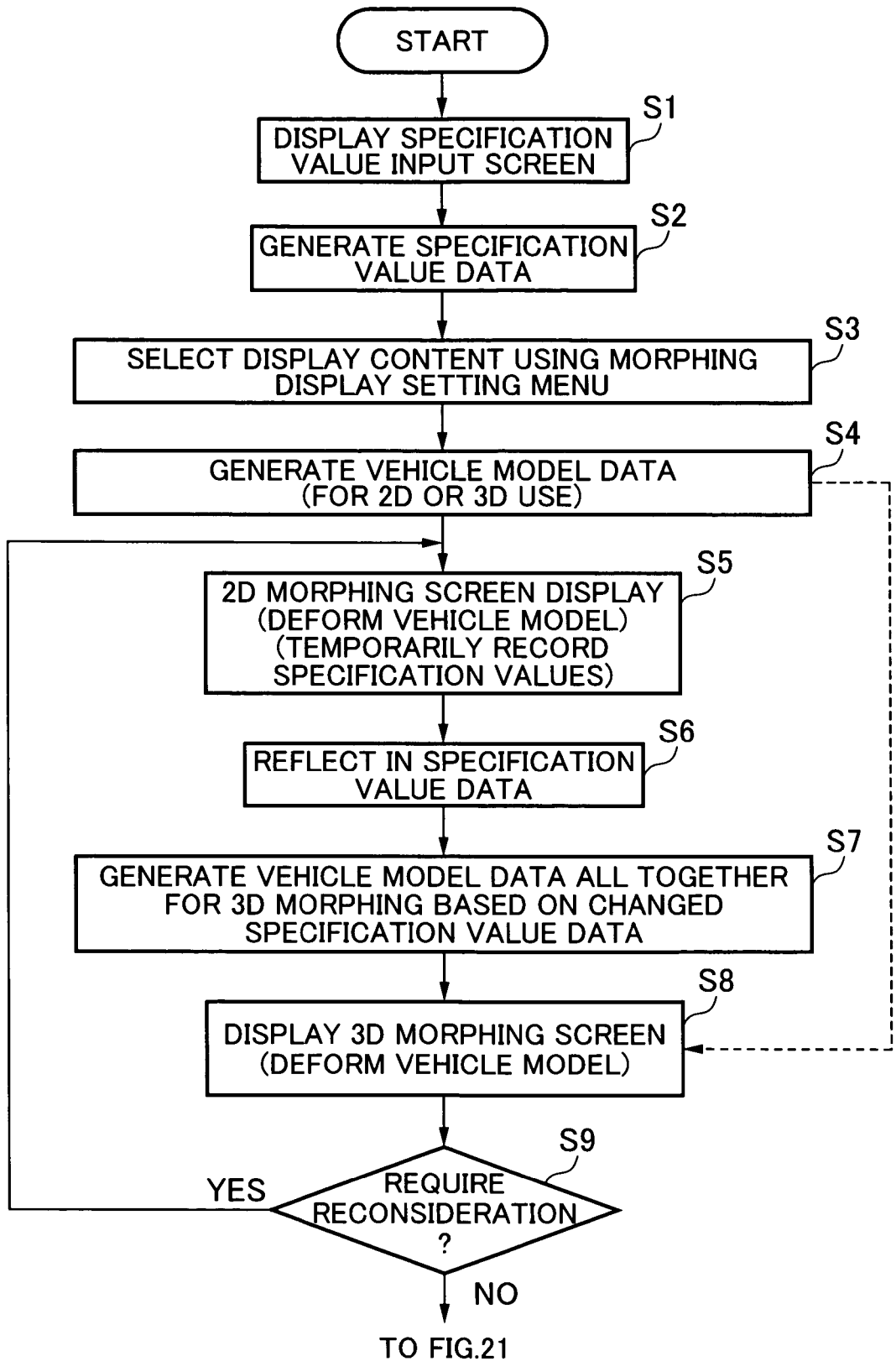
FIG. 20 is the first half of a flowchart depicting an example of processing by a vehicle planning support system according to an embodiment of the present invention.
Figure 21:
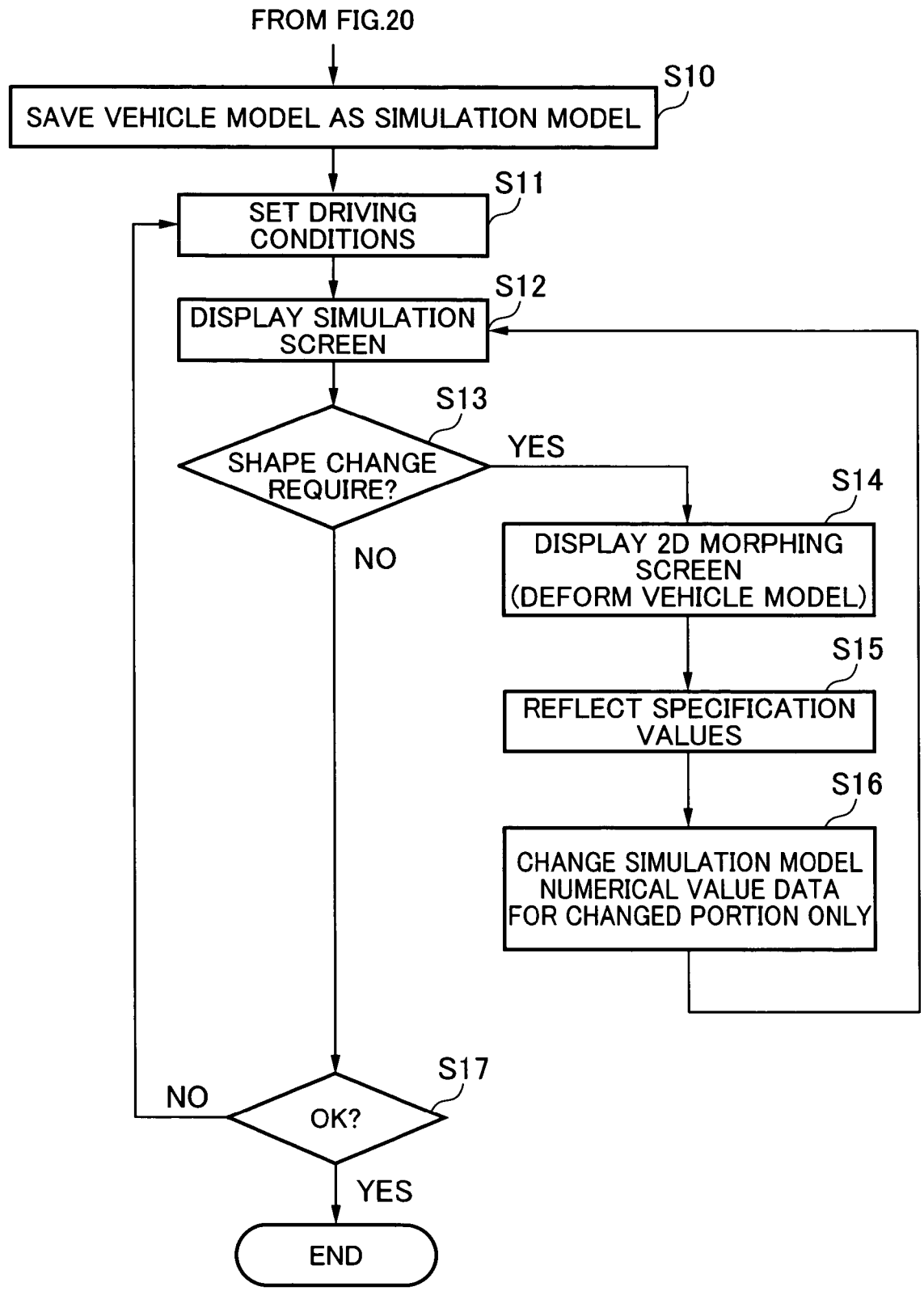
FIG. 21 is the second half of a flowchart depicting an example of processing by a vehicle planning support system according to an embodiment of the present invention.
Figure 23:
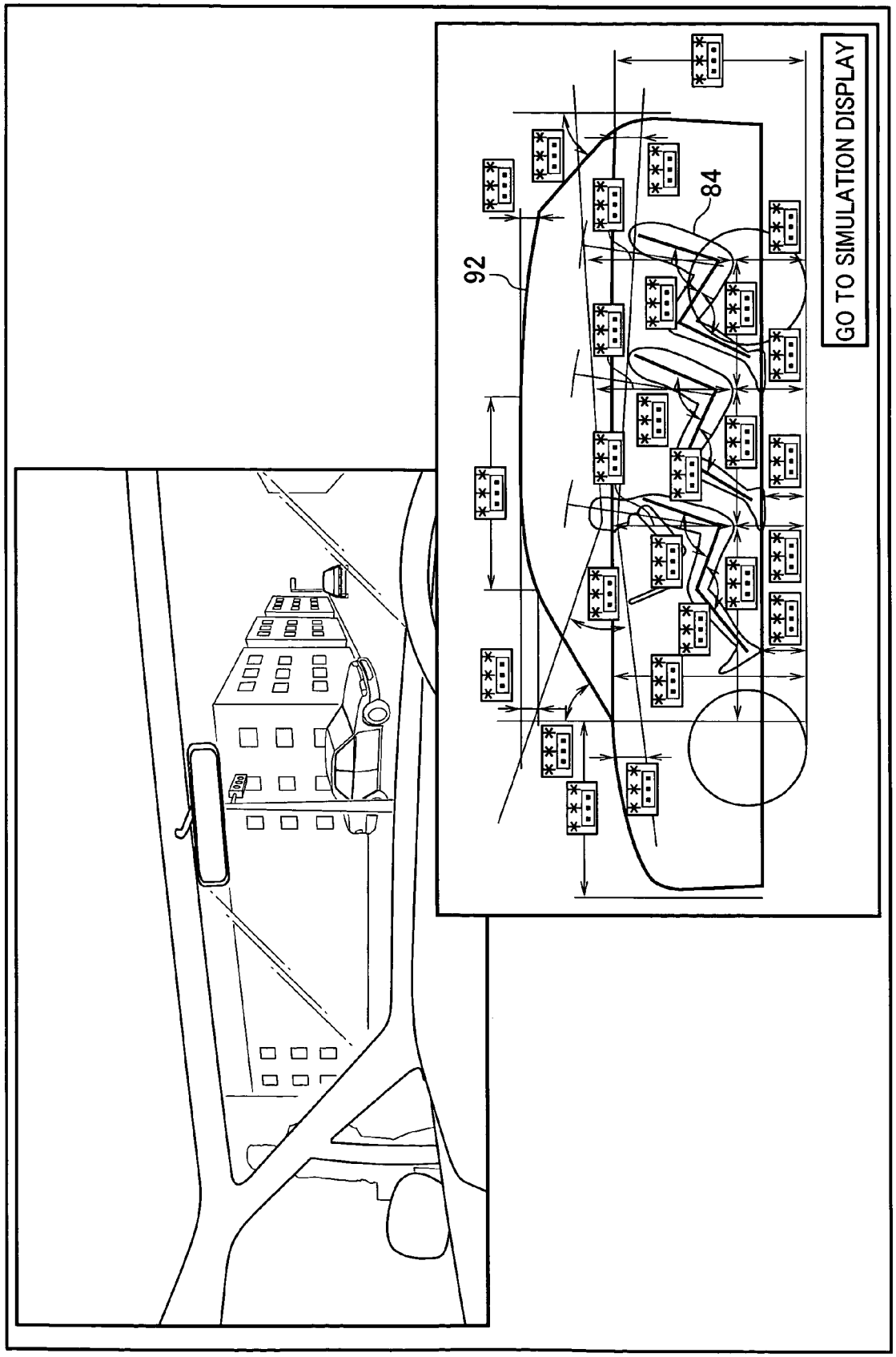
FIG. 23 is a diagram showing an example of a screen on which a simulation display and a 2D morphing display are displayed together according to an embodiment of the present invention.
Figure 24:
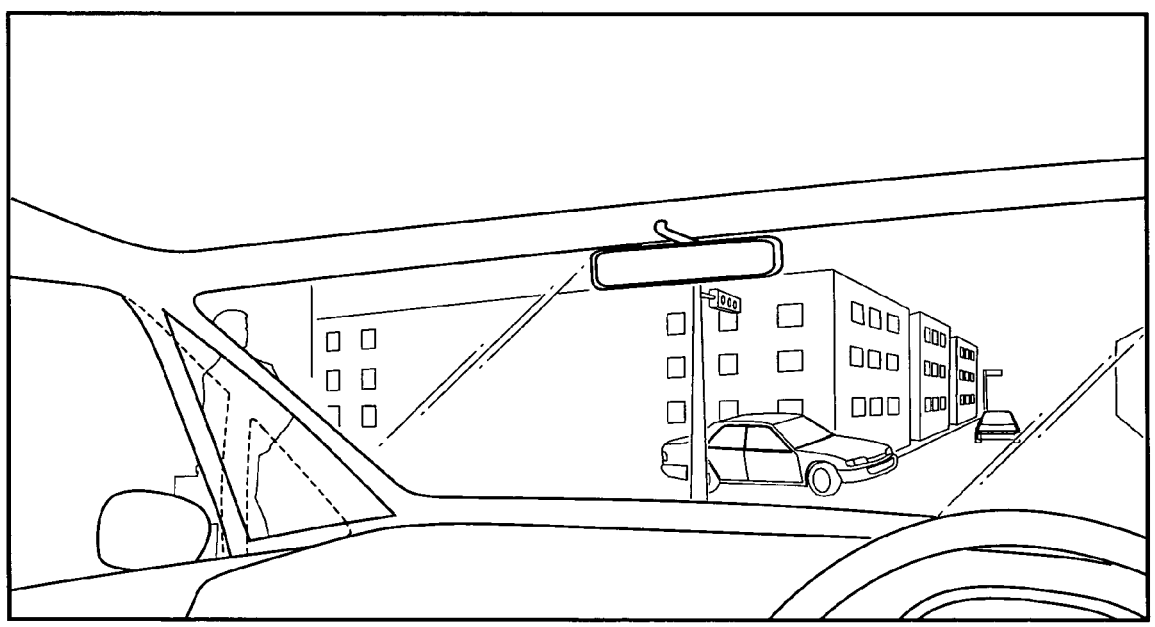
FIG. 24 is a diagram showing an example of a screen after changing the shape and size of the pillar portion of the vehicle model displayed in the simulation shown in FIG. 19.

FIG. 20 is the first half of a flow chart showing an example of processing with a vehicle planning support system according to an embodiment of the present invention. FIG. 21 is the latter half of a flow chart showing an example of processing with a vehicle planning support system according to an embodiment of the present invention. FIG. 22 is a diagram showing a morphing display setting menu screen according to an embodiment of the present invention. FIG. 23 is a diagram depicting an example of a screen on which a simulation display and a 2D morphing display according to an embodiment of the present invention are combined and displayed. FIG. 24 is a diagram depicting an example of an image of the vehicle model pillar portion displayed in the simulation shown in FIG. 19 after changing its shape and size. FIG. 25 is a diagram depicting an example of adjacently aligned images of the vehicle model pillar portion before and after changing, according to an embodiment of the present invention.

First, as shown in FIG. 20, in S1 a specification value input screen such as depicted in FIGS. 11 and 12 is displayed, and the vehicle planner selects model and other information about the vehicle and inputs specification values. Or, upon instruction from the vehicle planner, base vehicle specification values are read in from the benchmark vehicle database 70.

Next, advancing to S2, specification value data is generated based on the specification values, etc. input or read-in in S1.

Next, advancing to S3, a morphing display setting menu screen such as shown in FIG. 22 is displayed, and the vehicle planner selects the morphing screen to be displayed. In FIG. 22, a 2D morphing screen three view display is selected. The vehicle planner also makes respective selections of benchmark vehicle-related items and spatial area-related items described below. The morphing display setting menu screen is displayed by the morphing screen display program 40.

Next, advancing to S4, vehicle model data for 2D or 3D use is generated in accordance with the morphing screen selected by the vehicle planner in S3.

Next, advancing to S5 or S8, a 2D or 3D morphing screen is displayed. Here, shape deformation, layout changes, etc. of the vehicle model can be effectively and efficiently accomplished on the 2D morphing screen. On the other hand, images can be easily grasped three-dimensionally on the 3D morphing screen. Therefore we will explain the case in which vehicle planning is advanced by first displaying a 2D morphing screen in S5 and, then displaying a 3D morphing screen in S8 in order to grasp an image three-dimensionally.

A 2D morphing screen such as shown in FIGS. 15-17 is displayed in S5. Using the 2D morphing screen, the vehicle planner can deform shapes and change the layout of each part of the vehicle model. In S5, the specification values changed through such shape deformations and layout changes are temporarily stored in the RAM 12 (see FIG. 1).

After the vehicle planner completes work on the 2D morphing screen, he or she pushes a button to move to the 3D morphing screen, as shown in FIGS. 15-17 (displayed as "Move to 3D"), advancing to S6, whereupon the temporarily stored changed specification values are reflected all together in the specification value data.

Next, advancing to S7, vehicle model data for 3d morphing are generated all together based on the changed specification value data.

3D morphing screen vehicle model data thus is not sequentially generated while changes are being made on the 2D morphing screen; rather the vehicle model data for 3D morphing is generated all together after the operation is complete.

Here, as described above, there are fewer specification values and rules applied to the 2D morphing screen vehicle model than to the 3D morphing screen. Therefore compatibility errors may arise when vehicle model data for the 3D morphing screen is sequentially generated, such as non-conformity of contacting surfaces between the hood portion and the fender portion, for example. Therefore the frequent occurrence of non-compatibility errors can be prevented by causing vehicle model data for 3D morphing to be generated after completion of work on the 2D morphing screen.

Furthermore, as described above, the volume of calculations to generate vehicle model data for 3D use is large, since all specification values and rules are reflected. Therefore vehicle planning can be efficiently performed by eliminating the time needed for calculation of vehicle model data for 3D use.

Next, advancing to S8, a 3D morphing screen is displayed as shown in FIG. 13 and FIG. 14. Using this screen, the vehicle planner can three-dimensionally verify the shape of the planned vehicle and the compatibility of each model from many different viewpoints. he or she can also deform the shape of the vehicle model. In S8, an error display (not illustrated) is displayed indicating the specific position and reason for an error when there are incompatible portions as described above. The vehicle planner can take steps to achieve compatibility between each of the portions by looking at this error display.

Next, advancing to S9, the vehicle planner determines the necessity to again deform the vehicle, etc. in the 2D morphing screen, and advances to S5 by pushing the button used to move to 2D morphing screen (displayed as "Move to 2D"). Again the 2D morphing screen is displayed.

The vehicle planner, as shown by the dotted line in FIG. 20, can either grab a 3D image of the vehicle in S8 or, after doing a rough deformation, push the button to move to the 2D morphing screen in S9 and perform work on the 2D morphing screen in S5.

Next, as shown in FIG. 21, the system advances to S10, where the vehicle model is saved as a simulation vehicle.

Next, advancing to S11, the driving condition setting screen (not shown) is displayed by the simulation image display program 44 (see FIG. 3), and the vehicle planner sets the driving route, direction of sunlight, weather conditions, driving speed, turning speed, etc.

Next, advancing to S12, virtual space data is read out from the virtual space database 74 in accordance with driving conditions set in S11. Furthermore, this virtual space data is combined with the simulation vehicle data saved in S10, and the appearance of the simulation vehicle driving in virtual space on a virtual road is displayed as shown in FIG. 19. When the vehicle planner pushes the pause button on the screen as shown in FIG. 19, the display is temporarily paused. The temporary pause button permits the vehicle planner to look thoroughly at the planned vehicle and evaluate, for example, the visibility of signals or pedestrians.

Next, advancing to S13, when the vehicle planner pushes the button for 2D simulation display (shown as "Display 2D Morphing") as shown in FIG. 19, the system advances to S14 where, as shown in FIG. 23, the 2D morphing screen is displayed together with the simulation display by the 2D morphing screen display program 56. Such a 2D morphing screen can also be displayed alone on the screen in large form.

When, as shown for example in FIG. 19, the vehicle planner determines that pedestrians are hidden and visibility is poor due to an A pillar portion which includes a triangle window pillar, he or she may change the vehicle model shape, etc. using the 2D morphing screen as shown in FIG. 23. For example, in order to increase visibility with respect to pedestrians, the positioning of passenger model 84 is changed with respect to the pillar portion. Or a 2D morphing screen depicting a section of the pillar portion is caused to display as shown in FIG. 17, changing such items as the shape or size of the exterior model 92 and the upper interior model 112 pillar portion.

When, after finishing this type of work, the vehicle planner pushes the button to move to simulation display as shown if FIG. 23, the system advances to S15, and the changed specification values are reflected in the specification value data.

Next, advancing to S16, a portion of the numerical data for the simulation model corresponding to the changed portions (for example, the pillar sectional shape) is changed by the simulation image display program 44.

Next, returning to S12, the changed simulation vehicle is re-displayed. In an embodiment of the present invention, the pre-change simulation vehicle model indicated by the dotted line (in actuality displayed as semi-transparent or the like) and the changed simulation vehicle model shown by the solid line (normal simulation display) are displayed in superimposition or overlay. Further, as shown in FIG. 25, the pre-change simulation vehicle model and the changed simulation vehicle model can also be lined up adjacently and displayed. It is also possible to cause the simulation display to start from either a paused state or an initial state.

The degree of linkage between the simulation display and the 2D morphing display is thus increased, so the vehicle planner can quickly deform the vehicle model during the simulation display and, can furthermore quickly display a simulation of the vehicle model after that deformation, thus improving ease of use. In particular, it is easier to restrict changes to only the portion one wishes to change with the 2D morphing screen than with three view display or sectional view display. Shapes can also be more easily grasped, and calculation times are shorter than for a 3D morphing display. Therefore vehicle planning can be efficiently advanced even if a 2D morphing display is used during simulation display. As a result, ease of use is improved when compared to returning again to the specification value input screen or the 3D morphing screen after completion of simulation display to perform work such as deforming the vehicle model.

Next, if the vehicle planner determines in S13 that there is no need to change the vehicle shape, etc., the system advances to S17, where the simulation display can be completed or processing in S11-S16 can be repeated under other driving conditions.

As explained above, using the simulation display the vehicle planner can visually evaluate driver comfort such as visibility and sense of constriction, and the time and cost of fabricating prototype vehicles can also be greatly reduced. In an embodiment of the present invention, the shape of the planned vehicle can be changed on the 2D morphing screen while confirming it on the simulation display screen, so that vehicle planning can be efficiently and effectively implemented.

Figure 26:
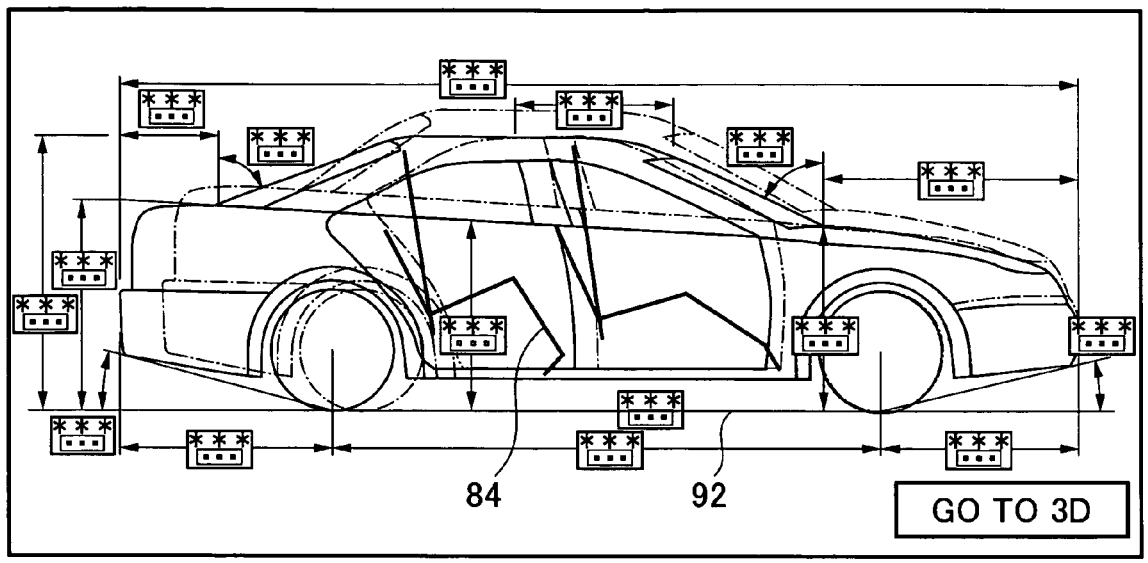
FIG. 26 is an example of a 2D morphing screen side view display showing a benchmark model vehicle image superimposed on a vehicle model according to an embodiment of the present invention.

Next, referring to FIGS. 22 and 26, we will explain the function which permits superimposed or overlaid displaying of benchmark vehicles by the 2D morphing screen display program 56. FIG. 26 is an example of a 2D morphing screen side view display of an image of a benchmark vehicle superimposed on a vehicle model according to an embodiment of the present invention.

In addition to the functions described above, the 2D morphing screen display program 56 (see FIG. 3) has the function of superimposing and displaying a benchmark vehicle which the planner wishes to use for vehicle planning reference or comparison onto the planned vehicle.

As shown in FIG. 22, the vehicle planner selects the benchmark vehicle within the benchmark vehicle selection items. The benchmark vehicle data is stored in the benchmark vehicle database 70, and may be selected from that database. When a particular vehicle is selected ("Vehicle B" here), specification values for that vehicle are read out all together from the benchmark vehicle database 70 by the specification value input program 36, and specification value data separate from the planned vehicle is generated. Based on this specification value data, the vehicle model data generating program 38 causes vehicle model data to be generated as simple numerical data without rules applied.

As shown in FIG. 26, the 2D morphing screen display program 56 (see FIG. 3) displays the benchmark vehicle on the screen as a reference image, based on this vehicle data. In an embodiment of the present invention, the benchmark vehicle is displayed semi-transparently (depicted as a imaginary line in FIG. 26).

In the selection screen shown in FIG. 22, the vehicle planner selects the reference position at which the planned vehicle model and the benchmark vehicle are to be superimposed ("Front Bumper Edge" is selected in FIG. 22). As shown in FIG. 26, the benchmark vehicle is superimposed and displayed starting at the selected reference position.

Here, only a predetermined section and major shape is displayed on the 2D morphing screen, so the vehicle planner can easily compare the planned vehicle model and the benchmark vehicle using the benchmark vehicle superimposed display, thereby significantly advancing the vehicle planning process. Since the reference position for superimposition can be selected, the portion which one wishes to compare or refer to can be more effectively compared.

Figure 27:
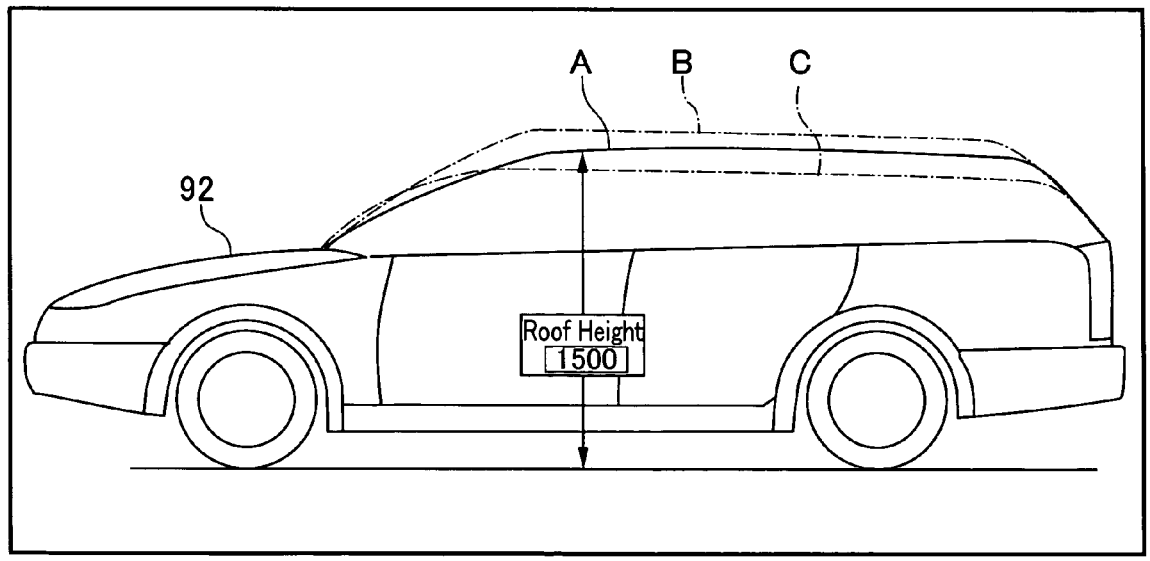
FIG. 27 is an example of a 2D morphing screen displaying a range display together with a vehicle model according to an embodiment of the present invention.
Figure 28:
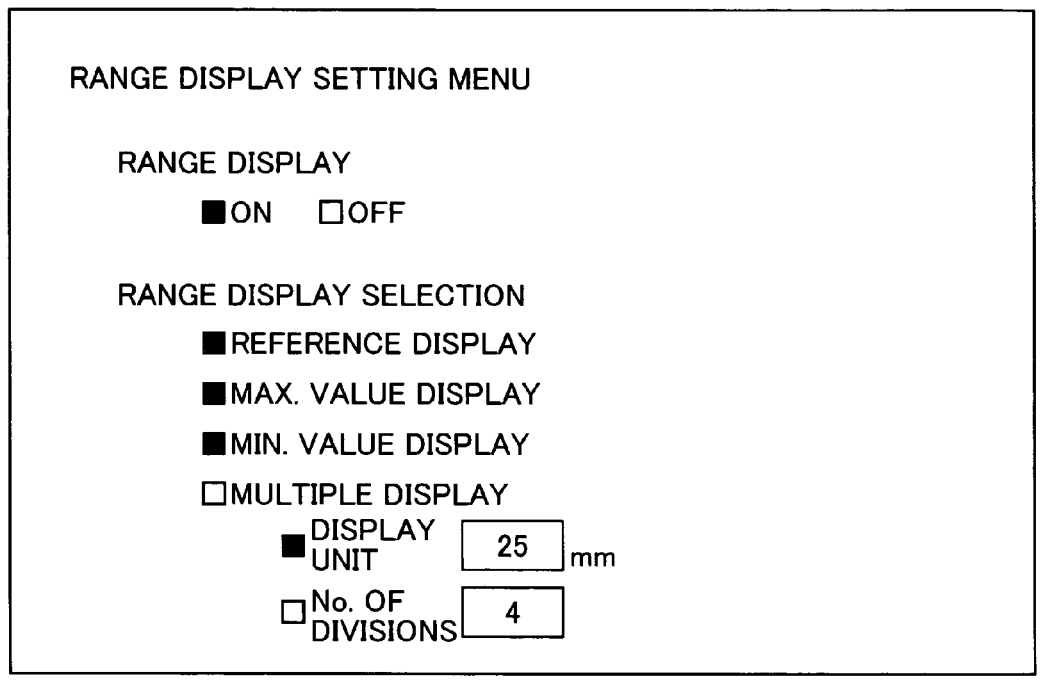
FIG. 28 is a diagram depicting a range display menu screen according to an embodiment of the present invention.
Figure 29:
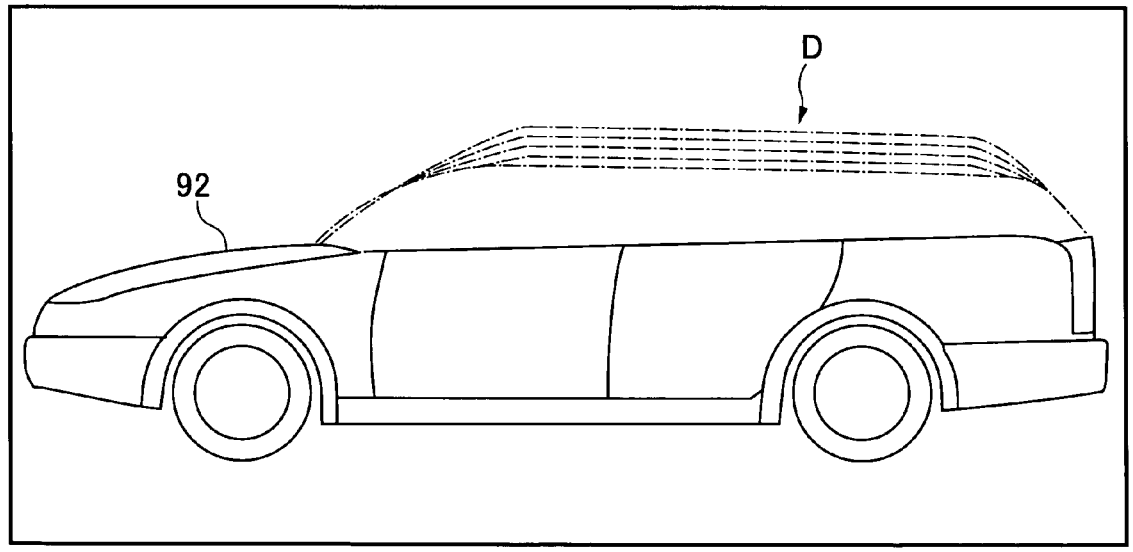
FIG. 29 is an example of a 2D morphing screen displaying a range display for a plurality of vehicle shapes according to an embodiment of the present invention.

Next, referring to FIG. 12 and FIGS. 27-29, we will explain the function of the range input and range display in an embodiment of the present invention. FIG. 27 is an example of a 2D morphing screen in which a range display is displayed together with a vehicle model in an embodiment of the present invention. FIG. 28 is a diagram depicting a range display setting menu screen in an embodiment of the present invention. FIG. 29 is an example of a 2D morphing screen displaying a plurality of vehicle shape range displays in an embodiment of the present invention.

In an embodiment of the present invention, the specification value input program 36 and the 2D morphing screen display programs 56 and 58 (see FIG. 3) respectively have a range input function and a range display function; the vehicle shape is displayed in response to a range value based on an input of that value (a predetermined numerical range) by the vehicle planner.

Here, display of the vehicle shape requires specification values expressed by certain specific numerical values, but there are many cases in the vehicle planning stage where it is meaningless to specify numerical values in mm units, for example, or where it is inconvenient to determine a particular numerical value. Therefore in an embodiment of the present invention, planning of the vehicle can be effectively advanced by permitting range inputs.

First we will explain the range input function. In an embodiment of the present invention, a range input column (range input screen), as shown in FIG. 12, is displayed on the specification value input screen using the specification value input program 36 range input function, so that the vehicle planner can input range values with respect to various specification values of each vehicle model.

Specifically, the vehicle planner can input as a range the maximum values and minimum values which will constitute a range for determining the degree of design freedom with respect to individual specifications such as roof height, etc. For example, if the vehicle planner wishes to know how the overall vehicle shape appearance will change if the roof height is raised by 50 mm or lowered by 50 mm with respect to an input roof height specification value of 1500, he or she will input "±50."

Here, the difference in values with respect to the specification value is what is input; for example "±50" or "−10 mm-+10 mm." Maximum values and minimum values such as "1720-1780" can also be respectively input; in this case, input of specification values to the specification value input column can be omitted.

Next, referring to FIG. 12 and FIGS. 27 and 28, we will explain the range display function.

In an embodiment of the present invention, as shown in FIG. 27 and FIG. 28, the vehicle model is displayed based on the specification values, and the vehicle shape (range display) is displayed in response to the input range values using the range display function in each of the 2D morphing screen display programs 56 and 58.

As shown in FIG. 27, the vehicle model A (shown by a solid line) corresponding to a specification value is displayed as the reference display, while the vehicle shape B at the maximum value (shown by an imaginary line) and the vehicle shape C at the minimum value (shown by an imaginary line) are respectively displayed as range displays. In the example shown in FIG. 27, the reference display is displayed for the entire vehicle; in the range display only a portion of the vehicle, i.e. only the pillar portion and the roof portion, are displayed.

In FIG. 27, the range display is indicated using imaginary lines, but in actuality it would be displayed semi-transparently or in a different color from the reference display (the vehicle model). In the 3D morphing screen, similarly, the range display is displayed semi-transparently.

The three shapes displayed in the reference display and the range display are displayed in the example shown in FIG. 27, and the vehicle planner can compare the external appearance shape with different roof heights by comparing them on the same screen. The range display can also be used as a guide for shape deformation of the vehicle model, etc. Furthermore, reading the base vehicle values into the specification values and inputting a range with respect to this base vehicle, for example, permits a comparison with the base vehicle.

Making such a comparison in the past required repeatedly inputting specification values and displaying morphing screens, which took time and made comparison difficult. In an embodiment of the present invention, this type of comparison can be easily effected, so that vehicle planning can proceed efficiently.

Next, as shown in FIG. 28, an ON-OFF selection can be made for this range display using the range display setting menu.

Also, the maximum value display and minimum value display can be freely selected using this setting menu, thus allowing display of either or both in addition to the reference display. When either the maximum or the minimum display is selected, the range display can be displayed against the reference display and the two can be compared.

By choosing non-display of the reference display (the vehicle model), it is possible to display only the two range display shapes of the maximum and minimum values. In that case, it is easy for the vehicle planner to freely imagine within his or her mind the planned vehicle within the range of the two shapes shown by the maximum value display and the minimum value display.

Furthermore, a plurality of range displays can be displayed within the maximum value and minimum value range by turning on the multiple display item. By inputting predetermined units such as 4-divisions or 25 mm as shown in FIG. 28, for example, a plurality of range displays D are displayed in a chosen unit from a minimum value to a maximum value, as shown in FIG. 29. In the example shown in FIG. 29, a range display depicting a plurality of vehicle shapes D divided into four divisions (or 25 mm units) is displayed from the maximum value to the minimum value. In an embodiment of the present invention, the reference display is not displayed when the plurality of range displays are displayed. Therefore the vehicle planner can easily compare a plurality of range displays to one another. In the FIG. 29 example, the reference display of the pillar portion and the roof portion is not displayed.

If one wishes to display the shape of a predetermined position on the screen, it is possible to select one or a plurality of positions from a plurality of range displays, and display only that selected vehicle shape. In that case, the reference display can be displayed and compared to the selected range display.

Here, when maximum and minimum values such as "1720-1780" are input to the range column, the midpoint value 1750 between the maximum and minimum values is automatically determined as the specification value, and the reference display (the vehicle model) is displayed on each morphing screen using that automatically determined specification value.

Next we will explain restrictions on range value inputs and changes in the specification values.

The range input function and range display function have the function of restricting range value inputs and changes in specification values on each of the morphing screens.

First we will explain the case in which changes in the range value input and specification values are not possible.

There are cases during vehicle development when existing model doors or hoods, for example, are carried over. In vehicle planning, development of vehicles whose planning is attempted but are impossible to implement can be prevented by considering such carryovers.

In an embodiment of the present invention, therefore, a function has been added to the range input and range display functions which restricts the input of range values related to carried over parts, so that changes in specification values on are not accepted on each of the morphing screens.

Specifically, when the vehicle planner turns on the carryover designating column with respect to each of the carryover part specification items (the door, for example) on the specification value input screen shown in FIG. 12, a "±0" is displayed on the activated specification value range input column, and input of range values is disabled. When carrying over a part, the vehicle planner reads in the carryover part specification values from the benchmark vehicle database 70. Inputs to change these read-in specification values are not possible, and inputs by the vehicle planner, along with inputs of range values, are no longer accepted.

Information designating the carryover is added to each specification value item in the specification value data generated by the specification value input program 36 and is reflected in the vehicle model. Therefore the specification values designated in this carryover designating column cannot be changed even on the individual morphing screens. A warning (not shown) is issued when the vehicle planner attempts to change a specification value.

The system is also arranged so that the aforementioned rule data is not applied to carryover-designated specification items. Therefore even specification values which are normally changed in conjunction with changes in specification values for other portions based on the rule data are not changed in conjunction therewith for specification values having a carryover ON designation.

When there is a carryover, the system can be set to accept changes in specification values when changing dimensions, etc. of a portion thereof. In such cases, turning on the warning allows the vehicle planner to know that a carryover designation is present.

When there is no carryover, there are cases when one wishes to hold specification values fixed for a part having special design features, for example, then proceed with subsequent vehicle planning. In such cases if the specification value data is generated after returning to the specification value input screen and turning the carryover designation on, subsequent changes in specification values relating to that portion will be restricted.

Next we will explain the case in which range value inputs and changes in specification values are restricted to a predetermined range.

Regulation-related restrictions and vehicle design restrictions must be taken into account when designing an automobile. An example of a regulation would be front bumper height, which may be restricted by domestic and foreign collision standards and the like. From a vehicle design standpoint, the hood height may be restricted by engine mounting position and the like. Consideration of such restrictions in the course of vehicle planning enables more efficient subsequent development as well as the prevention of development vehicles in which a conventional vehicle planning was attempted but which proved unrealizable.

Therefore in an embodiment of the present invention a restricting function is added to the range input function and the range display function so that range value inputs and changes in specification values can only be accepted within the limited range described above.

Specifically, data relating to regulation or vehicle design limit values is stored in the restricted value database 72 (see FIG. 3). The specification value input program 36 uses the range input function to look up limit values with respect to each of the restricted value database 72 specification items, and does not accept inputs exceeding those limit values. Therefore the vehicle planner can use the specification value input screen shown in FIG. 12 to input specification values within the limit value numerical value range (limit range) with respect to each specification item, and can furthermore input range values within a range not exceeding the limit range with respect to the input specification values. A warning (not shown) is issued when there is an attempt to input numerical values exceeding the limit range.

Limit ranges are also added to the data with respect to each specification item in the specification values generated by the specification value input program 36, and are reflected in the vehicle model. Therefore changes in the specification values exceeding the limit range cannot be made, even on the individual morphing screens. A warning (not shown) is issued when the vehicle planner tries to change the specification values beyond the limit range.

On each of the morphing screens, when specification values are changed in tandem with changes in other specification values based on the rule data described above, that tandem is only permitted within the limit range. Warnings would normally be issued in cases in which the limit range is exceeded based on the rule data.

We will next explain the case in which range value inputs and specification value changes are restricted by a prescribed range determined according to the planned vehicle development stage.

Normally in automobile development, the closer vehicle planning gets to the final stage, the smaller becomes the allowable range for specification values. For example, as one gets closer to the final vehicle planning stage, vehicle planning can be advanced more efficiently by not changing the vehicle external appearance or the door shape excessively. In each stage of vehicle planning, vehicle planning can be effectively advanced by taking into account such allowable ranges.

Therefore in an embodiment of the present invention, an allowable range of this type is prescribed beforehand and a function is added to the range input function and the range display function which restricts range inputs and specification value changes so that they are only accepted within that prescribed range.

Specifically, the restricted value database 72 (see FIG. 3) pre-stores prescribed values prescribing an allowable range for specification values. The restricted value database 72 stores prescribed value data such as, for example, "±100" in the initial Stage 1, "±50" in the intermediary Stage 2, and "±0" in Stage 3 close to the final stage. Values corresponding to each specification item are set up for such prescribed values.

At the same time, as shown in FIG. 11, a selection button is displayed on the initial specification value input screen to select a planning stage such as "Stage 1," "Stage 2," etc., and a planning stage is selected by the vehicle planner.

The specification value input program 36 uses the range input function to look up prescribed values in the restricted value database 72 corresponding to the planning stage selected by the vehicle planner, accepting inputs which exceed those prescribed values. Therefore by using the specification value input screen shown in FIG. 12, the vehicle planner can input specification values within the numerical value range of those prescribed values (the prescribed range) for each specification item, and can further input range values in a range not exceeding a predetermined range with respect to the input specification values.

As with the aforementioned restrictions to a limit range due to regulations, etc., with the restrictions from this prescribed range, inputs of numerical values exceeding prescribed values are not accepted, and such prescribed values are added as data to the specification value data, as well as being reflected in the vehicle model. Therefore even in each of the morphing screens, changes cannot be made in the specification values which exceed the prescribed range, and changes are only made in tandem within the prescribed range, based on the aforementioned rule data.

Figure 30:
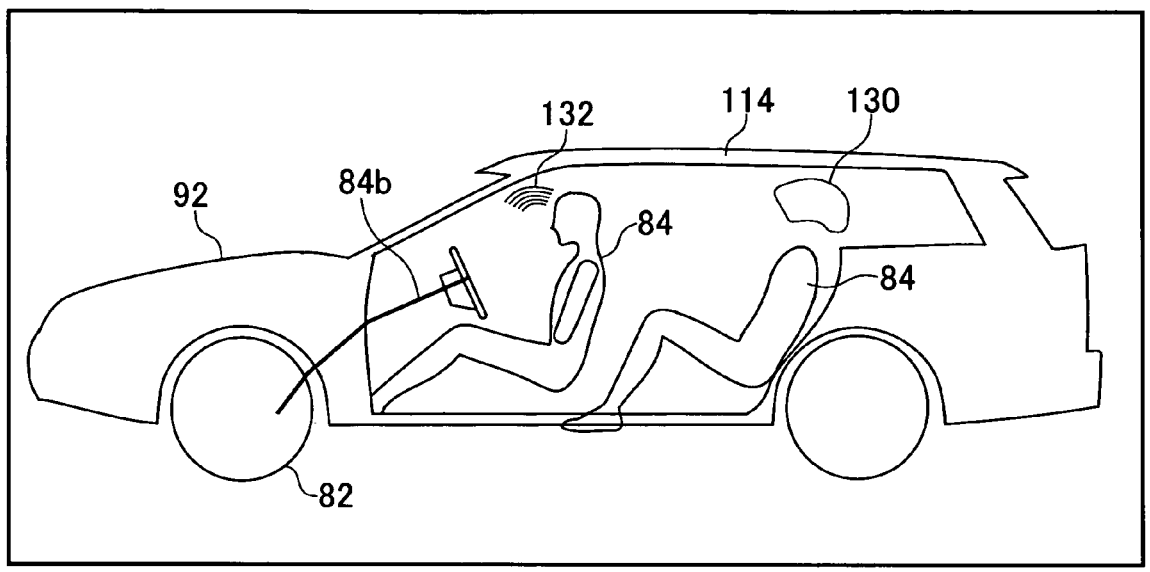
FIG. 30 is a diagram depicting an example of a 2D morphing screen displaying a passenger model including a head area display and an entering and exiting area display, which are spatial area displays according to an embodiment of the present invention.
Figure 31:
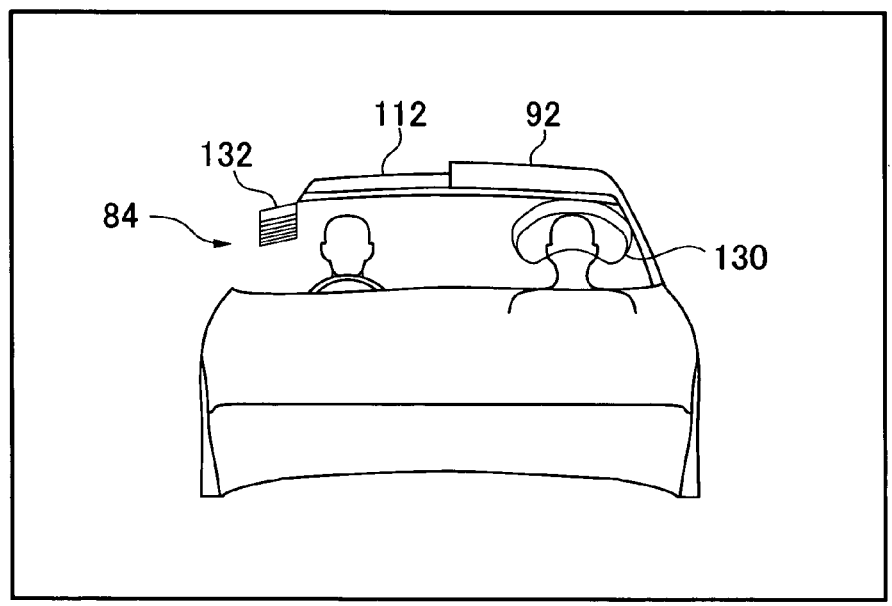
FIG. 31 is a diagram depicting an example of a 2D morphing screen displaying a passenger model including a head area display and an entering and exiting area display, which are spatial area displays according to an embodiment of the present invention.
Figure 32:
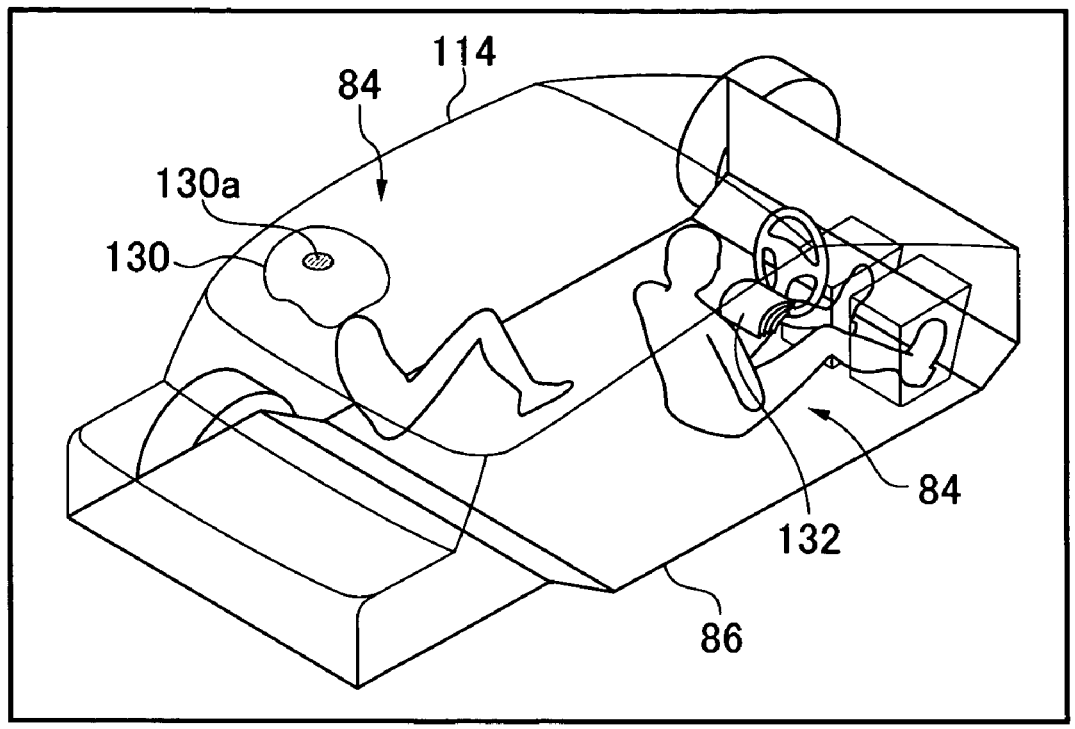
FIG. 32 is a diagram depicting an example of a 3D morphing screen displaying a passenger model including a head area display and an entering and exiting area display, which are spatial area displays according to an embodiment of the present invention.
Figure 33:
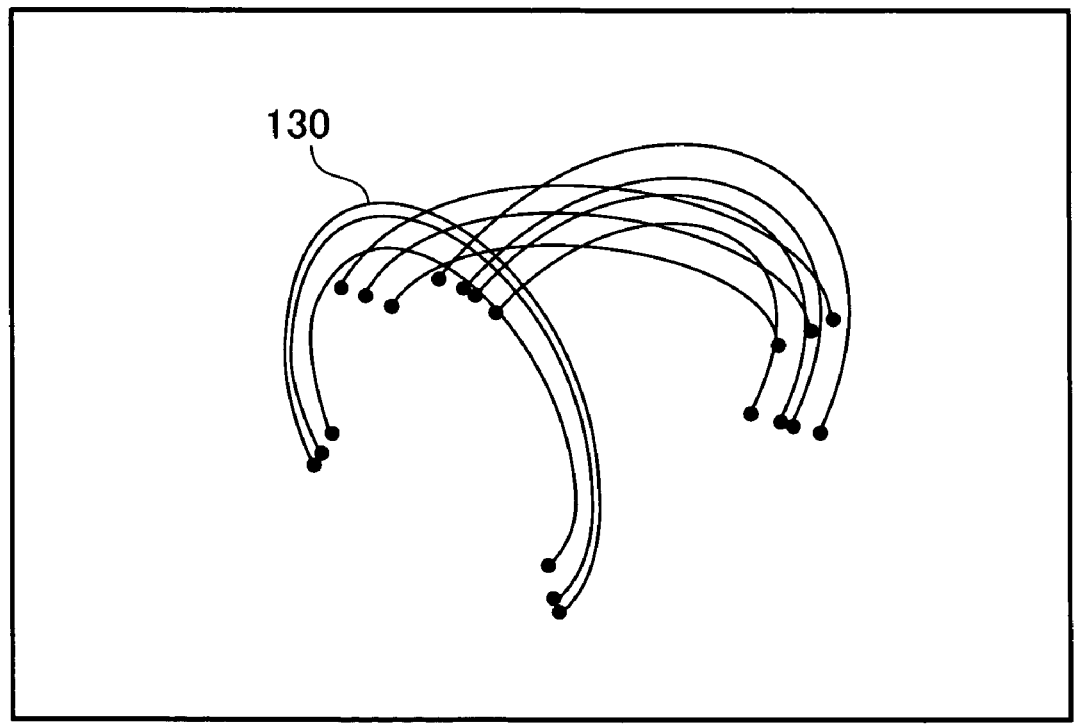
FIG. 33 is a diagram depicting a variation of a head area display, being a spatial area display, according to an embodiment of the present invention.
Figure 34:
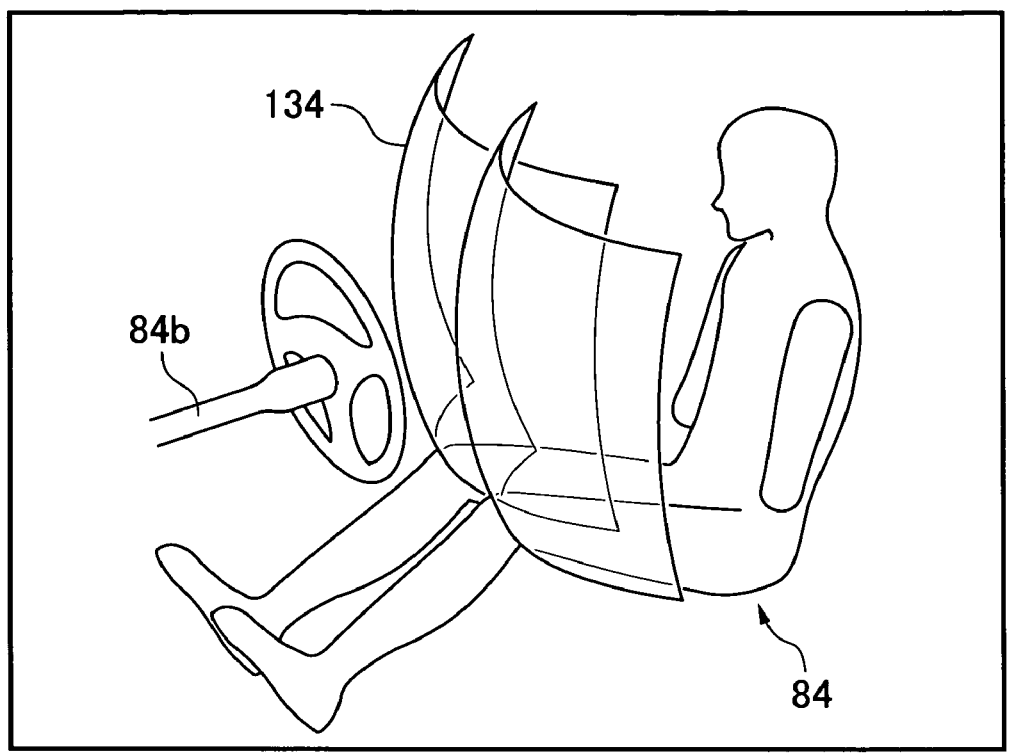
FIG. 34 is an example of a 3D morphing screen displaying a passenger model including a reach area display, being a spatial area display, according to an embodiment of the present invention.
Figure 35:
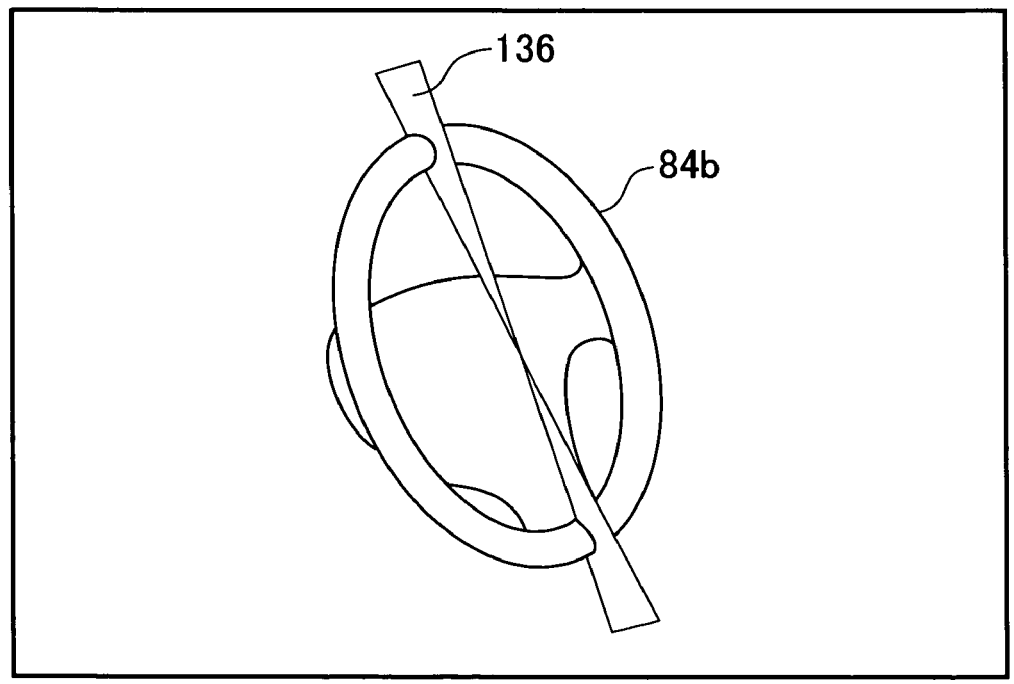
FIG. 35 is a diagram depicting an example of a steering control area display, being a spatial area display, according to an embodiment of the present invention.

Next, referring to FIG. 22 and FIGS. 30-36, we will explain the spatial area display included in the passenger model 84. FIG. 30 is a diagram depicting an example of a 2D morphing screen displaying a passenger model including a head area display and an entering/exiting area display, which form a spatial area display according to an embodiment of the present invention. FIG. 31 is a diagram depicting an example of a 2D morphing screen displaying a passenger model including a head area display and an entering/exiting area display, which form a spatial area display according to an embodiment of the present invention. FIG. 32 is a diagram depicting an example of a 3D morphing screen displaying a passenger model including a head area display and an entering/exiting area display, which form a spatial area display according to an embodiment of the present invention. FIG. 33 is a diagram depicting a deformation example of the head area display, being a spatial area display according to an embodiment of the present invention. FIG. 34 is an example of a 3D morphing screen displaying a passenger model including a reach area display, being a spatial area display according to an embodiment of the present invention. FIG. 35 is a diagram depicting a display of a steering operation area display, being a spatial area display according to an embodiment of the present invention. FIG. 36 is a diagram depicting the display of a pedal operation area display, being a spatial area display according to an embodiment of the present invention.

Here, when another model is displayed together with the passenger model in the 3D morphing screen, the display is three dimensionally implemented to achieve a sense of distance from a selected viewpoint. When the monitor itself is flat, however, it may be difficult to gain an objective grasp of the space around the head with respect to the roof and pillars, etc., or of headroom relative to the door opening when entering and exiting, or of the range at which passenger arms reach the steering or instrument panels. It may similarly also be difficult in the 2D morphing screen to gain an objective grasp of spatial distances, since one cannot probe above one's head for evaluation purposes as in an actual vehicle.

In an embodiment of the present invention, as shown in FIGS. 30-34, a head area display 130, an entering/exiting area display 132, a reach area display 134, a steering operation area display 136, and a pedal operation area display 138 can be displayed in combination when displaying the passenger model 84 on each of the 2D and 3D morphing screens in order to objectively evaluate the size of the space around the passenger model 84, and to evaluate the relative relationship between the passenger model 84 and other models therein.

First, referring to FIGS. 30-33, we will explain the head area display 130. As shown in FIGS. 30-32, the head area display 130 depicts a space which is a predetermined distance from the head, encompassing the sweep of the head moving in a range which includes normal posture, leaning forward, turning the head to the front and back and left and right, etc. In this display, portions interfering with the roof, etc. are easily noted due to brightness differences and the like. For example, in the display shown in FIG. 32 there is a portion 130a where the brightness is different around the top of the head, and the head is clearly interfering with the roof.

As shown in FIG. 33, the head area display 130 is capable of displaying in several separate layers. Layered display of this type enables one to freely designate the spacing between layers and distances from the head for display. Using this type of display permits objective evaluation of head clearance (distance from the roof) based on which layer display interferes with the roof.

When the passenger model 84 posture or layout (the hip point, torso angle, heel point, etc.) is changed, this type of head area display 130 moves in tandem therewith and causes the model to be displayed in the corresponding changed position.

This type of head area display 130 enables evaluation of factors such as headroom, interference between the head and roof, pillars, etc., and the sense of constriction perceived by passengers with respect to the roof, pillars, etc.

Next, referring to FIGS. 30-32, we will explain the entering/exiting area display 132. As shown in FIG. 30-32, the entering/exiting area display 132 is displayed in the vicinity of the door opening, and depicts the range through which the top of the passenger model's head 84 passes when entering and exiting. As with the head area display 130, the entering/exiting area display 132 can be displayed in layers; a layered display example is shown in FIGS. 30-32.

This display is displayed with a curved surface, and includes pass-through positions for when a passenger exits while slouching forward, or when his/her upper body is relatively erect, etc. This display is displayed at a position which moves in tandem with the position of the passenger model 84.

Using the entering/exiting area display 132, it is thus possible to evaluate headroom (the interval to the roof or pillar) when entering and exiting, and interference between the head and the roof or pillar, etc., in the same way as described for the head area display 130.

Next, referring to FIG. 34, we will explain the reach area display 134. As depicted in FIG. 34, in the reach area display 134 the passenger model 84 is displayed in the front, and the range of hand reach is shown when the passenger (passenger model 84) extends his or her arms approximately forward and moves them up and down and to the left and right. FIG. 34 shows that the hands do not reach the steering column 84b. This display can also be divided into several layers over a predetermined distance forward from the passenger (not shown), taking into account the length of the passenger's arm in proportion to the size of the passenger. Like the aforementioned head area display 130, this display is also displayed in a position which moves in tandem with the passenger model 84 posture, etc.

It is thus possible, using the reach area display 134, to evaluate passenger operability and ease of use of the steering column 84b, the shift lever (not shown), and the instrument panel instruments (not shown).

Next, referring to FIG. 35 and FIG. 36, we will explain the steering operation area display 136 and the pedal operation area display 138. As shown in FIG. 35, the steering operation area display 136 is displayed superimposed on the steering column 84b. Operability characteristics of the steering itself, such as steering tilt angle and the steering center can be evaluated using the steering operation area display 136.

As shown in FIG. 36, the pedal operation area display 138 is displayed superimposed on the pedal 84c and in the vicinity thereof. Use of the pedal operation area display 138 enables evaluation of the operability characteristics of the pedals themselves, including pedal operation space, pedal height, pedal inclination angle, pedal sweep, and level differences, etc. between each of the pedals.

For example, pedal angles move with the passenger ankle angle when the passenger hip point is moved up or down.

Next, referring to FIG. 22, we will explain the spatial area display setting menu. As shown in FIG. 22, each of the aforementioned displays can be turned on or off using the morphing display setting menu. In this case, the head area display 130, the entering/exiting area display 132, the reach area display 134, the steering operation area display 136 and the pedal operation area display 138 can be freely selected and displayed.

Layered display can also be turned on or off, and relative distances to the passenger model 84 (distance to the head, distance to the shoulder joint, etc.) and intervals between layer displays can be input respectively as numerical values.

Next, referring to FIGS. 37-42, we will explain the function of the history registration display program 42. The history registration display program 42 (see FIG. 3) has primarily a history registration function, a history search function, and a history notification function.

First, referring to FIGS. 37 and 38, we will explain the history registration function. FIG. 37 is a diagram depicting a registration specification value input table based on a history registration display program history registration function according to an embodiment of the present invention. FIG. 38 is a diagram depicting a history registration menu based on the history registration display program history registration function according to an embodiment of the present invention.

When the vehicle planner sets a specification value for a particular objective, the history registration function has the ability to register the set specification item, the set specification value, the set objective, and the reason, etc. for these settings as history data in the history database 76.

Here, when seeking to set a particular specification, the vehicle planner may have know-how regarding what level of numerical value to use, or what level of numerical value to use for other specification values in relation to the specification value he or she seeks to set, etc. When seeking to change a particular specification value, the vehicle planner may also have know-how to the effect that other specification values must be or should preferably be changed. For example, the pillar position or the beltline position may change when the hip point is changed.

Such know-how is based on some type of objective or reason, such as the need to assure visibility or to maintain balance in the external appearance of the vehicle; the more experienced the vehicle planning or design professional, the more such know-how he or she will have. In an embodiment of the present invention, the history registration function enables registration of such know-how, while the history search function allows the vehicle planner to refer to such know-how in accordance with his or her objective, and serves the vehicle planning process.

Specifically, when the vehicle planner inputs specification values on the specification value input screen (including the first input and subsequent re-inputting of changed specification values), or changes specification values on individual morphing screens, a registration specification value input table can be displayed as shown in FIG. 37, using the history registration display program 42. The specification item or specification value, etc. is set using this registration specification value input table.

First, one or a plurality of specifications (specification items) which one wishes to set are optionally input. In particular, when a specification value is changed, other related specification values which should preferably be changed can also be set in addition to the specification value one wishes to change. Input of these specification items can be performed automatically by selection from a specification item list screen (not shown) divided into categories such as exterior dimension, interior dimension, visibility condition, etc. In FIG. 37, six items have been input.

When the specification value is initially entered, a specification value is input with respect to the set specification item. Specification values which have already been set in a specification value table (see FIG. 12) or in specification value data are then automatically read in. The vehicle planner changes these read-in specification values. Each morphing screen can also be displayed and the specification values on the morphing screen changed; in that case, the changed specification values are automatically read into the specification value input table for registration.

Next, the vehicle planner inputs a name for the planned vehicle (input as "SE3P" in FIG. 37). Furthermore, if there is a vehicle the planner wishes to refer to when setting the specification value, data for a benchmark vehicle, etc. is caused to be read in from the benchmark vehicle database 70. FIG. 37 shows data for Vehicles A and B being read in.

After setting the specification and specification value, a history registration menu as shown in FIG. 38 can be displayed using the history registration display program 42. The vehicle planner inputs the specification value item and specification value setting objective (input objective, change objective) and setting reason (input reason, change reason) using the history registration menu.

Some type of objective such as problem resolution or condition improvement is input for the setting objective. For example, "Reduce sense of constriction" could be input. For the setting reason, specific thinking or know-how is input in order to achieve that objective. For example, "Increase roof height to solve sense of constriction. In such cases, reduce pillar angle of inclination to maintain exterior appearance design balance" could be input.

If there are specification values which preferably should not be changed, or which must not be changed, the reasons for this (reasons for prohibiting specification value changes) could also be input as the setting reason. For example, "Lower the belt line, but to maintain sufficient engine compartment, don't lower the cowl point," could be input.

A data name is input in the history registration menu. That data name may be registered as a previously input setting objective.

Furthermore, the planned vehicle type ("Minivan," etc.), class ("B Segment," etc.), development stage ("Stage 1," etc.) are respectively selected on the history registration menu. The vehicle planning project name, vehicle planner's name, contact, and date of the work are also input on the history registration menu.

After completion of these inputs and selections, pushing the "Register" button as shown in FIG. 38 causes the set specification item, set specification value, pre-change specification value, planned vehicle name, reference vehicle name, and information input or selected on the history registration menu to be registered as history data in the history database 76.

The history data also includes related specification change data generated when a plurality of specification values are set, comprising set multiple specification items and corresponding specification values, the setting objectives, and the setting reasons. Therefore the vehicle planner can, by referring to searches of or notifications about the related specification change data, know whether it is necessary to change a plurality of specification values in order to achieve a particular objective, thus enabling vehicle planners without know-how to also effectively plan vehicles.

Next, referring to FIGS. 39 and 40, we will explain the history search function. FIG. 39 is a diagram depicting a history search menu based on a history registration display program history search function according to an embodiment of the present invention. FIG. 40 is a diagram depicting an example of a history list screen displayed by the history search function and history notification function of a history registration display program according to an embodiment of the present invention.

The history search function is a function which enables the vehicle planner to search history data. The type of history search menu shown in FIG. 39 can be displayed by the history search function when the vehicle planner searches history data stored in the history database 76. This history search menu allows searches using keyword inputs. The word "visibility" is input In FIG. 39, and a selection is made to search from all data. The search item can also be narrowed; searches can be performed by narrowing the data using a selection from each of the items (data name (registration name), setting objective, planned vehicle name (registered vehicle), and project name).

When the "Search" button is pushed, a history list screen is displayed as shown in FIG. 40. Each history data name, setting objective, and setting reason is displayed on this history list screen. Other content such as the set specification item, specification value, vehicle type, and development stage, etc. can be viewed by pressing the Detailed Display button.

The Related Specification Change Data Reference button is also displayed. When this button is pushed, the set specification items and specification values are displayed in the same format as the aforementioned specification value input table for registration (see FIG. 37); the setting objective and setting purpose are also displayed. In this case, the changed specification value and the pre-change specification value are both displayed, so the change process can be viewed as history. For example, the pre-change specification value is displayed in parentheses next to the changed specification value.

Using this type of history search function when seeking, for example, to improve forward visibility, the vehicle planner can refer to history data registered in connection with forward visibility, which will aid in vehicle planning.

Figure 42:
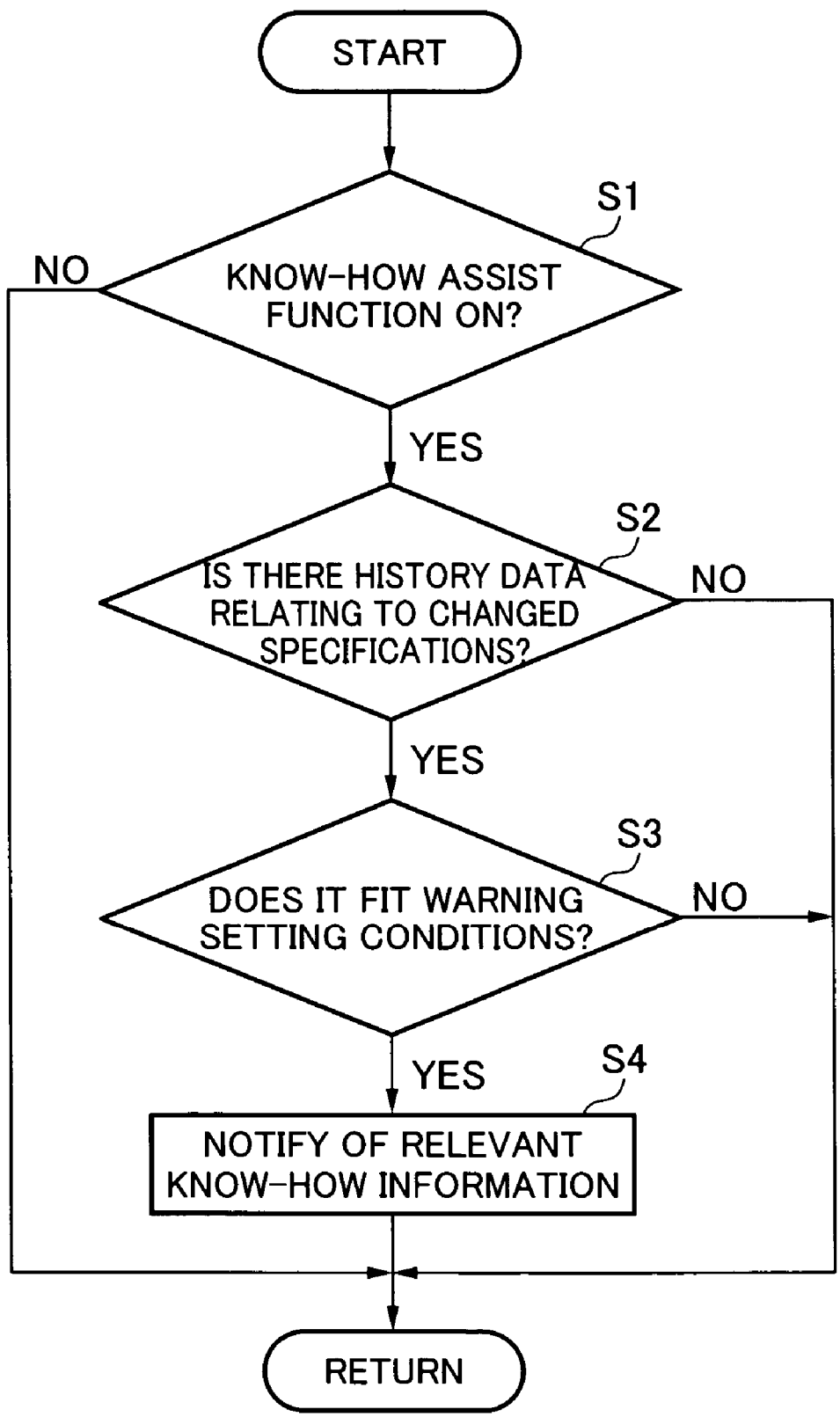
FIG. 42 is a flow chart explaining the function of the history notification function in the history registration display program according to an embodiment of the present invention.

Next, referring to FIGS. 40-42, we will explain the history notification function. FIG. 41 is a diagram depicting a history notification setting menu based on the history notification function of the history registration display program according to an embodiment of the present invention. FIG. 42 is a flow chart explaining the history notification function of a history registration display program according to an embodiment of the present invention.

The history registration display program 42 has the function of coordinating with the specification value input program 36 and the 2D morphing screen display programs 56 and 58 to refer to the history database 76, so that when the vehicle planner changes a specification value on the specification value input screen or on individual morphing screens, the program 42 has a history notification function which gives notification of history data related to that change.

When the vehicle planner begins vehicle planning, a history notification setting menu can be displayed as shown in FIG. 41 using the history notification function. A selection is made to turn the notification function (know-how assist function) on or off using the history notification setting menu. A selection is also made as to whether or not to narrow down the data subject to notification by vehicle type, class, registration period, notified specification item, and registrant. When all the specification data is subject to notification, NO is selected. To narrow the target, specific car types or specification items are selected using the same type of screen (not shown) as the aforementioned history registration menu (see FIG. 38).

FIG. 42 depicts the history notification function execution steps in the history registration display program 42 when a particular specification value has been changed by the vehicle planner on the specification value input screen or the individual morphing screens. "S" indicates individual steps.

As shown in FIG. 42, a determination is made in S1 of whether the know-how assist function is on or off; if off, no further steps are performed.

If the know-how assist is on, the system advances to S2, and a determination is made as to whether there is history data relating to the changed specification value. Specifically, a determination is made as to whether a specification item is registered which corresponds to the specification value specification item changed by the vehicle planner in the registered history data.

When there is such data, the system advances to S3, and a determination is made as to whether it corresponds to the assist warning item conditions selected in the menu screen depicted in FIG. 41. In S2 or S3, no know-how is notified if there is no corresponding data.

If there is corresponding data, the system advances to S4 and gives notification of the corresponding history data. In an embodiment of the present invention, a history list screen as shown in FIG. 40 is displayed as notification history data, as with the aforementioned history search function. As described above, history details and related specification change data can be viewed in addition to the setting objecting and setting reason, using the history list screen.

Using this type of history notification function, the vehicle planner can learn such things as whether it is necessary to change or preferable to change other specification values when making a change in a particular specification value. When the vehicle planner raises the roof height in order to assure forward visibility, for example, history notification allows him to learn of know-how such as that the pillar inclination angle or pillar slope angle should also be changed from the standpoint of body rigidity, which is useful in subsequent vehicle planning.

As described above, the present invention enables more efficient and effective vehicle planning.

While the present invention has been illustrated by means of the preferred embodiment, one of ordinary skill in the art will recognize that modifications and improvements can be made while remaining within the spirit and scope of the invention. The scope of the invention is determined solely by the appended claims.

The invention claimed is:

1. A vehicle planning support system for supporting vehicle planning by displaying vehicle models on a screen, comprising:
  specification value input screen display means for displaying a specification value input screen for an input of specification values including dimensions and angles in said vehicle model;
  vehicle model data generating means for generating vehicle model data based on the specification values input on said specification value input screen and rule data correlating between determined specification of the vehicle model for maintaining compatibility of shapes and arrangements of predetermined parts of the vehicle model;

3D morphing screen display means for displaying said vehicle model as a deformable 3D-shaped 3D vehicle model based on the vehicle model data generated by the vehicle model generating means using a 3D morphing screen, and 2D morphing screen display means for displaying said vehicle model as a deformable 2D-shaped 2D vehicle model based on the vehicle model data generated by the vehicle model generating means using a 2D morphing screen, wherein when a predetermined specification value of the vehicle model is changed on said 2D morphing screen or said 3D morphing screen, said 3D morphing screen displays means or said 2D morphing screen displays means change a correlated-specification value based on the rule data and display the 3D vehicle model or the 2D vehicle model so as to deform shapes and/or to change arrangements of parts thereof in relation to said changed predetermined specification value and said changed correlated-specification value, wherein said vehicle model includes a plurality of models and said rule data includes a master-slave relationship data which determines master-slave relationships between said plurality of models, by said master-slave relationship data, when a specification value of an upper level model is changed in said 2D morphing screen or said 3D morphing screen, specification value associated with those changed specification values of a lower level model is also changed in tandem therewith, and when a specification value of a lower level model is changed in said 2D morphing screen or said 3D morphing screen, a specification value of an upper level model is not changed in tandem therewith.

2. The vehicle planning support system according to claim 1, wherein said 2D morphing screen display means displays said specification values on said 2D morphing screen, and when a displayed specification value is changed, said 2D vehicle model is deformed and displayed based on the changed specification value.

3. The vehicle planning support system according to claim 2, wherein said 2D morphing screen display means temporarily records said changed specification values, and, by a predetermined command, said 3D morphing screen display means deforms and displays said 3D vehicle model all together based on all of said temporarily stored changed specification values.

4. The vehicle planning support system according to claim 1, wherein when a predetermined point on said 2D vehicle model is dragged, said 2D morphing screen display means causes said 2D vehicle model to deform and display in accordance with that dragging, and automatically calculates the changed specification values corresponding to the that deformed portion.

5. The vehicle planning support system according to claim 1, wherein said specification value input screen display means comprises specification value data generating means for generating specification value data including specification values input on said specification value input screen, and said 2D morphing screen display means displays said vehicle model as a deformable 2D vehicle model based on said specification value data and, furthermore, causes said changed specification value to be reflected in said specification value data when said specification value is changed on said 2D morphing screen.

6. The vehicle planning support system according to claim 5, wherein by a predetermined command the 3D morphing screen display means deforms and displays said 3D vehicle model all together based on the specification value data reflecting said changed specification value.

7. The vehicle planning support system according to claim 1, wherein said 2D morphing screen display means displays said 2D vehicle model as a side view display, a plan view display, and/or a front view display.

8. The vehicle planning support system according to claim 1, wherein said 2D morphing screen display means displays a benchmark vehicle image superimposed on said 2D vehicle model at a predetermined reference position.

9. The vehicle planning support system according to claim 1, further comprising simulation screen display means for displaying a simulation vehicle of said vehicle model on a simulation screen which is a virtual space;

wherein said 2D morphing screen display means displays said 2D morphing screen together with said simulation screen; and when said 2D vehicle model is deformed on said 2D morphing screen, said simulation screen display means displays in simulation a vehicle reflecting that deformation.

10. The vehicle planning support system according to claim 9, wherein said simulation screen display means superimposes and displays in simulation said simulation vehicle both before and after being deformed.

11. The vehicle planning support system according to claim 9, wherein said simulation screen display means arrays and displays in simulation a simulation vehicle both before and after being deformed.

12. A vehicle planning support system for supporting vehicle planning by displaying vehicle models on a screen, comprising:

specification value input screen display means for displaying a specification value input screen for an input of specification values including dimensions and angles in said vehicle model;

vehicle model data generating means for generating vehicle model data based on the specification values input on said specification value input screen and rule data correlating between determined specification of the vehicle model for maintaining compatibility of shapes and arrangements of predetermined parts of the vehicle model;

3D morphing screen display means for displaying said vehicle model as a deformable 3D-shaped 3D vehicle model based on the vehicle model data generated by the vehicle model generating means using a 3D morphing screen, and 2D morphing screen display means for displaying said vehicle model as a deformable 2D-shaped 2D vehicle model based on the vehicle model data generated by the vehicle model generating means using a 2D morphing screen, wherein when a predetermined specification value of the vehicle model is changed on said 2D morphing screen or said 3D morphing screen, said 3D morphing screen displays means or said 2D morphing screen displays means change a correlated-specification value based on the rule data and display the 3D vehicle model or the 2D vehicle model so as to deform shapes and/or to change arrangements of parts thereof in relation to said changed predetermined specification value and said changed correlated-specification value, wherein said specification value input screen display means comprises specification value data generating means for generating specification value data including specification values input on said specification value input screen, and said 2D morphing screen display means displays said vehicle model as a deformable 2D vehicle model based on said specification value data and, furthermore, causes said changed specification value to be reflected in said specification value data when said specification value is changed on said 2D morphing screen, and wherein said 2D morphing screen is moved to 3D morphing screen with retaining said changed specification value of the vehicle model on said 2D morphing screen being reflected in the specification value data, and said 3D morphing screen is moved to said 2D morphing screen.

13. The vehicle planning support system according to claim 12, wherein said 2D morphing screen display means displays said specification values on said 2D morphing screen, and when a displayed specification value is changed, said 2D vehicle model is deformed and displayed based on the changed specification value.

14. The vehicle planning support system according to claim 13, wherein said 2D morphing screen display means temporarily records said changed specification values, and, by a predetermined command, said 3D morphing screen display means deforms and displays said 3D vehicle model all together based on all of said temporarily stored changed specification values.

15. The vehicle planning support system according to claim 12, wherein when a predetermined point on said 2D vehicle model is dragged, said 2D morphing screen display means causes said 2D vehicle model to deform and display in accordance with that dragging, and automatically calculates the changed specification values corresponding to the that deformed portion.

16. The vehicle planning support system according to claim 12, wherein by a predetermined command the 3D morphing screen display means deforms and displays said 3D vehicle model all together based on the specification value data reflecting said changed specification value.

17. The vehicle planning support system according to claim 12, wherein said 2D morphing screen display means displays said 2D vehicle model as a side view display, a plan view display, and/or a front view display.

18. The vehicle planning support system according to claim 12, wherein said 2D morphing screen display means displays a benchmark vehicle image superimposed on said 2D vehicle model at a predetermined reference position.

19. The vehicle planning support system according to claim 12, further comprising simulation screen display means for displaying a simulation vehicle of said vehicle model on a simulation screen which is a virtual space;

wherein said 2D morphing screen display means displays said 2D morphing screen together with said simulation screen; and when said 2D vehicle model is deformed on said 2D morphing screen, said simulation screen display means displays in simulation a vehicle reflecting that deformation.

20. The vehicle planning support system according to claim 19, wherein said simulation screen display means superimposes and displays in simulation said simulation vehicle both before and after being deformed.

21. The vehicle planning support system according to claim 19, wherein said simulation screen display means arrays and displays in simulation a simulation vehicle both before and after being deformed.

* * * * *